United States Patent
Perry et al.

(10) Patent No.: US 11,263,707 B2
(45) Date of Patent: Mar. 1, 2022

(54) MACHINE LEARNING IN AGRICULTURAL PLANTING, GROWING, AND HARVESTING CONTEXTS

(71) Applicant: Indigo Ag, Inc., Boston, MA (US)

(72) Inventors: David Patrick Perry, Boston, MA (US); Geoffrey Albert von Maltzahn, Boston, MA (US); Robert Berendes, Riehen (CH); Eric Michael Jeck, San Mateo, CA (US); Barry Loyd Knight, Cordova, TN (US); Rachel Ariel Raymond, Arlington, VA (US); Ponsi Trivisvavet, Lexington, MA (US); Justin Y H Wong, Boston, MA (US); Neal Hitesh Rajdev, Lincoln, MA (US); Marc-Cedric Joseph Meunier, Dover, MA (US); Casey James Leist, Cambridge, MA (US); Pranav Ram Tadi, Corona, CA (US); Andrea Lee Flaherty, North Grafton, MA (US); Charles David Brummitt, Cambridge, MA (US); Naveen Neil Sinha, Somerville, MA (US); Jordan Lambert, Cambridge, MA (US);

(Continued)

(73) Assignee: INDIGO AG, INC., Boston, MA (US)

( * ) Notice: Subject to any disclaimer, the term of this patent is extended or adjusted under 35 U.S.C. 154(b) by 59 days.

(21) Appl. No.: 16/057,387

(22) Filed: Aug. 7, 2018

(65) Prior Publication Data

US 2019/0050948 A1    Feb. 14, 2019

Related U.S. Application Data

(60) Provisional application No. 62/542,705, filed on Aug. 8, 2017.

(51) Int. Cl.
*A01B 79/02* (2006.01)
*G06Q 50/02* (2012.01)
(Continued)

(52) U.S. Cl.
CPC .......... *G06Q 50/02* (2013.01); *A01B 79/005* (2013.01); *A01B 79/02* (2013.01); *A01C 21/00* (2013.01);
(Continued)

(58) Field of Classification Search
CPC .. G06Q 50/02; G06Q 10/04; G06Q 10/06315; G06K 9/00657; G06K 9/6262;
(Continued)

(56) References Cited

U.S. PATENT DOCUMENTS 2,200,532 A   5/1940   Sherman
4,674,044 A   6/1987   Kalmus et al.
(Continued)

FOREIGN PATENT DOCUMENTS

CA   1041788   11/1978
CA   1229497   11/1987
(Continued)

OTHER PUBLICATIONS

Lemos, Using GIS to Predict Corn Yields in Colombia (thesis), 2008 [retrieved Mar. 3, 2020], University of Redlands, 83 pages. Retrieved: https://inspire.redlands.edu/cgi/viewcontent.cgi?referer=&httpsredir=1&article=1179&context=gis_gradproj (Year: 2008).*
(Continued)

*Primary Examiner* — Matthew C Bella
*Assistant Examiner* — Dennis Rosario
(74) *Attorney, Agent, or Firm* — Fenwick & West LLP

(57) ABSTRACT

A crop prediction system performs various machine learning operations to predict crop production and to identify a set of farming operations that, if performed, optimize crop pro-
(Continued)

duction. The crop prediction system uses crop prediction models trained using various machine learning operations based on geographic and agronomic information. Responsive to receiving a request from a grower, the crop prediction system can access information representation of a portion of land corresponding to the request, such as the location of the land and corresponding weather conditions and soil composition. The crop prediction system applies one or more crop prediction models to the access information to predict a crop production and identify an optimized set of farming operations for the grower to perform.

44 Claims, 9 Drawing Sheets

(72) Inventors: Jonathan Hennek, Medford, MA (US); Carlos Becco, Buenos Aires (AR); Mark Allen, Sydney (AU); Daniel Bachner, Sao Paulo (BR); Fernando Derossi, Boston, MA (US); Ewan Lamont, Charlestown, MA (US); Rob Lowenthal, Brooklyn, NY (US); Dan Creagh, Chicago, IL (US); Steve Abramson, Waltham, MA (US); Ben Allen, Cedar Park, TX (US); Jyoti Shankar, Charlestown, MA (US); Chris Moscardini, Amesbury, MA (US); Jeremy Crane, Boston, MA (US); David Weisman, Somerville, MA (US); Gerard Keating, Winchester, MA (US); Lauren Moores, Charlestown, MA (US); William Pate, Kingston, NH (US)

(51) Int. Cl.
    *A01C 21/00*         (2006.01)
    *A01B 79/00*         (2006.01)
    *G06K 9/00*          (2022.01)
    *G06K 9/42*          (2006.01)
    *G06K 9/62*          (2022.01)
    *G06Q 10/04*        (2012.01)

(52) U.S. Cl.
    CPC ........... *G06K 9/00657* (2013.01); *G06K 9/42* (2013.01); *G06K 9/6262* (2013.01); *G06Q 10/04* (2013.01)

(58) Field of Classification Search
    CPC .. G06K 9/00664; G06K 2209/17; G06K 9/66; G06K 9/6256; G06K 9/6257; G06K 9/6282; G06K 9/42; G06K 9/0063; G06K 9/6263; G06K 2009/00644; G06N 20/00; G06N 3/08; G06N 5/04; G06N 3/0454; G06N 7/005; A01B 79/005; A01B 79/02; G06T 2207/30188; G06T 2207/10032; G06T 2207/20081; G06T 2207/20084; G06T 7/0004; G01N 2033/245; G06F 16/29; A01C 21/00
    See application file for complete search history.

(56) References Cited

U.S. PATENT DOCUMENTS

| | | |
|---|---|---|
| 4,677,552 A | 6/1987 | Sibley, Jr. |
| 4,903,201 A | 2/1990 | Wagner et al. |
| 4,940,834 A | 7/1990 | Hurley et al. |
| 5,041,290 A | 8/1991 | Gindrat et al. |
| 5,063,507 A | 11/1991 | Lindsey et al. |
| 5,077,665 A | 12/1991 | Silverman et al. |
| 5,113,619 A | 5/1992 | Leps et al. |
| 5,136,501 A | 8/1992 | Silverman et al. |
| 5,229,291 A | 7/1993 | Nielsen et al. |
| 5,285,383 A | 2/1994 | Lindsey et al. |
| 5,292,507 A | 3/1994 | Charley |
| 5,297,031 A | 3/1994 | Gutterman et al. |
| 5,415,672 A | 5/1995 | Fahey et al. |
| 5,706,442 A | 1/1998 | Anderson et al. |
| 5,715,402 A | 2/1998 | Popolo |
| 5,727,165 A | 3/1998 | Ordish et al. |
| 5,730,973 A | 3/1998 | Morales et al. |
| 5,732,400 A | 3/1998 | Mandler et al. |
| 5,775,734 A | 7/1998 | George, Jr. |
| 5,787,156 A | 7/1998 | Katz |
| 5,794,207 A | 8/1998 | Walker et al. |
| 5,845,266 A | 12/1998 | Lupien et al. |
| 5,873,071 A | 2/1999 | Ferstenberg et al. |
| 5,884,286 A | 3/1999 | Daughtery, III |
| 5,919,447 A | 7/1999 | Marrone et al. |
| 5,924,082 A | 7/1999 | Silverman et al. |
| 5,930,767 A | 7/1999 | Reber et al. |
| 5,960,411 A | 9/1999 | Hartman et al. |
| 5,970,479 A | 10/1999 | Shepherd |
| 5,994,117 A | 11/1999 | Bacon et al. |
| 6,104,643 A | 1/2000 | Minton |
| 6,058,379 A | 5/2000 | Odom et al. |
| 6,072,107 A | 6/2000 | Latch et al. |
| 6,077,505 A | 6/2000 | Parke et al. |
| 6,131,087 A | 10/2000 | Luke et al. |
| 6,134,535 A | 10/2000 | Belzberg |
| 6,242,474 B1 | 8/2001 | Garcia |
| 6,317,728 B1 | 11/2001 | Kane |
| 6,337,431 B1 | 1/2002 | Tricoli et al. |
| 6,338,050 B1 | 1/2002 | Conklin et al. |
| 6,390,472 B1 | 5/2002 | Vinarsky |
| 6,393,406 B1 | 5/2002 | Eder |
| 6,401,041 B1 | 5/2002 | Peterson |
| 6,418,419 B1 | 7/2002 | Nieboer et al. |
| 6,495,133 B1 | 12/2002 | Xue |
| 6,584,451 B1 | 6/2003 | Shoham et al. |
| 6,598,027 B1 | 7/2003 | Breen et al. |
| 6,622,129 B1 | 9/2003 | Whitworth |
| 6,673,479 B2 | 1/2004 | McArthur et al. |
| 6,681,186 B1 | 1/2004 | Denisov et al. |
| 6,689,880 B2 | 2/2004 | Chen et al. |
| 6,823,623 B2 | 11/2004 | Minato et al. |
| 6,865,582 B2 * | 3/2005 | Obradovic ............ G06K 9/6253 |
| 6,988,083 B2 | 1/2006 | Dines et al. |
| 7,037,879 B2 | 5/2006 | Imada et al. |
| 7,076,452 B2 | 7/2006 | Florence et al. |
| 7,080,034 B1 | 7/2006 | Reams |
| 7,084,331 B2 | 8/2006 | Isawa et al. |
| 7,318,045 B2 | 1/2008 | Baecker et al. |
| 7,335,816 B2 | 2/2008 | Kraus et al. |
| 7,341,868 B2 | 3/2008 | Chopade et al. |
| 7,349,879 B2 | 3/2008 | Alsberg et al. |
| 7,418,423 B2 | 8/2008 | Reding et al. |
| 7,485,451 B2 | 2/2009 | VanderGheynst et al. |
| 7,555,990 B2 | 7/2009 | Beaujot |
| 7,632,985 B2 | 12/2009 | Malven et al. |
| 7,742,979 B2 | 6/2010 | Reding et al. |
| 7,763,420 B2 | 7/2010 | Stritzker et al. |
| 7,906,313 B2 | 3/2011 | Henson et al. |
| 7,977,550 B2 | 7/2011 | West et al. |
| 8,019,694 B2 | 9/2011 | Fell et al. |
| 8,143,045 B2 | 3/2012 | Miansnikov et al. |
| 8,455,198 B2 | 6/2013 | Gao et al. |
| 8,455,395 B2 | 6/2013 | Miller et al. |
| 8,465,963 B2 | 6/2013 | Rolston et al. |
| 8,728,459 B2 | 5/2014 | Isawa et al. |
| 8,965,812 B2 | 2/2015 | Linville |
| 8,975,489 B2 | 3/2015 | Craven |
| 9,113,636 B2 | 8/2015 | Von Maltzahn et al. |
| 9,277,751 B2 | 3/2016 | Sword |
| 9,288,995 B2 | 3/2016 | von Maltzahn et al. |
| 9,295,263 B2 | 3/2016 | von Maltzahn et al. |

(56) References Cited

U.S. PATENT DOCUMENTS

| | | |
|---|---|---|
| 9,364,005 B2 | 6/2016 | Mitter et al. |
| 9,408,394 B2 | 8/2016 | von Maltzahn et al. |
| 9,532,572 B2 | 1/2017 | von Maltzahn et al. |
| 9,532,573 B2 | 1/2017 | von Maltzahn et al. |
| 9,545,111 B2 | 1/2017 | Sword |
| 9,622,485 B2 | 4/2017 | von Maltzahn et al. |
| 9,652,840 B1 | 5/2017 | Shriver et al. |
| 9,687,001 B2 | 6/2017 | Vujanovic et al. |
| 9,756,865 B2 | 9/2017 | Sword |
| 9,974,226 B2 | 5/2018 | Rupp et al. |
| 10,058,101 B2 | 8/2018 | von Maltzahn et al. |
| 10,076,120 B2 | 9/2018 | von Maltzahn et al. |
| 10,564,316 B2 | 2/2020 | Xu et al. |
| 2001/0032162 A1 | 10/2001 | Alsberg et al. |
| 2001/0032165 A1 | 10/2001 | Friend et al. |
| 2001/0034663 A1 | 10/2001 | Teveler et al. |
| 2002/0025330 A1 | 1/2002 | May |
| 2002/0023038 A1 | 2/2002 | Fritsch et al. |
| 2002/0023039 A1 | 2/2002 | Fritsch et al. |
| 2002/0032644 A1 | 3/2002 | Corby et al. |
| 2002/0059091 A1 | 5/2002 | Hay et al. |
| 2002/0065765 A1 | 5/2002 | Shuler et al. |
| 2002/0087453 A1 | 7/2002 | Nicolaisen et al. |
| 2002/0095369 A1 | 7/2002 | Kaplan et al. |
| 2002/0120555 A1 | 8/2002 | Lerner |
| 2002/0138393 A1 | 9/2002 | Tatge |
| 2002/0147670 A1 | 10/2002 | Lange |
| 2002/0184135 A1 | 12/2002 | Zakaria |
| 2002/0194115 A1 | 12/2002 | Nordicht et al. |
| 2003/0019408 A1 | 1/2003 | Fraisse et al. |
| 2003/0050901 A1 | 3/2003 | Jester et al. |
| 2003/0084791 A1 | 5/2003 | Trenhaile et al. |
| 2003/0195822 A1 | 10/2003 | Tatge |
| 2003/0236738 A1 | 12/2003 | Lange et al. |
| 2004/0024648 A1 | 2/2004 | Tatge |
| 2005/0072047 A1 | 4/2005 | Conkling et al. |
| 2005/0114252 A1 | 5/2005 | Beurskens |
| 2005/0137964 A1 | 6/2005 | Nordlicht et al. |
| 2005/0234691 A1 | 10/2005 | Singh et al. |
| 2006/0046246 A1 | 3/2006 | Zeng et al. |
| 2006/0111845 A1 | 5/2006 | Forbis et al. |
| 2006/0259417 A1 | 11/2006 | Marynowski et al. |
| 2006/0271262 A1 | 11/2006 | McLain |
| 2007/0028318 A1 | 2/2007 | Livore et al. |
| 2007/0055456 A1 | 3/2007 | Raftery et al. |
| 2007/0142226 A1 | 6/2007 | Franco |
| 2007/0292953 A1 | 12/2007 | Mankin et al. |
| 2008/0033864 A1 | 2/2008 | McDonough |
| 2008/0215167 A1 | 9/2008 | Beck |
| 2008/0229441 A1 | 9/2008 | Young et al. |
| 2008/0289060 A1 | 11/2008 | De Beuckeleer et al. |
| 2008/0313013 A1 | 12/2008 | Fell et al. |
| 2009/0155214 A1 | 6/2009 | Isawa et al. |
| 2010/0064392 A1 | 3/2010 | Yang et al. |
| 2010/0095396 A1 | 4/2010 | Voeste et al. |
| 2010/0106653 A1 | 4/2010 | Sandholm et al. |
| 2010/0114753 A1 | 5/2010 | Osmanski et al. |
| 2010/0205690 A1 | 8/2010 | Biasing et al. |
| 2010/0227357 A1 | 9/2010 | Redman et al. |
| 2010/0332430 A1 | 12/2010 | Caraviello et al. |
| 2011/0182862 A1 | 7/2011 | Green et al. |
| 2011/0208636 A1 | 8/2011 | Bachu et al. |
| 2011/0290873 A1 | 12/2011 | Nishiguchi et al. |
| 2012/0108431 A1 | 5/2012 | Williams et al. |
| 2012/0116943 A1 | 5/2012 | Abramson |
| 2012/0131696 A1 | 5/2012 | Aayal et al. |
| 2012/0144533 A1 | 6/2012 | Craven |
| 2012/0149571 A1 | 6/2012 | Kloepper et al. |
| 2012/0178624 A1 | 7/2012 | Kaminskyj et al. |
| 2012/0246050 A1 | 9/2012 | McNew |
| 2012/0324599 A1 | 12/2012 | Kerns et al. |
| 2013/0031673 A1 | 1/2013 | Grandlic et al. |
| 2013/0071425 A1 | 3/2013 | Vidal et al. |
| 2013/0079225 A1 | 3/2013 | Smith et al. |
| 2013/0150240 A1 | 6/2013 | Newman et al. |
| 2013/0197814 A1 | 8/2013 | McBratney et al. |
| 2013/0233501 A1 | 9/2013 | Van Zyl et al. |
| 2014/0020136 A1 | 1/2014 | Van Der Wolf et al. |
| 2014/0039967 A1 | 2/2014 | Scharf et al. |
| 2014/0109249 A1 | 4/2014 | Turner et al. |
| 2014/0115731 A1 | 4/2014 | Turner et al. |
| 2014/0147425 A1 | 5/2014 | Henn et al. |
| 2014/0342905 A1 | 11/2014 | Bullis et al. |
| 2015/0020239 A1 | 1/2015 | von Maltzahn et al. |
| 2015/0033420 A1 | 1/2015 | Rodriguez et al. |
| 2015/0126365 A1 | 5/2015 | Sword |
| 2015/0230478 A1 | 8/2015 | Vujanovic et al. |
| 2015/0242970 A1 | 8/2015 | Avey et al. |
| 2015/0335029 A1 | 11/2015 | Mitter et al. |
| 2015/0366217 A1 | 12/2015 | Vujanovic et al. |
| 2015/0368607 A1 | 12/2015 | Arnold et al. |
| 2015/0370935 A1 | 12/2015 | Starr |
| 2015/0371324 A1 | 12/2015 | Kumar |
| 2015/0373993 A1 | 12/2015 | von Maltzahn et al. |
| 2016/0021891 A1 | 1/2016 | von Maltzahn et al. |
| 2016/0150796 A1 | 6/2016 | von Maltzahn et al. |
| 2016/0174570 A1 | 6/2016 | Vujanovic et al. |
| 2016/0179994 A1* | 6/2016 | Levine .................. G06Q 30/02 703/2 |
| 2016/0192662 A1 | 7/2016 | Sword |
| 2016/0205947 A1 | 7/2016 | Sword |
| 2016/0235074 A1 | 8/2016 | von Maltzahn et al. |
| 2016/0255844 A1 | 9/2016 | Mitter et al. |
| 2016/0260021 A1 | 9/2016 | Marek |
| 2016/0286821 A1 | 10/2016 | Sword |
| 2016/0290918 A1 | 10/2016 | Xu et al. |
| 2016/0316760 A1 | 11/2016 | Ambrose et al. |
| 2016/0316763 A1 | 11/2016 | Sword |
| 2016/0330976 A1 | 11/2016 | Mitter et al. |
| 2016/0338360 A1 | 11/2016 | Mitter et al. |
| 2016/0350855 A1 | 12/2016 | Lerner |
| 2016/0366892 A1 | 12/2016 | Ambrose et al. |
| 2017/0020138 A1 | 1/2017 | von Maltzahn et al. |
| 2017/0089761 A1 | 3/2017 | McQuilkin et al. |
| 2017/0161627 A1 | 6/2017 | Xu et al. |
| 2017/0164619 A1 | 6/2017 | von Maltzahn et al. |
| 2017/0164620 A1 | 6/2017 | von Maltzahn et al. |
| 2017/0215358 A1 | 8/2017 | Franco et al. |
| 2017/0223967 A1 | 8/2017 | Mitter et al. |
| 2018/0020677 A1 | 1/2018 | Ambrose et al. |
| 2018/0060771 A1 | 3/2018 | Mangin |
| 2018/0075546 A1* | 3/2018 | Richt ..................... G06Q 40/08 |
| 2018/0092365 A1 | 4/2018 | Sword |
| 2018/0153174 A1 | 6/2018 | Riley et al. |
| 2018/0177196 A1 | 6/2018 | Sword |
| 2018/0181893 A1 | 6/2018 | Basso |
| 2018/0189954 A1* | 7/2018 | Albrecht ................... G06T 7/12 |
| 2018/0213800 A1 | 8/2018 | Djonovic et al. |
| 2018/0249716 A1 | 9/2018 | Riley |
| 2018/0251776 A1 | 9/2018 | Riley |
| 2018/0322426 A1 | 11/2018 | Schmaltz et al. |
| 2018/0342020 A1* | 11/2018 | Sen .................. G06Q 10/06375 |
| 2018/0349520 A1* | 12/2018 | Bhalla .................. G06F 16/904 |
| 2018/0373932 A1* | 12/2018 | Albrecht ................ G06F 17/14 |
| 2019/0050741 A1* | 2/2019 | Mewes .................... G06N 5/04 |
| 2019/0147094 A1* | 5/2019 | Zhan ..................... A01G 22/00 707/718 |
| 2019/0228224 A1* | 7/2019 | Guo .................. G06K 9/00657 |
| 2019/0325492 A1 | 10/2019 | Perry et al. |
| 2020/0311828 A1* | 10/2020 | Schafer ............. G06Q 30/0206 |

FOREIGN PATENT DOCUMENTS

| | | |
|---|---|---|
| CA | 2562175 | 1/2013 |
| CN | 1604732 | 4/2005 |
| CN | 101311262 A | 11/2008 |
| CN | 101423810 A | 5/2009 |
| CN | 101570738 | 11/2009 |
| CN | 101693881 A | 4/2010 |
| CN | 102168022 A | 8/2011 |
| CN | 102352327 A | 2/2012 |
| CN | 102010835 B | 4/2012 |
| CN | 102533601 B | 10/2013 |
| CN | 103642725 A | 3/2014 |

(56) References Cited

FOREIGN PATENT DOCUMENTS

| | | |
|---|---|---|
| CN | 104560742 A | 1/2015 |
| CN | 104388356 A | 3/2015 |
| EP | 0192342 | 8/1986 |
| EP | 0223662 | 5/1987 |
| EP | 0378000 | 7/1990 |
| EP | 0494802 | 7/1992 |
| EP | 0818135 | 1/1998 |
| EP | 1389767 | 2/2004 |
| EP | 1621632 A1 | 2/2006 |
| EP | 1935245 | 6/2008 |
| EP | 2676536 | 12/2013 |
| JP | 411232354 A | 8/1999 |
| JP | 2009/072168 | 4/2009 |
| KR | 20100114806 A | 10/2010 |
| KR | 101091151 | 12/2011 |
| KR | 20130023491 | 3/2013 |
| WO | WO 1988/009114 | 1/1988 |
| WO | WO 1994/016076 | 7/1994 |
| WO | WO 2000/029607 | 5/2000 |
| WO | WO 2001/046774 A1 | 6/2001 |
| WO | WO 2001/057752 A1 | 8/2001 |
| WO | WO 2001/083818 | 11/2001 |
| WO | WO 2002/065836 | 8/2002 |
| WO | WO 2005/003328 | 1/2005 |
| WO | WO 2007/021200 | 2/2007 |
| WO | WO 2007/107000 | 9/2007 |
| WO | WO 2008/103422 | 8/2008 |
| WO | WO 2009/012480 | 1/2009 |
| WO | WO 2009/078710 | 6/2009 |
| WO | WO 2009/126473 | 10/2009 |
| WO | WO 2010/109436 | 9/2010 |
| WO | WO 2010/115156 | 10/2010 |
| WO | WO 2011/001127 | 1/2011 |
| WO | WO 2011/082455 | 7/2011 |
| WO | WO 2011/112781 | 9/2011 |
| WO | WO 2011/117351 | 9/2011 |
| WO | WO 2012/034996 | 3/2012 |
| WO | WO 2013/016361 | 1/2013 |
| WO | WO 2013/029112 | 3/2013 |
| WO | WO 2013/090628 | 6/2013 |
| WO | WO 2013/122473 | 8/2013 |
| WO | WO 2013/148290 A1 | 10/2013 |
| WO | WO 2013/177615 | 12/2013 |
| WO | WO 2013/190082 | 12/2013 |
| WO | WO 2014/046553 | 3/2014 |
| WO | WO 2014/082950 | 6/2014 |
| WO | WO 2014/121366 | 8/2014 |
| WO | WO 2014/206953 | 12/2014 |
| WO | WO 2014/210372 | 12/2014 |
| WO | WO 2015/035099 | 3/2015 |
| WO | WO 2015/069938 | 5/2015 |
| WO | WO 2015/100431 | 7/2015 |
| WO | WO 2015/100432 | 7/2015 |
| WO | WO 2015/200852 | 12/2015 |
| WO | WO 2015/200902 | 12/2015 |
| WO | WO 2016/090212 | 6/2016 |
| WO | WO 2016/109758 | 7/2016 |
| WO | WO 2016/179046 | 11/2016 |
| WO | WO 2016/179047 | 11/2016 |
| WO | WO 2016/200987 | 12/2016 |

OTHER PUBLICATIONS

Wang et al., Deep Transfer Learning for Crop Yield Prediction with Remote Sensing Data, Jun. 2018 [retrieved Aug. 31, 2020], Proceedings of the 1st ACM SIGCAS Conference on Computing and Sustainable Societies, vol. 50, pp. 1-5. Retrieved: https://dl.acm.org/doi/abs/10.1145/3209811.3212707 (Year: 2018).*

Diepeveen et al., Identifying key crop performance traits using data mining, Aug. 25-27, 2008 [retrieved Jan. 2, 2021], IAALD-AFITA-WWCCA Congress 2008, World Conference on Agriculture Information and IT, 6 pages. Retrieved: https://researchrepository.murdoch.edu.au/id/eprint/12973/ (Year: 2008).*

"Agricultural Futures and Options: Principles and Strategies" by Wayne D. Purcell and Stephen R. Koontz, Second Edition, 1999, 80 pages.

"Constant or Time Varying Hedge Ratios", by Giancarlo Moschini and Satheesh Aradhyula, Proceedings of the NCR-134 Conference on Applied Commodity Price Analysis, Forecasting and Market Risk Management, 1993, 17 pages.

"Did Producer Hedging Opportunities in the Live Hog Market Decline", by Fabio C. Zanini and Philip Garcia, published in The Proceedings of the NCR-134 Conference on Applied Commodity Price Analysis Forecasting and Market Risk, Chicago, Ill. 1997, 17 pages.

"Electronic Trading of Agricultural Products", paper delivered Jul. 8, 1980 to Commonwealth Club, San Francisco, published by United States Department of Agriculture, Agricultural Marketing Service, Jan. 1981, 21 pages.

"Grain Price Hedging Basics", dated Oct. 1995, 3 pages.

"Hedge Ratio Estimation and Soybean Storage" by Michael D. Patterson, Marvin L. Hayenga and Sergio Lenee, Proceedings of the NCR-134 Conference on Applied Commodity Price Analysis and Market Risk, Chicago, III 1994, 15 pages.

"Simultaneously Derived Optimal Hedge Ratios for East Central Illinois Corn and Soybean Producers", by Janathna M. Norvell and Raymond M. Leuthold, published in the Proceedings of the NCR-134 Conference on Applied Commodity Price Analysis Forecasting and Market Risk, Chicago, Ill. 1992, 16 pages.

A Guide to Energy Hedging, New York Mercantile Exchange, 1999, 66 pages.

Adam, B.D et al., "Storage Hedging: What's a Merchandiser to Do?" Proceedings of the NCR-134 Conference on Applied Commodity Price Analysis, Forecasting, and Market Management, 1992, pp. 394-406.

Blank. S.C., "Research on futures markets: Issues, approaches, and empirical findings," Western Journal of Agricultural Economics, 1989, vol. 14, No. 1, pp. 126-139.

Commodity Trading Manual, published by Chicago Board of Trade, copyright 1998, 170 pages.

Crawford, P., "The New High-Tech Investing: Computer as Fund Manager," The International Herald Tribune, Feb. 1, 1992, 4 pages.

Daniels Trading Glossary, 2 pages.

Ethridge, D.E., "A Computerized Remote-Access Commodity Market: Telcot," Journal of Agricultural and Applied Economics, 1978, vol. 10, No. 2, pp. 177-182.

Gambling in Futures, published by New York Times, Jan. 9, 1910, 1 page.

Hayenga, M.L. et al., "Formula pricing in five commodity marketing systems," American Journal of Agricultural Economics, 1980, vol. 62, No. 4, pp. 753-759.

Here is How Trading Stocks by Computer Works, by Gregg Fields, Miami Herald, Oct. 25, 1987, 2 pages.

Ins and Outs of Program Trading, article published by the Los Angeles Times, published Dec. 6, 1987, 5 pages.

Kastens, T.L. et al., "Post-harvest grain storing and hedging with efficient futures," Journal of Agricultural and Resource Economics, 1999, pp. 482-505.

North Carolina Soybean and Corn Prices with Basis 1980-2003, 26 pages.

Preliminary Amendment, U.S. Appl. No. 10/870,112, Feb. 6, 2008, 20 pages.

Second Preliminary Amendment, U.S. Appl. No. 10/870,112, Mar. 21, 2008, 12 pages.

Strobl, M. et al., "An Examination of the Spatial and Intertemporal Aspects of Basis Determination," NCR-134 Conference on Applied Price Analysis, 1992, 31 pages.

TELCOT User's Manual for Buyers , published by Plains Cotton Cooperative Association, 1985, 172 pages.

The World Book Encyclopedia, pp. 873-874, published by World Book Corp, copyright 1994.

United States Notice of Allowance, U.S. Appl. No. 10/870,112, dated Apr. 25, 2008, 8 pages.

U.S. Appl. No. 60/241,543, filed Oct. 18, 2000, Inventor Reding, G. et al., (copy not enclosed).

Webster's New Collegiate Dictionary, 1990, p. 265.

(56) References Cited

OTHER PUBLICATIONS

Why Trade Ag Products on Project A, published by Chicago Board of Trade, 1994, 5 pages.

www.foodmarketexchange.com, dated Jun. 20, 2000, 7 pages.

www.usafutures.com, dated Jan. 25, 1999, 12 pages.

Allard, G. et al., "SPINGO: a rapid species-classifier for microbial amplicon sequences," BMC Bioinformatics, 2015, vol. 16, No. 324, 8 pages.

Anders, S. et al., "Differential expression analysis for sequence count data," Genome Biology, 2010, vol. 11, No. 11, pp. R106.

Ardakani, M.R. et al., "Absorption of N, P, K through triple inoculation of wheat (*Triticum aestivum* L.) by Azospirillum brasilense, *Streptomyces* sp., Glomus intraradices and manure application," Physiol Mol Biol Plants, 2011, vol. 17, No. 2, pp. 181-192.

Bevivino, A. et al., "Characterization of a free-living maize-rhizosphere population of *Burkholderia cepacia*: effect of seed treatment on disease suppression and growth promotion of maize," FEMS Microbiology Ecology, 1998, vol. 27, pp. 225-237.

Chen, F. et al., "Assessing Performance of Orthology Detection Strategies Applied to Eukaryotic Genomes," PLoS ONE, Apr. 2007, No. 4, pp. e383.

Ciccillo. F. et al., "Effects of two different application methods of *Burkholderia ambifaria* MCI 7 on plant growth and rhizospheric bacterial diversity," Environmental Microbiology, 2002, vol. 4, No. 4, pp. 238-245.

Cole, J.R. et al., "Ribosomal Database Project: data and tools for high throughput rRNA analysis," Nucleic Acids Research, 2014, vol. 42, pp. D633-D642.

De Santi, M. et al., "A combined morphologic and molecular approach for characterizing fungal microflora from a traditional Italian cheese (Fossa cheese)," Inter. Dairy J., 2010, vol. 10, No. 7, pp. 465-471.

Deshpande, V. et al., "Fungal identification using a Bayesian classifier and the Warcup training set of internal transcribed spacer sequences," Mycologia, 2016, vol. 108, No. 1, pp. 1-5.

Edgar, R.C., "UNOISE2: Improved Error-Correction for Illumina 16S and ITS Amplicon Sequncing," BioRxiv, 2016, No. 081257, 21 pages.

Enright, A.J. et al., "An efficient algorithm for large-scale detection of protein families," Nucleic Acids Research, 2002, vol. 30, No. 7, pp. 1575-1584.

Enright, A.J. et al., "Protein families and TRIBES in genome sequence space," Nucleic Acids Research, 2003, vol. 31, No. 15, pp. 4632-4638.

Estrada, P. et al., "A N2-fixing endophytic *Burkholderia* sp. Associated with maize plants cultivated in Mexico," Canadian Journal of Microbiology, 2002, vol. 48, No. 4, pp. 285-294.

Friedman, J. et al., "Regularization Path for Generalized Linear Models via Coordinate Descent," Journal of Statistical Software, 2010, vol. 33, No. 1, pp. 1-22.

Koljalg. U. et al., "Towards a unified paradigm for sequence-based identification of fungi," Molecular Ecology, 2013, vol. 22, pp. 5271-5277.

Kozich, J.J. et al., "Development of a Dual-Index Sequencing Strategy and Curation Pipeline for Analyzing Amplicon Sequence Data on the MiSeq Illumina Sequencing Platform," Applied and Environmental Microbiology, Sep. 2013, vol. 79, No. 17, pp. 5112-5120.

Langille, M.G.I. et al., "Predictive functional profiling of microbial communities using 16S rRNA marker gene sequences," Nature Biotechnology, 2013, vol. 31, No. 9, pp. 814-821.

Li, W. et al., "Ultrafast clustering algorithms for metagenomic sequence analysis," Briefings in Bioinformatics, Nov. 1, 2012, vol. 13, No. 6., pp. 656-668.

McMurdie, P.J. et al., "Waste Not, Want Not: Why Rarefying Microbiome Data Is Inadmissible," PLOS Computational Biology, 2014, vol. 10, No. 4, pp. e1003531.

Needleman, S.B. et al., "A General Method Applicable to the Search for Similarities in the Amino Acid Sequence of Two Proteins," Journal of Molecular Biology, 1970, vol. 28, No. 3, pp. 443-453.

Quast, C. et al., "The SILVA ribosomal RNA gene database project: improved data processing and web-based tools," Nucleic Acids Research, 2013, vol. 41, pp. D590-D596.

Rideout, J.R. et al., "Subsampled open-reference clustering creates consistent, comprehensive OTU definitions and scales to billions of sequences," PeerJ, 2014, 2:e545.

Roth, A.C.J. et al., "Algorithm of OMA for large-scale orthology inference," BMC Bioinformatics, 2008, vol. 9, pp. 518.

Sharma, V.K. et al., "Enhancement of verticillium wilt resistance in tomato transplants by in vitro co-culture of seedlings with a plant growth promoting rhizobacterium (*Pseudomonas* sp. Strain PsJN)," Canadian Journal of Microbiology, Jun. 1998, vol. 44, No. 6, pp. 528-536.

Shenoy, B.D. et al., "Impact of DNA sequence-data on the taxonomy of anamorphic fungi," Fungal Diversity, 2007, vol. 26, No. 10, pp. 1-54.

Smith, T.F. et al., "Identification of Common Molecular Subsequences," Journal of Molecular Biology, 1981, vol. 147, pp. 195-197.

Abarenkov, K., et al., "PlutoF—A Web Based Workbench for Ecological and Taxonomic Research, with an Online Implementation for Fungal ITS Sequences," Evol Bioinform Online, 2010, pp. 189-196, vol. 6.

Abarenkov, K., et al., "The UNITE Database for Molecular Identification of Fungi—Recent Updates and Future Perspectives," New Phytol., 2010, pp. 281-285, vol. 186.

Abdellatif, L., et al., "Endophytic hyphal compartmentalization is required for successful symbiotic Ascomycota association with root cells," Mycological Research, 2009, pp. 782-791, vol. 113.

Abdellatif, L., et al., "Characterization of virulence and PCR-DGGE profiles of Fusarium avenaceum from western Canadian Prairie Ecozone of Saskatchewan," Canadian Journal of Plant Pathology, 2010, pp. 468-480.

Abello, J., et al., "Agrobacterium-mediated transformation of the endophytic fungus *Acremonium implicatum* associated with Brachiaria grasses", Mycological Research, pp. 407-413, vol. 112, Pt 3.

Abdou, R., et al., "Botryorhodines A-D, antifungal and cytotoxic depsidones from Botryosphaeria rhodina, an endophyte of the medicinal plant Bidens pilosa," Phytochemistry, 2010, vol. 71, pp. 110-116.

Abou-Shanab, R. A., et al., "Characterization of Ni-resistant bacteria in the rhizosphere of the hyperaccumulator Alyssum murale by 16S rRNA gene sequence analysis", World Journal of Microbiology and Biotechnology, vol. 26, No. 1, Aug. 15, 2009, pp. 101-108.

Adhikari, M., et al., "A New Record of Pseudeurotium bakeri from Crop Field Soil in Korea," The Korean Journal of Mycology, 2016, pp. 145-149, vol. 44.

Ahmad, F., et al., "Screening of Free-Living Rhizospheric Bacteria for Their Multiple Plant Growth Promoting Activities," Microbiol Res., 2008, pp. 173-181, vol. 163.

Alvarez-Perez, S., et al., "Zooming-in on floral nectar: a first exploration of nectar-associated bacteria in wild plant communities," FEMS Microbiol. Ecol., 2012, vol. 80, No. 3, pp. 591-602.

Amann, R., et al., "The Identification of Microorganisms by Fluorescence in Situ Hybridisation," Curr Opin Biotechnol., 2001, pp. 231-236, vol. 12.

Amatuzzi, R.F., et al., "UNIVERS1DADE Federal Do Parana," Jan. 1, 2014, 52 Pages. (With English Abstract).

Amatuzzi, R.F., et al., "Potential of endophytic fungi as biocontrol agents of *Duponchelia fovealis* (Zeller) (Lepidoptera:Crambidae)," Brazilian Journal of Biology, Nov. 9, 2017, 7 Pages.

Antony-Badu, S., et al., "Multiple *Streptomyces* species with distinct secondary metabolomes have identical 16S rRNA gene sequences." Scientific Reports 7.1, Sep. 2017, No. 7, 11089, pp. 1-8.

Apel, K., et al., "Reactive Oxygen Species: Metabolism, Oxidative Stress, and Signal Transduction," Annu Rev Plant Biol., 2004, pp. 373-399, vol. 55.

Arendt, K. R., et al., "Isolation of endohyphal bacteria from foliar Ascomycota and in vitro establishment of their symbiotic associations," Appl. Environ. Microbiol., 2016, pp. 2943-2949, vol. 82, No. 10.

(56) References Cited

OTHER PUBLICATIONS

Artursson, V., et al., "Interactions between arbuscular mycorrhizal fungi and bacteria and their potential for stimulating plant growth", Environmental Microbiology, vol. 8, No. 1, Jan. 1, 2006, pp. 1-10.
Ashrafuzzaman, M., et al., "Efficiency of plant growth-promoting rhizobacteria (PGPR) for the enhancement of rice growth," African Journal of Biotechnology, 2009, pp. 1247-1252, vol. 8, No. 7.
Aveskamp, M., et al., "DNA phylogeny reveals polyphyly of Phoma section Peyronellaea and multiple taxonomic novelties," Mycologia, 2009, vol. 101, No. 3, pp. 363-382.
Azcon, R., et al., "Selective interactions between different species of mycorrhizal fungi and *Rhizobium meliloti* strains, and their effects on growth, N2-fixation (15N) and nutrition of Medicago sativa L.," New PhytoL., 1991, vol. 117, pp. 399-404.
Bacon, C. W., et al., "Isolation, In Planta Detection, and Uses of Endophytic Bacteria for Plant Protection," Manual of Environmental Microbiology, 2007, pp. 638-647.
Baker, K. F., et al., "Dynamics of Seed Transmission of Plant Pathogens," Annu Rev Phytopathol., 1966, pp. 311-334,vol. 4.
Baltruschat, H., et al., "Salt tolerance of barley induced by the root endophyte Piriformospora indica is associated with a strong increase in antioxidants," New Phytologist., 2008, pp. 501-510, vol. 180.
Bandara, W.M.M.S., et al., "Interactions among endophytic bacteria and fungi: effects and potentials", Journal of Biosciences, Dec. 2006, vol. 31, No. 5, pp. 645-650.
Bensch, K., et al., "Species and ecological diversity within the Cladosporium cladosporioides complex (Davidiellaceae, Capnodiales)," Studies in Mycology, 2010, pp. 1-94, vol. 67.
Bethlenfalvay, G., et al., "Mycorrhizal fungi effects on nutrient composition and yield of soybean seeds", Journal of Plant Nutrition, vol. 20, No. 4-5, Apr. 1, 1997, pp. 581-591.
Bing, LA, et al., "Suppression of Ostrinia nubilalis (Hübner) (Lepidoptera: Pyralidae) by endophytic Beauveria bassiana (Balsamo) Vuillemin", Environmental Entomol, Entomological Society of America, College Park, MD, US, vol. 20, Jan. 1, 1991, pp. 1207-1211.
Block, C. C., et al., "Seed Transmission of Pantoea stewartii in Field and Sweet Corn," Plant Disease, 1998, pp. 775-780, vol. 82.
Bragantia, et al: "Identificaqao E Avaliaqao De Rizobacterias Isoladas De Raizes De Milho," Jan. 1, 2010, pp. 905-911, Retrieved from the Internet: URL:http://www.scielo.br/pdf/brag/v69n4/v69n4a17.pdf (With English Abstract).
Bulgarelli, D., et al., "Structure and Functions of the Bacterial Microbiota of Plants," Annu Rev Plant Biol., 2013, pp. 807-838, vol. 64.
Buttner, D., et al., "Regulation and secretion of Xanthomonas virulence factors," FEMS Microbiology Reviews, 2010, pp. 107-133, vol. 34, No. 2.
Caporaso, J.G., et al., "Ultra-High-Throughput Microbial Community Analysis on the Illumina HiSeq and MiSeq Platforms," ISME J., 2012, pp. 1621-1624, vol. 6.
Castillo, D., et al., "Fungal Entomopathogenic Endophytes: Negative Effects on Cotton Aphid Reproduction in Greenhouse and Field Conditions," PowerPoint Presentation dated Mar. 23, 2013.
Castillo, D., et al., "Fungal Endophytes: Plant Protective Agents Against Herbivores," Power Point Presentation dated Aug. 4, 2013.
Cavalier-Smith, T., "A Revised Six-Kingdom System of Life," Biol Rev Camb Philos Soc., 1998, pp. 203-266, vol. 73.
Cha, C., et al., "Production of Acyl-Homoserine Lactone Quorum-Sensing Signals by Gram-Negative Plant Associated Bacteria," Mol Plant Microbe Interact., 1998, pp. 1119-1129, vol. 11, No. 11.
Chagas, F., et al., "A Mixed Culture of Endophytic Fungi Increases Production of Antifungal Polyketides," J. Chem Ecol., Oct. 2013, pp. 1335-1342, vol. 39.
Chernin, L. S., et al., "Chitinolytic Activity in Chromobacterium violaceum: Substrate Analysis and Regulation by Quorum Sensing," J Bacteriol., 1998, pp. 4435-4441, vol. 180, No. 17.
Clark, E. M., et al., "Improved Histochemical Techniques for the Detection of Acremonium coenophilum in Tall Fescue and Methods of in vitro Culture of the Fungus," J. Microbiol Methods, 1983, pp. 149-155, vol. 1.
Clarridge, J., "Impact of 16S rRNA Gene Sequence Analysis for Identification of Bacteria on Clinical Microbiology and Infectious Diseases," Clinical Microbiology Reviews, Oct. 2004, pp. 840-862, vol. 17, No. 4.
Clay, K., "Effects of fungal endophytes on the seed and seedling biology of Lolium perenne and Festuca arundinacea," Oecologia, 1987, pp. 358-362, vol. 73.
Clough, S. J., et al., "Floral Dip: A Simplified Method for Agrobacterium-mediated Transformation of *Arabidopsis thaliana*," Plant J., 1998, pp. 735-743, vol. 16, No. 6.
Compant, S., et al., "Endophytes of Grapevines Flowers, Berries, and Seeds: Identification of Cultivable Bacteria, Comparison with Other Plant Parts, and Visualization of Niches of Colonization," Microbial Ecology, 2011, pp. 188-197, vol. 62.
Compant, S., et al., "Endophytic colonization of Vitis vinfera L. by *Burkholderia phytofirmans* strain PsJN: from the rhizosphere to inflorescence tissues," FEMS Microbiol Ecol, 2008, pp. 84-93, vol. 63.
Coombs, J. T., et al., "Isolation and Identification of Actinobacteria from Surface-Sterilized Wheat Roots," Applied and Environmental Microbiology, 2003, pp. 5603-5608, vol. 69, No. 9.
Conn, V. M., "Effect of Microbial Inoculants on the Indigenous Actinobacterial Endophyte Population in the Roots of Wheats as Determined by Terminal Restriction Fragment Length Polymorphism," Applied and Environmental Microbiology, 2004, pp. 6407-6413, vol. 70, No. 11.
Cottyn, B., et al., "Phenotypic and genetic diversity of rice seed-associated bacteria and their role in pathogenicity and biological control," Journal of Applied Microbiology, 2009, pp. 885-897, vol. 107.
Cox, C. D., "Deferration of Laboratory Media and Assays for Ferric and Ferrous Ions," Methods Enzymol., 1994, pp. 315-329, vol. 235.
Craine, J. M., et al., "Global Diversity of Drought Tolerance and Grassland Climate-Change Resilience," Nature Climate Change, 2013, pp. 63-67, vol. 3.
Dalal, J.M., et al., "Utilization of Endophytic Microbes for Induction of Systemic Resistance (ISR) in Soybean (Glycine max (L) Merril) Against Challenge Inoculation with R. solani," Journal of Applied Science and Research, 2014, pp. 70-84, vol. 2, No. 5.
Danhorn, T., et al., "Biofilm Formation by Plant-Associated Bacteria," Annu Rev Microbiol., 2007, pp. 401-422, vol. 61.
Daniels, R., et al., "Quorum Signal Molecules as Biosurfactants Affecting Swarming in Rhizobium etli," PNAS, 2006, pp. 14965-14970, vol. 103, No. 40.
Darsonval, A., et al., "Adhesion and Fitness in the Bean Phyllosphere and Transmission to Seed of *Xanthomonas fuscans* subsp. fuscans," Molecular Plant-Microbe Interactions, 2009, pp. 747-757, vol. 22, No. 6.
Darsonval, A., et al., "The Type III Secretion System of *Xanthomonas fuscans* subsp. fuscans is involved in the Phyllosphere Colonization Process and in Transmission to Seeds of Susceptible Beans," Applied and Enviornmental Mirobiology, 2008, pp. 2669-2678, vol. 74, No. 9.
Dbget, "Orthology: K14454," 2005, 2 pages, can be retrieved at <URL:http://www.genome.jp/dbget-bin/www_bg et?ko:K14454>.
De Freitas, J. R., et al., "Phosphate-Solubilizing Rhizobacteria Enhance the Growth and Yield but not Phosphorus Uptake of Canola (*Brassica napus* L.)," Biol Fertil Soils, 1997, pp. 358-364, vol. 24.
De Lima Favaro, L. C., et al., "Epicoccum nigrum P16, a Sugarcane Endophyte, Produces Antifungal Compounds and Induces Root Growth," PLoS One, 2012, pp. 1-10, vol. 7, No. 6.
De Medeiros, L., et al., "Evaluation of Herbicidal Potential of Depsides from Cladosporium uredinicola an Endophytic Fungus found in Guava Fruit," J. Braz. Chem. Soc., 2012, vol. 23, No. 8, p. 1551-1557.

(56) References Cited

OTHER PUBLICATIONS

De Melo Pereira, G. V., et al. "A Multiphasic Approach for the Identification of Endophytic Bacterial in Strawberry Fruit and their Potential for Plant Growth Promotion," Microbial Ecology, 2012, pp. 405-417, vol. 63, No. 2.
De Souza, J. J., et al., "Terpenoids from Endophytic Fungi," Molecules, 2011, pp. 10604-10618, vol. 16, No. 12.
Dennis, C., et al., "Antagonistic Properties of Species Groups of Trichoderma," Trans Brit Mycol Soc, 1971, pp. 25-39, vol. 57, No. 1.
Desiro, A., et al., "Detection of a novel intracellular microbiome hosted in arbuscular mycorrhizal fungi," ISME Journal, 2014, pp. 257-270, vol. 8.
Djordjevic, D., et al., "Microtiter Plate Assay for Assessment of Listeria monocytogenes Biofilm Formation," Annl Environ Microbiol., 2002, pp. 2950-2958, vol. 68, No. 6.
Don, R. H., et al., "Properties of Six Pesticide Degradation Plasmids Isolated From Alcaligenes Paradoxus and Alcaligenes eutrophus," J Bacteriol., 1981, pp. 681-686, vol. 145, No. 2.
Eberhard, A., et al., "Structural Identification of Autoinducer of Photobacterium fischeri Luciferase," Biochem., 1981, pp. 2444-2449, vol. 20.
Edgar, R. C., "Search and Clustering Orders of Magnitude Faster than BLAST," Bioinformatics, 2010, pp. 2460-2461, vol. 26, No. 19.
Edgar, R. C., "UPARSE: Highly Accurate OTU Sequences From Microbial Amplicon Reads," Nat Methods, 2013, pp. 996-998, vol. 10, No. 10.
Ek-Ramos, M. J., "Ecology, Distribution and Benefits of Fungal Endophytes Isolated from Cultivated Cotton (*Gossypium hirsutum*) in Texas," Power Point Presentation dated Nov. 7, 2012, 27 Pages.
Ek-Ramos, M. J., et al., "Spatial and Temporal Variation in Fungal Endophyte Communities Isolated from Cultivated Cotton (*Gossypium hirsutum*)," PLoS ONE, 2013, vol. 8, No. 6, 13 Pages, e66049.
Ek-Ramos, M. J., et al., "Spatial and Temporal Variation in Fungal Endophyte Communities Isolated from Cultivated Cotton (*Gossypium hirsutum*)," Power Point Presentation dated Jan. 7, 2013, 18 Pages.
El-Shanshoury, A. R., "Growth Promotion of Wheat Seedlings by *Streptomyces atroolivaceus*," Journal of Agronomy and Crop Science, 1989, pp. 109-114, vol. 163.
Emerson, D., et al., Identifying and Characterizing Bacteria in an Era of Genomics and Proteomics, BioScience, 2008, pp. 925-936, vol. 58, No. 10.
Endre, G., et al., "A Receptor Kinase Gene Regulating Symbiotic Nodule Development," Nature, 2002, pp. 962-966, vol. 417.
Faria, D. C., et al., "Endophytic Bacteria Isolated from Orchid and Their Potential to Promote Plant Growth," World J Microbiol Biotechnol., 2013, pp. 217-221, vol. 29.
Ferrando, L., et al., "Molecular and Culture-Dependent Analyses Revealed Similarities in the Endophytic Bacterial Community Composition of Leaves from Three Rice (*Oryza sativa*) Varieties," FEMS Microbiol Ecol., 2012, pp. 696-708, vol. 80.
Fiehn, O., et al., "Metabolite Profiling for Plant Functional Genomics," Nature Biotechnol., 2000, pp. 1157-1161, vol. 8.
Fierer, N., et al., "Cross-Biome Metagenomic Analyses of Soil Microbial Communities and Their Functional Attributes," Proc Natl Acad Sci USA, 2012, pp. 21390-21395, vol. 109, No. 52.
Fincher, G. B., "Molecular and Cellular Biology Associated with Endosperm Mobilization in Germinating Cereal Grains," Annu Rev Plant Phvsiol Plant Mol Biol., 1989, pp. 305-346, vol. 40.
Fisher, P. J., et al., "Fungal saprobes and pathogens as endophytes of rice (*Oryza sativa* L.)," New Phytol., 1992, pp. 137-143, vol. 120.
Fisher, P. R., et al., "Isolation and Characterization of the Pesticide-Degrading Plasmid pJP1 from Alcaligenes paradoxus," J Bacteriol., 1978, pp. 798-804, vol. 135, No. 3.

Fox, G., et al., "How close is close: 16S rRNA sequence identity may not be sufficient to guarantee species identity." International Journal of Systematic and Evolutionary Microbiology 42.1, 1992, pp. 166-170.
Franco, C., et al., "Actinobacterial Endophytes for Improved Crop Performance," Australasian Plant Pathology, 2007, pp. 524-531, vol. 36.
Fulthorpe, R. R., et al., "Distantly Sampled Soils Carry Few Species in Common," ISME J., 2008, pp. 901-910, vol. 2.
Gantner, S., et al., "Novel Primers for 16S rRNA-based Archaeal Community Analyses in Environmental Samples," J Microbiol Methods, 2011, pp. 12-18, vol. 84.
Gao, Z., et al., "Quantitation of Major Human Cutaneous Bacterial and Fungal Populations," J Clin Microbiol., 2010, pp. 3575-3581, vol. 48, No. 10.
Garazzino, S., et al., "Osteomyelitis Caused by Enterobacter cancerogenus Infection following a Traumatic Injury: Case Report and Review of the Literature," J Clin Microbiol., Mar. 2005, vol. 43, No. 3, pp. 1459-1461.
Gasser, I., et al., "Ecology and Characterization of Polyhydroxyalkanoate-Producing Microorganisms on and in Plants," FEMS Microbiol Ecol., 2010, pp. 142-150, vol. 70.
Gebhardt, J., et al., "Characterization of a single soybean cDNA encoding cytosolic and glyoxysomal isozymes of aspartate aminostransferase," Plant Molecular Biology, 1998, pp. 99-108, vol. 37.
GenBank: AF034210.1 "Glycine max aspartate aminotransferase glyoxysomal isozyme AAT1 precursor and aspartate aminotransferase cytosolic isozyme AAT2 (AAT) mRNA, complete cds," NCBI, May 26, 1998, 2 Pages, can be retrieved at <URL:https://www.ncbi.nlm.nih.gov/nuccore/AF034210>.
GenBank: JN210900.1, "*Enterobacter* sp. WS05 16S ribosomal RNA gene, partial sequence," NCBI, Sep. 24, 2012, 1 Page, can be retrieved at <URL:https://www.ncbi.nlm.nih.gov/nuccore/jn210900>.
GenBank: NP_001237541.1, "aspartate aminotransferase glyoxysomal isozyme AAT1 precursor [Glycine max]," NCBI, Oct. 29, 2016, 2 Pages, can be retrieved at <URL:https://www.ncbi.nlm.nih.gov/protein/NP_001237541.1>.
NCBI GenBank: CP000653.1 "*Enterobacter* sp. 638, complete genome" Jan. 28, 2014, 5 Pages, Can be retrieved at <URL:https://www.ncbi.nlm.nih.gov/nuccore/CP000653.1>.
NCBI GenBank: EU340965.1 "*Enterobacter* sp. 638 16S ribosomal RNA gene, partial sequence" Jan. 30, 2009, 1 Page, Can be retrieved at <URL:https://www.ncbi.nlm.nih.gov/nuccore/EU340965.1>.
NCBI GenBank: Accession No. JX880250.1, "Enterobacteriaceae bacterium Clero1 16S ribosomal RNA gene, partial sequence," NIH, Jun. 24, 2015, 2 Pages, can be retreived at <URL:https://www.ncbi.nlm.nih.gov/nucleotide/JX880250.1?report=genbank&log$=nuclalign&blast_rank=80&RID=KWUPBV08015>.
Database Geneseq Database accession No. BAP97938 "*Pantoea dispersa* strain KACC91642P 16S rDNA sequence, SEQ ID 1." Aug. 15, 2013, 1 Page.
NCBI, GenBank Accession No. XP_002568042, Aug. 14, 2009, 4 Pages, Berg, V.D., et al., "Genome sequencing and analysis of the filamentous fungus," Nat. Biotechnol. 26 (10), 1161-1168 (2008).
Gilmour, S. J., et al., "Overexpression of the *Arabidopsis* CBF3 Transcriptional Activator Mimics Multiple Biochemical Changes Associated with Cold Acclimation," Plant Physiol., 2000, pp. 1854-1865, vol. 124.
Giraldo, A., et al., "Phylogeny of Sarocladium (Hypocreales)," Persoonia, 2015, pp. 10-24, vol. 34.
Gitaitis, R., et al., "The Epidemiology and Management of Seedborne Bacterial Diseases," Annu Rev Phytopathol., 2007, pp. 371-397, vol. 45.
Goudjal, Y., et al., "Biocontrol ofRhizoctonia solanidamping-off and promotion of tomato plant growth by endophytic actinomycetes isolated from native plants of Algerian Sahara", Microbiological Research, 2014, vol. 169, No. 1 , pp. 59-65.
Grondona, I., et al., "TUSAL®, a commercial biocontrol formulation based on Trichoderma," Bulletin OILB/SROP, 2004, pp. 285-288, vol. 27, No. 8.

(56) References Cited

OTHER PUBLICATIONS

Gu, O., et al., "*Glycomyces sambucus* sp. nov., an endophytic actinomycete isolated from the stem of Sambucus adnata Wall," International Journal of Systematic and Evolutionary Microbiology, 2007, pp. 1995-1998, vol. 57.

Guo, X., et al., "Red Soils Harbor Diverse Culturable Actinomycetes That Are Promising Sources of Novel Secondary Metabolites", Applied and Environmental Microbiology, Feb. 27, 2015, vol. 81, No. 9, pp. 3086-3103.

Haake, V., et al., "Transcription Factor CBF4 is a Regulator of Drought Adaptation in *Arabidopsis*," Plant Physiol., 2002, pp. 639-648, vol. 130.

Haas, D., et al., "R Factor Variants with Enhanced Sex Factor Activity in Pseudomonas aeruginosa," Mol Gen Genet., 1976, pp. 243-251, vol. 144.

Hahm, M-S., et al., "Biological Control and Plant Growth Promoting Capacity of Rhizobacteria and Pepper Under Greenhouse and Field Conditions," The Journal of Microbiology, The Microbiological Society of Korea, Heidelberg, Jun. 30, 2012, pp. 380-385, vol. 50, No. 3.

Hain, T., et al., "Chitinolytic transgenes from Streptomyces albidoflavus as phytochemicals defences against herbivorous insects, use in transgenic plants and effect in plant development", International Journal of Systematic Bacteriology, Jan. 1997, vol. 47, No. 1, pp. 202-206.

Hallman, J., et al., "Bacterial Endophytes in Agricultural Crops," Canadian J Microbiol., 1997, pp. 895-914, vol. 43.

Hamayun, M., et al., "Cladosporium sphaerospermum as a new plant growth-promoting endophyte from the roots of Glycine max (L.) Merr," World Journal of Microbiology and Biotechnology, Kluwer Academic Publishers, Feb. 15, 2009, pp. 627-632, vol. 25, No. 4.

Hanshew, A., et al., "Characterization of Actinobacteria Associated with Three Ant-Plant Mutualisms", Microbial Ecology, Aug. 6, 2017, vol. 69, No. 1, pp. 192-203.

Hanson, L.E., "Reduction of Verticillium Wilt Symptoms in Cotton Following Seed Treatment with Trichoderma virens," The Journal of Cotton Science, 2000, pp. 224-231, vol. 4, No. 4.

Hanson, L.E., "Reduction of Verticillium Wilt Symptoms in Cotton Following Seed Treatment with Trichoderma virens," Proceedings Beltwide Cotton Conferences, 2000, vol. 1. (Abstract), 1 Page.

Hardegree, S. P. et al., "Effect of Polyethylene Glycol Exclusion on the Water Potential of Solution-Saturated Filter Paper," Plant Physiol., 1990, pp. 462-466, vol. 92.

Hardoim, P. R., et al., "Assessment of Rice Root Endophytes and Their Potential for Plant Growth Promotion," In: HARDOIM, P.R., Bacterial Endophytes of Rice—Their Diversity, Characteristics and Perspectives, Groningen, 2011, pp. 77-100.

Hardoim, P. R., et al., "Dynamics of Seed-Borne Rice Endophytes on Early Plant Growth Stages," PLoS ONE, 2012, vol. 7, No. 2, 13 Pages.

Hepler, P. K., et al., "Polarized Cell Growth in Higher Plants," Annu Rev Cell Dev Biol., 2001, pp. 159-187, vol. 17.

Hiatt, E. E., et al., "Tall Fescue Endophyte Detection: Commerical Immunoblot Test Kit Compared with Microscopic Analysis," Crop Science, 1999, pp. 796-799, vol. 39.

Hibbett, D. S., et al., "A Higher-Level Phylogenetic Classification of the Fungi," Mycol Res., 2007, pp. 509-547, vol. 111.

Hill, N. S., et al., "Endophyte Survival during Seed Storage: Endophyte-Host Interactions and Heritability," Crop Sci., 2009, pp. 1425-1430, vol. 49.

Hill N. S., et al., "Endophyte Survival during Seed Storage: Endophyte-Host Interactions and Heritability," PowerPoint, Dept. Crop Soil Sciences, University of Georgia, Nov. 16, 2012, 3 Pages.

Hinton, D. M., et al., "Enterobacter cloacae is an endophytic symbiont of corn," Mycopathologia, 1995, pp. 117-125, vol. 129.

Hjort, K., et al., "Chitinase genes revealed and compared in bacterial isolates, DNA extracts and a metagenomic library from a phytopathogen-suppressive soil", FEMS Microbiology Ecology, Feb. 2010, vol. 71, No. 2, pp. 197-207.

Hoffman, M., et al., "Diverse Bacteria Inhabit Living Hyphae of Phylogenetically Diverse Fungal Endophytes," Applied and Environmental Microbiology, Jun. 2010, p. 4063-4075, vol. 76, No. 12.

Hoffman, M., et al., "Endohyphal Bacterium Enhances Production of Indole-3-Acetic Acid by a Foliar Fungal Endophyte," PLOS One, Sep. 24, 2013, pp. 1-8, vol. 8, Issue 9, e73132.

Howell, C.R., et al., "Induction of Terpenoid Synthesis in Cotton Roots and Control of Rhizoctonia solani by Seed Treatment with Trichoderma virens," Phytopathology, 2000, pp. 248-252, vol. 90, No. 3.

Hubbard, M., et al., 2011. "Agricultural Potential of Fungal Endophytes of Grasses, Cereals and Wheat," In: Wheat: Genetics, Crops and Food Production. Nova Science Publishers Hauppauge, NY, USA. pp. 333-345.

Hubbard, M., et al., "Fungal Endophytes Improve Wheat Seed Germination Under Heat and Drought Stress," Botany, 2012, pp. 137-149, vol. 90.

Humann, J., et al., "Complete genome of the onion pathogen Enterobacter cloacae EcWSU1," Standard in Genomic Sciences, Dec. 31, 2011, vol. 5, No. 3, pp. 279-286.

Hung, P. Q., et al., "Isolation and Characterization of Endophytic Bacteria in Soybean (*Glycine* Sp.)," Omonrice, 2004, pp. 92-101, vol. 12.

Idris, A., et al., "Efficacy of Rhizobacteria for Growth Promotion in Sorghum Under Greenhouse Conditions and Selected Modes of Action Studies," J Agr Sci., 2009, pp. 17-30, vol. 147.

Ikeda, S., et al., "The Genotype of The Calcium/Calmodulin-Dependent Protein Kinase Gene (CCaMK) Determines Bacterial Community Diversity in Rice Roots Under Paddy and Upland Field Conditions," Applied and Environmental Microbiology, 2011, pp. 4399-4405, vol. 77, No. 13.

Imoto, K., et al., "Comprehensive Approach to Genes Involved in Cell Wall Modifications in *Arabidopsis thaliana*," Plant Mol Biol., 2005, pp. 177-192, vol. 58.

Impullitti, A.E., et al., "Fungal endophyte diversity in soybean", Journal of Applied Microbiolog, vol. 114, No. 5, May 1, 2013, pp. 1500-1506.

Jalgaonwala, R., et al., "A Review on Microbial Endophytes from Plants: A Treasure Search for Biologically Active Metabolites," Global Journal of Research on Medicinal Plants & Indigenous Medicine, 2014, pp. 263-277, vol. 3, No. 6.

Janda, J. M., et al., "16S rRNA Gene Sequencing for Bacterial Identification in the Diagnostic Laboratory Pluses, Perils, and Pitfalls," Journal of Clinical Microbiology, 2007, pp. 2761-2764, vol. 45, No. 9.

Johnston-Monje, D., et al., "Conservation and Diversity of Seed Associated Endophytes in Zea Across Boundaries of Evolution, Ethnography and Ecology," Plos One, vol. 6, No. 6, Jun. 3, 2011, p. e20396, 22 Pages.

Johnston-Monje, D., et al., "Plant and Endophyte Relationships: Nutrient Management," Comprehensive Biotechnol., 2011, pp. 713-727, vol. 4.

Johnston-Monje, D., "Microbial Ecology of Endophytic Bacteria in Zea Species as Influenced by Plant Genotype, Seed Origin, and Soil Environment," Thesis, University of Guelph, 2011, 230 Pages.

Jones, K.L., "Fresh Isolates of Actinomycetes in which the Presence of Sporogenous Aerial Mycelia is a Fluctuating Characteristic," J Bacteriol., 1949, pp. 141-145, vol. 57, No. 2.

Jung, C., et al., "The Effects of Endohyphal Bacteria on Anti-Cancer and Anti-Malaria Metabolites of Endophytic Fungi," Honors Thesis, University of Arizona, May 2012, 15 Pages.

Kaga, H., et al., "Rice Seeds as Sources of Endophytic Bacteria," Microbes Environ., 2009, pp. 154-162, vol. 24, No. 2.

Kalns, L., et al., "The Effects of Cotton Fungal Endophytes in the Field on Arthropod Community Structure," Power Point Presentation dated Jan. 7, 2013.

Kanbar, A., et al., "Relationship between Root and Yield Morphological Characters in Rainfed Low Land Rice (*Oryza sativa* L.)," Cereal Research Communications, 2009, vol. 37, No. 2, pp. 261-268.

Kang, B. H., et al., "Members of the *Arabidopsis* Dynamin-Like Gene Family, ADL1, are Essential for Plant Cytokinesis and Polarized Cell Growth," Plant Cell, 2003, pp. 899-913, vol. 15.

(56) References Cited

OTHER PUBLICATIONS

Kasana, R. C., et al., "A Rapid and Easy Method for the Detection of Microbial Cellulases on Agar Plates Using Gram's Iodine," Curr Microbiol., 2008, pp. 503-507, vol. 57.

Khan, A.L., et al., "Salinity Stress Resistance Offered by Endophytic Fungal Interaction Between Penicillium minioluteum LHL09 and *Glycine max*. L," J. Microbiol. Biotechnol., 2011, pp. 893-902, vol. 21, No. 9.

Kim, M., et al., "Towards a taxonomic coherence between average nucleotide identity and 16S rRNA gene sequence similarity for species demarcation of prokaryotes", Int J Systematic Evolutionary Microbial., 2014, vol. 64, pp. 346-351.

Klaubauf, S., et al., "Molecular diversity of fungal communities in agricultural soils from Lower Austria," Fungal Diversity, Aug. 13, 2010, pp. 65-75, vol. 44, No. 1.

Knapp, D., et al., "Inter- and intraspecific functional diversity of fungal root endophytes of semiarid sandy grasslands," Acta Microbiologica et Immunologica Hungarica, Nov. 2017, pp. 1-101, vol. 64, Issue Supplement 1.

Kruger, M., et al., "DNA-Based Species Level Detection of Glomeromycota: One PCR Primer Set for All Arbuscular Mycorrhizal Fungi," New Phvtol., 2009, pp. 212-223, vol. 183.

Kuklinsky-Sobral, J., et al., "Isolation and Characterization of Endophytic Bacteria from Soybean (*Glycine max*) Grown in Soil Treated with Glyphosate Herbicide," Plant and Soil, 2005, pp. 91-99, vol. 273.

Kuklinsky-Sobral, J., et al., "Isolation and characterization of soybean—associated bacteria and their potential for plant growth promotion," Environmental Microbiology, 2004, pp. 1244-1251, vol. 6, No. 12.

Kumar, S., et al., "MEGA7: Molecular Evolutionary Genetics Analysis version 7.0 for bigger datasets," Molecular Biology and Evolution, Mar. 22, 2016, vol. 33, pp. 1870-1874.

Kumar, A., et al., "Bio-control potential of *Cladosporium* sp. (MCPL-461), against a noxious weed *Parthenium hysterophorus* L.," J. Environ Biol., Mar. 2009, pp. 307-312, vol. 30, Issue 2.

Kusari, S., et al. "Chemical ecology of endophytic fungi: origins of secondary metabolites," Cell Press, Chem & Biol., 2012, pp. 792-798, vol. 19.

Labeda, D.P., et al., "Phylogenetic study of the species within the family Streptomycetaceae," Antonie van Leeuwenhoek, 2012, vol. 101, pp. 73-104, Springer.

Lanver, D., et al., "Sho1 and Msb2-Related Proteins Regulate Appressorium Development in the Smut Fungus *Ustilago aydis*," Plant Cell, 2010, pp. 2085-2101, vol. 22.

Laus, M. C., et al., "Role of Cellulose Fibrils and Exopolysaccharides of Rhizobium leguminosarum in Attachment to and Infection of Vicia sativa Root Hairs," Mol Plant Microbe Interact., 2005, pp. 533-538, vol. 18, No. 6.

Le, X.H., et al., "Effects of endophytic Streptomyces on the lucerne (*Medicago sativa* L.) symbiosis at different levels of nitrogen," 17th Australian Nitrogen Fixation Conference 2014 Proceedings, Sep. 29, 2014, ed. Gupta, V.V.S.R., Unkovich, M. and Kaiser, B. N., ASNF, University of Adelaide, pp. 66-67.

Le, X.H., et al., "Isolation and characterisation of endophytic actinobacteria and their effect on the early growth and nodulation of lucerne (*Medicago sativa* L.)," 17th Australian Nitrogen Fixation Conference 2014 Proceedings, Sep. 29, 2014, ed. Gupta, V.V.S.R., Unkovich, M. and Kaiser, B. N., ASNF, University of Adelaide, pp. 134-136.

Lehman, S.G., "Treat Cotton Seed," Research and Farming III, Progr. Rept., 1945, 3, 5, 16 Pages.

Li, H. M., et al., "Expression of a Novel Chitinase by the Fungal Endophyte in Poa ampla," Mycologia, 2004, pp. 526-536, vol. 96, No. 3.

Li, H., et al., "Endophytes and their role in phytoremediation," Fungal Diversity, 2012, pp. 11-18, vol. 54.

Li, Q., "*Agrobacterium tumefaciens* Strain TA-AT-10 16S Ribosomal RNA Gene, Partial Sequence: GenBank: KF673157.1," Submitted Sep. 17, 2013.

Li, M., et al., "ATP Modulates the Growth of Specific Microbial Strains", Current Microbiology, May 30, 2010, vol. 62, No. 1, pp. 84-89.

Liu, M., et al., "A Novel Screening Method for Isolating Exopolysaccharide-Deficient Mutants," Appl Environ Microbiol., 1998, pp. 4600-4602, vol. 64, No. 11.

Liu, Y., et al., "Investigation on Diversity and Population Succession Dynamics of Endophytic Bacteria from Seeds of Maize (*Zea mays* L., Nongda108) at Different Growth Stages," Ann Microbiol., 2013, pp. 71-79, vol. 63.

Liu, D., et al., "Osmotin Overexpression in Potato Delays Development of Disease Symptoms," Proc Natl Acad Sci USA, 1994, pp. 1888-1892, vol. 91.

Liu, Y., et al., "Phylogenetic relationships among ascomycetes: evidence from an RNA polymerase II subunit," Mol. Biol. Evol. 1999. vol. 16, No. 12, pp. 1799-1808.

Liu, Y., et al., "Study on Diversity of Endophytic Bacterial Communities in Seeds of Hybrid Maize and their Parental Lines," Arch Microbiol., 2012, pp. 1001-1012, vol. 194.

Long, H. H., et al., "The Structure of the Culturable Root Bacterial Endophyte Community of Nicotiana attenuata is Organized by Soil Composition and Host Plant Ethylene Production and Perception," New Phytol., 2010, pp. 554-567, vol. 185.

Lopez-Lopez, A., et al., "Phaseolus vulgaris Seed-Borne Endophytic Community with Novel Bacterial Species such as *Rhizobium endophyticum* sp. nov.," Systematic Appl Microbiol., 2010, pp. 322-327, vol. 33.

Lorck, H., "Production of Hydrocyanic Acid by Bacteria," Physiol Plant, 1948, pp. 142-146, vol. 1.

Lugtenberg, B., et al., "Plant-Growth-Promoting Rhizobacteria," Ann. Rev. Microbiol., 2009, pp. 541-556, vol. 63.

Lundberg, D. S., et al., "Defining the Core *Arabidopsis thaliana* Root Microbiome," Nature, 2012, pp. 86-90, vol. 488, No. 7409.

Lundberg, D. S., et al., "Practical Innovations for High-Throughput Amplicon Sequencing," Nat Methods, 2013, pp. 999-1002, vol. 10, No. 10.

Ma, Y., et al., "Plant Growth Promoting Rhizobacteria and Endophytes Accelerate Phytoremediation of Metalliferous Soils," Biotechnology Advances, 2011, pp. 248-258, vol. 29.

Madi, L. et al., "Aggregation in Azospirillum brasilense Cd: Conditions and Factors Involved in Cell-to-Cell Adhesion," Plant Soil, 1989, pp. 89-98, vol. 115.

Mandyam, K., et al., "Mutualism-parasitism paradigm synthesized from results of root-endophyte models", Frontiers in Microbiology, Jan. 12, 2015, pp. 1-14, vol. 5.

Mannisto, M.K., et al., "Characterization of Psychrotolerant Heterotrophic Bacteria From Finnish Lapland," Svst Appl Microbiol., 2006, pp. 229-243, vol. 29.

Mano, H., et al., "Culturable Surface and Endophytic Bacterial Flora of the Maturing Seeds of Rice Plants (*Oryza sativa*) Cultivated in a Paddy Field," Microbes Environ., 2006, vol. 21, No. 2.

Manter, D. K., et al., "Use of the ITS Primers, ITSIF and ITS4, to Characterize Fungal Abundance and Diversity in Mixed-Template Samples by qPCR and Length Heterogeneity Analysis," J Microbiol Methods, 2007, pp. 7-14, vol. 71.

Mao, W., et al., "Seed Treatment with a Fungal or a Bacterial Antagonist for Reducing Corn Damping-off Caused by Species of Pythium and Fusarium," Plant Disease, 1997, pp. 450-454, vol. 81, No. 5.

Marasco, R., et al., "A Drought Resistance-Promoting Microbiome is Selected by Root System Under Desert Farming," PLoS ONE, 2012, vol. 7, No. 10, 14 Pages.

Marquez, L. M., et al., "A Virus in a Fungus in a Plant: Three-Way Symbiosis Required for Thermal Tolerance," Science, 2007, pp. 513-515, vol. 315.

Mastretta, C., et al., "Endophytic Bacteria from Seeds of Nicotiana Tabacum Can Reduce Cadmium Phytotoxicity," Intl J Phytoremediation, 2009, pp. 251-267, vol. 11.

Mateos, P. F., et al., "Cell-Associated Pectinolytic and Cellulolytic Enzymes in Rhizobium leguminosarum biovar trifolii," Appl Environ Microbiol., 1992, pp. 816-1822, vol. 58, No. 6.

(56) References Cited

OTHER PUBLICATIONS

McDonald, D., et al., "An Improved Greengenes Taxonomy with Explicit Ranks for Ecological and Evolutionary Analyses of Bacteria and Archaea," ISME J., 2012, pp. 610-618, vol. 6.

McGuire, K.L., et al., "Digging the New York City Skyline: Soil Fungal Communities in Green Roofs and City Parks," PloS One, 2013, vol. 8, No. 3, 13 Pages.

Medina, P., et al., "Rapid Identification of Gelatin and Casein Hydrolysis Using TCA," J Microbiol Methods, 2007, pp. 391-393, vol. 69.

Mehnaz, S., et al., "Growth Promoting Effects of Corn (Zea mays) Bacterial Isolates Under Greenhouse and Field Conditions," Soil Biology and Biochemistry, 2010, pp. 1848-1856, vol. 42.

Mehnaz, S., et al., "Isolation and 16S rRNA sequence analysis of the beneficial bacteria from the rhizosphere of rice," Canada Journal of Microbiology, 2001, pp. 110-117, vol. 47, No. 2.

Mei, C., et al., "The Use of Beneficial Microbial Endophytes for Plant Biomass and Stress Tolerance Improvement," Recent Patents on Biotechnology, 2010, pp. 81-95, vol. 4.

Michel, B. E., et al., "The Osmotic Potential of Polyethylene Glycol 6000," Plant Physiol., 1973, pp. 914-916, vol. 51.

Misk, A., et al., "Biocontrol of chickpea root rot using endophytic actinobacteria", Biocontrol, vol. 56, No. 5, Mar. 12, 2011, pp. 811-822, XP036215297.

Miyoshi-Akiyama, T., et al., "Multilocus Sequence Typing (MLST) for Characterization of Enterobacter cloacae," PLoS ONE, 2013, vol. 8, No. 6, 10 Pages, e66358.

Moe, L. A., "Amino Acids in the Rhizosphere: From Plants to Microbes," American Journal of Botany, 2013, pp. 1692-1705, vol. 100, No. 9.

Mohiddin, F. A., et al., "Tolerance of Fungal and Bacterial Biocontrol Agents to Six Pesticides Commonly Used in the Control of Soil Borne Plant Pathogens," African Journal of Agricultural Research, 2013, pp. 5331-5334, vol. 8, No. 43.

Mousa, W. K., et al., "The Diversity of Anti-Microbial Secondary Metabolites Produced by Fungal Endophytes: An Interdisciplinary Perspective," Front Microbiol., 2013, vol. 4, No. 65, 18 Pages.

Mundt, J.O., et al., "Bacteria Within Ovules and Seeds," Appl Environ Microbiol., 1976, pp. 694-698, vol. 32, No. 5.

Naik, B. S., et al., "Study on the diversity of endophytic communities from rice (Oryza sativa L.) and their antagonistic activities in vitro," Microbiological Research, 2009, pp. 290-296, vol. 164.

Nassar, A., et al., "Promotion of plant growth by an auxin-producing isolate of the yeast Williopsis saturnus endophytic in maize (Zea mays L.) roots", Biology and Fertility of Soils; Cooperating Journal of International Society of Soil Science, Springer, Berlin, DE, vol. 42, No. 2, Nov. 1, 2005, pp. 97-108.

Naveed, M., "Maize Endophytes—Diversity, Functionality and Application Potential," University of Natural Resources and Life Sciences, 2013, pp. 1-266 and 81-87; Tables 1-3; Figure 2.

Nejad, P. et al., "Endophytic Bacteria Induce Growth Promotion and Wilt Disease Suppression in Oilseed Rape and Tomato," Biological Control, 2000, pp. 208-215, vol. 18.

Neslon, E.B., "Microbial Dynamics and Interactions in the Spermosphere," Ann. Rev. Phytopathol., 2004, pp. 271-309, vol. 42.

Nikolcheva, L.G., et al., "Taxon-Specific Fungal Primers Reveal Unexpectedly High Diversity During Leaf Decomposition in a Stream," Mycological Progress, 2004, pp. 41-49, vol. 3, No. 1.

Nimnoi, P., et al., "Co-Inoculation of Soybean (Glycin max) with Actinomycetes and Bradyrhizobium Japonicum Enhances Plant Growth, Nitrogenase Activity and Plant Nutrition," Journal of Plant Nutrition, 2014, pp. 432-446, vol. 37.

Nishijima, K.A., et al., "Demonstrating Pathogenicity of Enterobacter cloacae on Macadamia and Identifying Associated Volatiles of Gray Kernel of Macadamia in Hawaii," Plant Disease, Oct. 2007, vol. 91, No. 10, pp. 1221-1228.

Normander, B., et al., "Bacterial Origin and Community Composition in the Barley Phytosphere as a Function of Habitat and Presowing Conditions," Appl Environ Microbiol., Oct. 2000, pp. 4372-4377, vol. 66, No. 10.

Ogbo, F., et al., "Some Characteristics of a Plant Growth Promoting iEnterobacter/isp. Isolated from the Roots of Maize", Advances in Microbiology, Jan. 1, 2012, vol. 02, No. 03, pp. 368-374.

O'Hanlon, K., et al., "Exploring the potential of symbiotic fungal endophytes in cereal disease suppression", Biological Control, vol. 63, No. 2, Sep. 5, 2012, pp. 69-78.

Okunishi, S., et al., "Bacterial Flora of Endophytes in the Maturing Seeds of Cultivated Rice (Oryza sativa)," Microbes and Environment, 2005, pp. 168-177, vol. 20, No. 3.

Op De Beeck, M., et al., "Comparison and Validation of Some ITS Primer Pairs Useful for Fungal Metabarcoding Studies," Plos One, Jun. 2014, vol. 9, Issue 6, e97629, pp. 1-11.

Orole, O. O., et al., "Bacterial and fungal endophytes associated with grains and roots of maize," Journal of Ecology and the Natural Enviornment, 2011, pp. 298-303, vol. 3, No. 9.

Partida-Martinez, L.P., et al., "The Microbe-Free Plant: Fact or Artifact?" Front Plant Sci., 2011, vol. 2, No. 100, 16 Pages.

Partida-Martinez, L.P., et al., "Endosymbiont-Dependent Host Reproduction Maintains Bacterial-Fungal Mutualism", Current Biology, May 1, 2007, vol. 17, No. 9, pp. 773-777.

Pearson, W.R., et al., "Rapid and Sensitive Sequence Comparison With FASTP and FASTA," Methods Enzymol., 2011, pp. 63-98, vol. 183.

Pedraza, R. O., et al., "Azospirillum inoculation and nitrogen fertilization effect on grain yield and on the diversity of endophytic bacteria in the phyllosphere of rice rainfed crop," European Journal of Soil Biology, 2009, pp. 36-43, vol. 45.

Perez-Fernandez, M. A., et al., "Simulation of Germination of Pioneer Species Along an Experimental Drought Gradient," J Environ Biol., 2006, pp. 669-685, vol. 27, No. 4.

Perez-Miranda, S., et al., "O-CAS, A Fast and Universal Method for Siderophore Detection," J Microbiol Methods, 2007, pp. 127-131, vol. 70.

Petti, C. A., "Detection and Identification of Microorganisms by Gene Amplification and Sequencing," Clinical Infectious Diseases, 2007, pp. 1108-1114, vol. 44.

Phalip, V., et al., "A Method for Screening Diacetyl and Acetoin-Producing Bacteria on Agar Plates," J Basic Microbiol., 1994, pp. 277-280, vol. 34.

Philippot, L., et al., "Going Back to the Roots: The Microbial Ecology of the Rhizosphere," Nat Rev Microbiol., Nov. 2013, pp. 789-799, vol. 11.

Philrice Batac, Philippine Rice R&D Highlights, 2012, Area-Based R&D Projects, 52 Pages, [online][Retrieved Aug. 11, 2016] Retrieved from the Internet <URL:http://www.philrice.gov.ph/2012-rd-highlights/>.

Pillay, V. K., et al., "Inoculum Density, Temperature, and Genotype Effects on in vitro Growth Promotion and Epiphytic and Endophytic Colonization of Tomato (Lycopersicon esculentum L.) Seedlings Inoculated with a Pseudomonad Bacterium," Can J Microbiol., 1997, pp. 354-361, vol. 43.

Powell, W. A., et al., "Evidence of Endophytic Beauveria Bassiana in Seed-Treated Tomato Plants Acting as a Systemic Entomopathogen to Larval Helicoverpa zea (Lepidoptera: Noctuidae)," J. Entomol. Sci., 2009, pp. 391-396, vol. 44, No. 4.

Quadt-Hallmann, A., et al., "Bacterial Endophytes in Cotton: Mechanisms of Entering the Plant," Can J Microbiol., 1997, pp. 577-582, vol. 43.

R Core Team, "R: A Language and Environment for Statistical Computing," R Foundation for Statistical Computing, Vienna, Austria, May 2013, ISBN: 3-900051-07-0. Available online at http://www.R- 25project.org/, 3604 Pages.

Rae, R., et al., "A subset of naturally isolated Bacillus strains show extreme virulence to the free-living nematodes Caenorhabditis elegans and Pristionchus pacificus". Environmental Microbiology, 2010, pp. 3007-3021, vol. 12, No. 11.

Rasmussen, S., et al., "Grass-endophyte interactions: a note on the role of monosaccharide transport in the Neotyphodium lolii-Lolium perenne symbiosis," New Phytologist, 2012, pp. 7-12, vol. 196.

Ravel, C., et al., "Beneficial effects of Neotyphodium lolii on the growth and the water status in perennial ryegrass cultivated under nitrogen deficiency or drought stress," Agronomie, 1997, pp. 173-181, vol. 17.

(56) References Cited

OTHER PUBLICATIONS

Redman, R. S., et al., "Thermotolerance Generated by Plant/Fungal Symbiosis," Science, Nov. 2002, vol. 298, 1 Page (with 4 pages of supplemental material).
Reiter, B., et al., "Response of Endophytic Bacterial Communities in Potato Plants to Infection with *Erwinia carotovora* subsp. atroseptica," Appl Environ Microbiol., 2001, pp. 2261-2268, vol. 68, No. 5.
Ren, Y., et al., "Complete Genome Sequence of *Enterobacter cloacae* subsp. cloacae Type Strain ATCC 13047," J. Bacteriol. May 2010, vol. 192, No. 9, pp. 2463-2464.
Riess, K., et al., "High genetic diversity at the regional scale and possible speciation in Sebacina epigaea and S. incrustans," BMC Evolutionary Biology, 2013, vol. 13, No. 102, 17 Pages.
Riken, GI No. GMFL01-01-D03, 2 Pages, [online] [Retrieved on Dec. 18, 2017] Retrieved from the internet <URL:http://spectra.psc.riken.jp/menta.cgi/rsoy/datail?id=GMFL01-01-D03>.
Rodriguez, H., et al., "Expression of a Mineral Phosphate Solubilizing Gene From Erwinia herbicola in Two Rhizobacterial Strains," J Biotechnol., 2001, pp. 155-161, vol. 84.
Rodriguez, R.J., et al., "Stress Tolerance in Plants via Habitat-Adapted Symbiosis," ISME J., 2008, pp. 404-416, vol. 2.
Rodriguez-Navarro, D., et al., "Soybean Interactions with Soil Microbes, Agronomical and Molecular Aspects," Agronomy for Sustainable Development, 2011, pp. 173-190, vol. 31, No. 1.
Roessner, U., et al., "Metabolic Profiling Allows Comprehensive Phenotyping of Genetically or Environmentally Modified Plant Systems," Plant Cell, 2001,pp. 11-29, vol. 13.
Rosado, A. S., et al., "Phenotypic and Genetic Diversity of *Paenibacillus azotofixans* Strains Isolated from the Rhizoplane or Rhizosphere Soil of Different Grasses," J App Microbiol., 1998, pp. 216-226, vol. 84.
Rosenblueth, A., et al., "Seed Bacterial Endophytes: Common Genera, Seed-to-Seed Variability and Their Possible Role in Plants," Acta Hort., 2012, pp. 39-48, vol. 938.
Rosenblueth, M., et al., "Bacterial Endophytes and Their Interactions With Host," Molecular Plant-Microbe Interactions, 2006, pp. 827-837, vol. 19, No. 8.
Ross, P.L., et al., "Multiplexed Protein Quantitation in *Saccharomyces cerevisiae* Using Amine-Reactive Isobaric Tagging Reagents," Mol Cell Proteomics, 2004, pp. 1154-1169, vol. 3, No. 12.
Saleem, M., et al., "Perspective of Plant Growth Promoting Rhizobacteria (PGPR) Containing ACC Deaminase in Stress Agriculture," J Ind Microbiol Biotechnol., Oct. 2007, pp. 635-648, vol. 34.
Samac, D.A., et al., "Recent Advances in Legume-Microbe Interactions: Recognition, Defense Response, and Symbiosis from a Genomic Perspective," Plant Physiol., 2007, pp. 582-587, vol. 144.
Samways, M.J., et al., "Assessment of the Fungus *Cladosporium oxysporum* (BERK. and CURT.) As a Potential BioControl Agent Against Certain Homoptera," Elsevier Science Publioshers B.V., Jan. 1, 1986, pp. 231-239.
Sardi, P., et al., "Isolation of Endophytic *Streptomyces* Strains from Surface Sterilized Roots," Applied and Environmental Microbiology, 1992, pp. 2691-2693, vol. 58, No. 8.
Sarkar, S., et al., "New report of additional enterobacterial species causing wilt in West Bengal, India," Canadian Journal of Microbiology, 2015, vol. 61, No. 7, pp. 477-486.
Sarwar, M., et al., "Tryptophan Dependent Biosynthesis of Auxins in Soil," Plant Soil, 1992, pp. 207-215, vol. 147.
Saunders, M., et al., "Host-Synthesized Secondary Compounds Influence the In Vitro Interactions between Fungal Endophytes of Maize", Applied and Environmental Microbiology, Nov. 9, 2007, pp. 136-142, vol. 74 , No. 1.
Schmieder, R., et al., "Quality Control and Preprocessing of Metagenomic Datasets," Bioinformatics, 2011, pp. 863-864, vol. 27, No. 6.
Schneider, C., et al., "Endophytes for plant protection: the state of the art Proceedings," DPG Spectrum Phytomedizin, Proceedings of the 5th International Symposium on Plant Protection and Plant Health in Europe, May 26-29, 2013, 347 Pages.
Schoch, C. L., et al., "Nuclear Ribosomal Internal Transcribed Spacer (ITS) Region as a Universal DNA Barcode Marker for Fungi," Proc Natl Acad Sci USA, 2012, pp. 6241-6246, vol. 109, No. 16.
Schwyn, B. et al., "Universal Chemical Assay for the Detection and Determination of Siderophores," Analytical Biochemistry, 1987, pp. 47-56, vol. 160.
NCBI, GenBank Accession No. KX641 980.1, Jul. 29, 2017, Scott, M., et al., "*Dothideomycetes* sp. isolate FT14-6 internal transcribed spacer 1, partial sequence; 5.8S ribosomal RNA gene and internal transcribed spacer 2, complete sequence; and large subunit ribosomal RNA gene, partial sequence," 2 Pages, Can be retrieved at <URL:https://www.ncbi.nlm.nih.gov/nuccore/KX641980>.
Senthilkumar, M., et al., "Biocontrol Potential of Soybean Bacterial Endophytes Against Charcoal Rot Fungus, *Rhizoctonia bataliola*," Current Microbiology, 2009, vol. 58, pp. 288-293.
Sessitsch, A., et al., "*Burkholderia phytofirmans* sp. Nov., a novel plant-associated bacterium with plant-beneficial properties," International Journal of Systematic and Evoluntary Microbiology, 2005, pp. 1187-1192, vol. 55.
Shapiro-Ilan, D.I., et al., "The Potential for Enhanced Fungicide Resistance in Beauveria Bassiana Through Strain Discovery and Artificial Selection," Journal of Invertebrate Pathology, 2002, pp. 86-93, vol. 81.
Shankar, M., et al. ."Root colonization of a rice growth promoting strain of *Enterobacter cloacae*," Journal of Basic Microbiology, 2011, pp. 523-530, vol. 51.
Sharma, et al: "Detection and identification of bacteria intimatelyassociated with fungi of the order Sebacinales", Cellular Microbiology, Aug. 5, 2008, pp. 2235-2246, vol. 10, No. 11.
Shiraishi, A., et al., "Nodulation in black locust by the ammaproteobacteria *Pseudomonas* sp. and the Betaproteobacteria Burkholderia sp", Systematic and Applied Microbiology, Aug. 2010, pp. 269-274, vol. 33, No. 5.
Simola, L., et al., "The Effect of Some Protein and Non-Protein Amino Acids on the Growth of Cladosporium herbarum and Trichotheeium roseum," Effect of Amino Acids on Fungi, Physiologia Plantarum, 1979, pp. 381-387, vol. 46.
Singh, A. K., et al., "Uncultured *Actinomyces* sp. Clone EMLACT 80 IV (New) 16S Ribosomal RNA Gene, Partial Sequence," NCBI GenBank Accession No. JQ285908. Submitted Dec. 13, 2011.
Soares, M. M. C. N., et al., "Screening of Bacterial Strains for Pectinolytic Activity: Characterization of the Polygalacturonase Produced by Bacillus SP," Revista de Microbiolgia, 1999, pp. 299-303, vol. 30.
Soe, K.M., et al., "Effects of endophytic actinomycetes and *Bradyrhizobium japonicum* strains on growth, nodulation, nitrogen fixation and seed weight of different soybean varieties," Soil Science and Plant Nutrition, 2012, pp. 319-325, vol. 58, No. 3.
Soe, K.M., et al., "Low-Density Co-Inoculation of Myanmar Bradyrhizobium yuanmingense MAS34 and Streptomyces griseoflavus P4 to Enhance Symbiosis and Seed Yield in Soybean Varieties," American Journal of Plant Sciences, 2013, pp. 1879-1892, vol. 4.
Sogonov, M.V., et al., "The hyphomycete *Teberdinia hygrophila* gen. nov., sp. nov. and related anamorphs of *Pseudeurotium* species," Mycologia, May 2005, pp. 695-709, vol. 97, No. 3.
Souleimanov, A., et al., "The Major Nod Factorof Bradyrhizobium japonicum Promotes Early Growth of Soybean and Corn," J. Exp. Bot., 2002, pp. 1929-1934, vol. 53, No. 376.
Spiekermann, P., et al., "A Sensitive, Viable-Colony Staining Method Using Nile Red for Direct Screening of Bacteria that Accumulate Polyhydroxyalkanoic Acids and Other Lipid Storage Compounds," Arch Microbiol., 1999, pp. 73-80, vol. 171.
Staudt, A. K., et al., "Variations in Exopolysaccharide Production by Rhizobium tropici," Arch Microbiol., 2012, pp. 197-206, vol. 194.
Stielow, J.B., et al., "One fungus, which genes? Development and assessment of universal primers for potential secondary fungal DNA barcodes," Persoonia: Molecular Phylogeny and Evolution of Fungi, 2015, vol. 35, pp. 242-263.
Strobel, G. A., "Endophytes as Sources of Bioactive Products," Microbes and Infection, 2003, pp. 535-544, vol. 5.

(56) References Cited

OTHER PUBLICATIONS

Sturz, A. V., et al., "Weeds as a Source of Plant Growth Promoting Rhizobacteria in Agricultural Soils," Can J Microbiol., 2001, pp. 1013-1024, vol. 47, No. 11.

Surette, M. A., et al. "Bacterial Endophytes in Processing Carrots (*Daucus carota* L. var. sativus): Their Localization, Population Density, Biodiversity and Their Effects on Plant Growth," Plant and Soil, 2003, pp. 381-390, vol. 253, No. 2.

Suto, M., et al., "Endophytes as Producers of Xylanase," J Biosci Bioeng., 2002, pp. 88-90, vol. 93, No. 1.

Sword, G., "Manipulating Fungal Endophytes to Protect Plants from Insects and Nematodes," Power Point Presentation dated Aug. 7, 2013.

Sword, G., et al., "Manipulating Fungal Endophytes for the Protection of Cotton in the Field," Power Point Presentation dated Jan. 7, 2013.

Sword, G., et al., "Field Trials of Potentially Beneficial Fungal Endophytes in Cotton," Power Point Presentation dated Jan. 7, 2013.

Sword, G., "Fungal Endophytes to Protect Cotton from Insects and Nematodes," Power Point Presentation dated Dec. 7, 2012, 20 Pages.

Sword, G., "Natural Enemies—The Forgotten Basis of IPM?," Power Point Presentation dated Sep. 6, 2013.

Taghavi, S., et al., "Genome Survey and Characterization of Endophytic Bacteria Exhibiting a Beneficial Effect on Growth and Development of Poplar Trees," Applied and Environmental Microbiology, 2009, pp. 748-757, vol. 75, No. 3.

Taghavi, S., et al., "Genome Sequence of the Plant Growth promoting Endophytic Bacterium Enterobacter sp. 638", PLoS Genet., May 2010, pp. 1-15, vol. 6, Issue 5, e1000943.

Tamura, K., et al., "Estimation of the number of nucleotide substitutions in the control region of mitochondrial DNA in humans and chimpanzees," Molecular Biology and Evolution, 1993, vol. 10, No. 3, pp. 512-526.

Taylor, A. G., et al., "Concepts and Technologies of Selected Seed Treatments," Annu. Rev. Phytopathol., 1990, pp. 321-339, vol. 28.

Teather, R. M., et al., "Use of Congo Red-Polysaccharide Interactions in Enumeration and Characterization of Cellulolytic Bacteria from the Bovine Rumen," Appl Environ Microbiol., 1982, pp. 777-780, vol. 43, No. 4.

Thakur, A., et al., "Detrimental effects of endophytic fungus *Nigrospora* sp. on survival and development of Spodoptera litura," Biocontrol Science and Technology, Feb. 1, 2012, pp. 151-161, vol. 22, No. 2.

Thakur, A., et al., "Enhanced Resistance to Spodoptera litura in Endophyte Infected Cauliflower Plants," Environmental Entomology, Apr. 1, 2013, pp. 240-246, vol. 42, No. 2.

Thakur, A., et al., "Suppression of Cellular Immune Response in Spodoptera litura (Lepidoptera Noctuidae) Larvae by Endophytic Fungi *Nigrospora oryzae* and *Cladosporium uredinicola*,", Annals of the Entomological Society of America, May 1, 2014, pp. 674-679, vol. 107, No. 3.

Theis, K. R., et al., "Uncultured Bacterium Clone GM2GI8201A64RC 16S Ribosomal RNA Gene, Partial Sequence," NCBI GenBank Accession No. JX051943, Submitted May 14, 2012.

Thomas, L., et al., "Development of Resistance to Chlorhexidine Diacetate in Pseudomonas aeruginosa and the Effect of a "Residual" Concentration," J Hosp Infect., 2000, pp. 297-303, vol. 46.

Thomashow, M. F., "So What's New in the Field of Plant Cold Acclimation? Lots!," Plant Physiol., 2001, pp. 89-93, vol. 125.

Tokala, R. T., et al., "Novel Plant-Microbe Rhizosphere Interaction Involving *Streptomyces lydicus* WYEC108 and the Pea Plant (*Pisum sativum*)," Applied and Environmental Microbiology, May 2002, pp. 2161-2171, vol. 68, No. 5.

Trichoderma definition, 2016, 6 Pages, [online] [Retrieved on Sep. 16, 2016,] Retrieved from the Internet <URL:https://en.wikipedia.org/wiki/Trichoderma>.

Trotel-Aziz, P., et al., "Characterization of New Bacterial Biocontrol Agents Acinetobacter, Bacillus, Pantoea and Pseudomonas spp. Mediating Grapevine Resistance Against Botrytis cinerea," Environmental and Experimental Botany, 2008, pp. 21-32, vol. 64.

Truyens, S., et al., "Changes in the Population of Seed Bacteria of Transgenerationally Cd-Exposed *Arabidopsis thaliana*," Plant Biol., 2013, pp. 971-981, vol. 15.

U'Ren, J.M., et al., "Host and geographic structure of endophytic and endolichenic fungi at the continental scale," American Journal of Botany, May 1, 2012, pp. 898-914, vol. 99, No. 5.

Usadel, B., et al., "The Plant Transcriptome—From Integrating Observations to Models," Front Plant Sci., 2013, pp. 1-3, vol. 4., Article 48, 3 Pages.

Vacheron, J., et al., "Plant Growth-Promoting Rhizobacteria and Root System Functioning," Frontiers Plant Sci., 2013, vol. 4, Article 356, 19 Pages.

Valencia, C. U., et al., "Endophytic Establishment as an Unintended Consequence of Biocontrol with Fungal Entomopathogens," Power Point Presentation dated Jan. 7, 2013, 10 Pages.

Valencia, E., et al., "Mini-review: Brazilian fungi diversity for biomass degradation," Fungal Genetics and Biology, 2013, pp. 9-18, vol. 60.

Van Der Lelie, D., et al., "Poplar and its Bacterial Endophytes: Coexistence and Harmony," Critical Rev Plant Sci., 2009, pp. 346-358, vol. 28.

Verkley, G., et al., "Paraconiothyrium, a new genus to accommodate the mycoparasite Coniothyrium minitans, anamorphs of Paraphaeosphaeria, and four new species," Studies in Mycology, 2004, pp. 323-335, vol. 50.

Vining, K., et al., "Methylome Reorganization During in vitro Dedifferentiation and Regeneration of Populus trichocarpa," BMC Plant Biol., 2013, vol. 13, No. 92, 15 Pages.

Viruel, E., et al., "*Pseudomonas thiveralensis* Strain IEHa 16S Ribosomal RNA Fene, Partial Sequence," NCBI GenBank Accession No. GQ169380.1, Submitted May 15, 2009.

Visagie, C.M., et al., "Identification and nomenclature of the genus *Penicillium*," Studies in Mycology, Jun. 2014, pp. 343-371, vol. 78.

Vujanovic, V., et al., "Viability Testing of Orchid Seed and the Promotion of Colouration and Germination," Annals of Botany, Mar. 17, 2000, pp. 79-86, vol. 86.

Vujanovic, V., et al., "Endophytic hyphal compartmentalization is required for successful mycobiont-wheat interaction as revealed by confocal laser microscopy," The proceedings of the Soils and Crops conference in Saskatoon (2008) published 2009, 7 Pages.

Vujanovic, V., et al., "A comparative study of endophytic mycobiota in leaves of *Acersaccharum* in eastern North America," Mycological Progress, May 2002, pp. 147-154, vol. 1, Issue 2.

Vujanovic, V., et al.."Orchid seed viability testing by fungal bioassays and molecular phylogeny," Floriculture, ornamental and plant biotechnology, 2006, vol. 63, pp. 563-569.

Vujanovic, V., et al., "Mycovitality—a new concept of plant biotechnology," Canadian Journal Plant Pathol, 2007, vol. 29, p. 451.

Vujanovic, V., et al., "19th International Conference on *Arabidopsis*. Research Proceedings—ICAR13," Jul. 23-27, 2008, 264 Pages, Montreal, QC, Canada.

Vujanovic, V., et al., "Seed endosymbiosis: a vital relationship in providing prenatal care to plants," Can. J. Plant Sci., NRC Research Press, Feb. 6, 2017, pp. 972-981, vol. 97.

Vujanovic, V., et al: "Fungal communities associated with durum wheat production system: A characterization by growth stage, plant organ and preceding crop", Crop Protection, Elsevier Science, GB, vol. 37, Feb. 19, 2012, pp. 26-34.

Waller, F., et al., "The Endophytic Fungus Piriformospora indica Reprograms Barley to Salt-Stress Tolerance, Disease Resistance, and Higher Yield," PNAS, 2005, pp. 13386-13391, vol. 102, No. 38.

Wang, B., et al., "Fungal endophytes of native *Gossypium* species in Australia," Mycological Research, 2007, pp. 347-354, vol. 111, No. 3.

Wang, K., et al., "Monitoring in Planta Bacterial Infection at Both Cellular and Whole-Plant Levels Using the Green Fluorescent Protein Variant GFPuv," New Phytol., 2007, pp. 212-223, vol. 174.

Wang, Q., et al., "Naive Bayesian Classifier for Rapid Assignment of rRNA Sequences into the New Bacterial Taxonomy," Appl. Environ. Microbiol., 2007, pp. 5261-5267, vol. 73, No. 16.

(56) References Cited

OTHER PUBLICATIONS

Weaver, P.F., et al., "Characterization of Rhodopseudomonas capsulata," Arch Microbiol., 1975, pp. 207-216, vol. 105.

Welty, R.E., et al., "Influence of Moisture Content, Temperature, and Length of Storage on Seed Germination and Survival of Endophytic Fungi in Seeds of Tall Fescue and Perennial Ryegrass," Phytopathyol., 1987, pp. 893-900, vol. 77, No. 6.

White, J. F., et al., "A Proposed Mechanism for Nitrogen Acquisition by Grass Seedlings Through Oxidation of Symbiotic Bacteria," Symbiosis, 2012, pp. 161-171, vol. 57.

Wiegand, I., et al., "Agar and Broth Dilution Methods to Determine the Minimal Inhibitory Concentration (MIC) of Antimicrobial Substances," Nature Protocols, 2008, pp. 163-175, vol. 3, No. 2.

Xu, M., et al., "Bacterial Community Compositions of Tomato (*Lycopersicum esculentum* Mill.) Seeds and Plant Growth Promoting Activity of ACC Deaminase Producing Bacillus subtilis (HYT-12-1) on Tomato Seedlings," World J Microbiol Biotechnol., 2014, pp. 835-845, vol. 30.

Xu, Y., et al., "Biosynthesis of the Cyclooligomer Despipeptide bassianolide, an Insecticidal Virulence Factor of Beauveria bassiana," Fungal Genetics and Biology, 2009, pp. 353-364, vol. 46.

Xue, Q.Y., et al., "Evaluation of the Strains of Acinetobacter and Enterobacter as potential Biocontrol Agents Against Ralstonia Wilt of Tomato," Biological Control, 2009, vol. 48, pp. 252-258.

Yandigeri, M. S., et al., "Drought-tolerant endophytic actinobacteria promote growth of wheat (*Triticum aestivum*) under water stress conditions," Plant Growth Regulation, 2012, pp. 411-420, vol. 68.

Yashiro et al., "Effect of Streptomycin Treatment on Bacterial Community Structure in the Apple Phyllosphere," Plos One, May 21, 2012, vol. 7, No. 5, 10 pages.

Yennamalli, R., et al., "Endoglucanases: insights into thermostability for biofuel applications", Biotech Biofuels, 2013, vol. 6, Issue 136, pp. 1-9.

Yezerski, A., et al., "The Effects of the Presence of Stored Product Pests on the Microfauna of a Flour Community," Journal of Applied Microbiology, 2005, pp. 507-515, vol. 98.

You, Y., et al., "Analysis of Genomic Diversity of Endophytic Fungal Strains Isolated from the Roots of *Suaeda japonica* and *S. maritima* for the Restoration of Ecosystems in Buan Salt Marsh," Korean Journal of Microbiology and Biotechnology, 2012, pp. 287-295, vol. 40, No. 4. (with English Abstract).

Youssef, Y.A., et al., "Production of Plant Growth Substances by Rhizosphere Myoflora of Broad Bean and Cotton," Biologia Plantarum, 1975, pp. 175-181, vol. 17, No. 3.

Zhang, Y., et al., BcGsl, a glycoprotein from Botrytis cinerea, elicits defence response and improves disease resistance in host plants. Biochemical and biophysical research communications, Biochemical and Biophysical Research Communications, 2015, vol. 457, No. 4, pp. 627-634.

Zhang, W., et al., Host range of Exserohilum monoceras, a potential bioherbicide for the control of *Echinochloa* species, Canadian Journal of Botany/ Journal Canadien De Botan, National Research Council, Ottawa, CA, vol. 75, Jan. 1, 1997, pp. 685-692.

Zhang, J., et al: "Isolation and Characterization of Plant Growth-Promoting Rhizobacteria from Wheat Roots by Wheat Germ Agglutinin Labeled with Fluorescein Isothiocyanate", The Journal of Microbiology, Apr. 27, 2012, vol. 50, No. 2, pp. 191-198, GenBank Accession No. JN210900.

Zhao, J.H., et al., "Bioactive secondary metabolites from *Nigrospora* sp. LLGLM003, an endophytic fungus of the medicinal plant *Moringa oleifera* Lam." World Journal of Microbiology and Biotechnology, Kluwer Academic Publishers, Feb. 12, 2012, pp. 2107-2112, vol. 28, No. 5.

Zhou, W., et al., "Effects of the Fungal Endophyte *Paecilomyces* sp. in Cotton on the Roo-Knot Nematode Meloidogyne incognita," poster dated Jan. 7, 2013.

Zhu et al., *Helminthosporium velutinum* and *H. aquaticum* sp. nov. from aquatic habitats in Yunnan Province, China. Phytotaxa, 2016, vol. 253, No. 3, pp. 179-190.

Zimmerman, N.B., et al., "Fungal Endophyte Communities Reflect Environmental Structuring Across a Hawaiian Landscape," Proc Natl Acad Sci USA, 2012, pp. 13022-13027, vol. 109, No. 32.

Zuccaro, A., et al., "Endophytic Life Strategies Decoded by Genome and Transcriptome Analyses of the Mutualistic Root Symbiont Piriformospora indica," PLOS Pathogens, 2011, vol. 7, No. 10, e1002290.

Zuniga, A., et al., "Quorum Sensing and Indole-3-Acetic Acid Degradation Play a Role in Colonization and Plant Growth Promotion of *Arabidopsis thaliana* by Burkholderia phytofirmans PsJN," Mol Plant Microbe Interact., 2013, pp. 546-553, vol. 26, No. 5.

Bolton, D.K et al., "Forecasting crop yield using remotely sensed vegetation indices and crop phenology metrics," Agricultural and Forest Meteorology, vol. 173, May 2013, pp. 74-84.

Einstein-Curtis, A., "Online grain marketplace launches grain testing service," Feednavigator.com, Oct. 20, 2017, two pages, [Online] [Retrieved on Jun. 1, 2020] Retrieved from the Internet <URL: https://www.feednavigator.com/Article/2017/10/20/Online-grain-marketplace-launches-grain-testing-service>.

Brinkmeyer, R., et al., "Uncultured Bacterium Clone ARKMP-100 16S Ribosomal RNA Gene, Partial Sequence," NCBI GenBank Accession No. AF468334, Submitted Jan. 14, 2002.

Brodie, E.L., et al., "Uncultured Bacterium Clone BANW722 16S Ribosomal RNA Gene, Partial Sequence," NCBI GenBank Accession No. DQ264636, Submitted Oct. 25, 2005.

Dunbar, J, et al., "Uncultured Bacterium Clone NT42a2_20488 16S Ribosomal RNA Gene, Partial Sequence," NCBI GenBank Accession No. JQ378705. Submitted Nov. 8, 2012, 1 Page.

Gavrish, E, et al., "*Lentzea* sp. MS6 16S Ribosomal RNA Gene, Partial Sequence," NCBI GenBank Accession No. EF599958. Submitted May 9, 2007, 1 Page.

NCBI GenBank: CP000653.1 "*Enterobacter* sp. 638, complete genome" ASM1632v1, Apr. 18, 2007, 2 Pages, Can be retrieved at <URL:https://www.ncbi.nlm.nih.gov/assembly/GCA_000016325.1>.

NCBI GenBank: EBI accession No. EM STD:JQ759988, "*Dothideomycetes* sp. genotype 226 isolate FL0175 internal transcribed spacer 1, partial sequence; 5.85 ribosomal RNA gene and internal transcribed spacer 2, complete sequence; and 28S ribosomal RNA gene, partial sequence," May 17, 2012, 1 page.

NCBI GenBank: EBI accession No. EM STD:GU055658, "Uncultured Periconia clone NG R 806 18S ribosomal RNA gene, partial sequence; internal transcribed spacer 1, 5.8S ribosomal RNA gene, and internal transcribed spacer 2, complete sequence; and 28S ribosomal RNA gene, partial sequence," Oct. 27, 2009, 1 page.

GenEmbl Database, GenEmbl Record No. KF673660, Sandberg, et al., "Fungal endophytes of aquatic macrophytes: diverse host-generalists characterized by tissue preferences and geographic structure," 2013, 35 Pages.

GenEmbl Database, GenEmbl Record No. KP991588, Huang, et al., "Pervasive effects of wildfire on foliar endophyte communities in montane forest trees," Mar. 2015, 35 Pages.

GenEmbl Database, GenEmbl Record No. JN872548, 38 Pages, Alvarez-Perez, S., et al., "Zooming-in on floral nectar: a first exploration of nectar-associated bacteria in wild plant communities," FEMS Microbiol. Ecol., 2012, vol. 80, No. 3, pp. 591-602.

GenEmbl database, GenEmbl Record No. EU 977189, Jan. 21, 2009, 4 pages, Smith, S.A., et al., "Bioactive endophytes warrant intensified exploration and conservation," PloS One 3(8):E3052, 2008.

GenEmbl database, GenEmbl Record No. KF011597, *Paenibacillus* strain No. HA 13, Aug. 26, 2013, 5 Pages, Park, H.J., et al., "Isolation and characterization of humic substances-degrading bacteria from the subarctic Alaska grasslands," J Basic Microbiol, 2013.

Database Embl [Online] Oct. 1, 2001, 2 Pages, "Setosphaeria monoceras 28S ribosomal RNA gene, partial sequence," XP002777918, retrieved from EBI accession No. EM_STD:AY016368 Database accession No. AY016368 sequence.

Harman, G.E., et al., "Symposium: biocontrol and biotechnological methods for controlling cotton pests," Proceedings of the Beltwide Cotton Production Research Conf., 1989, Memphis, Tennessee, USA, (Abstract Only).

(56) References Cited

OTHER PUBLICATIONS

Lehman, S.G., "Treat Cotton Seed," Review of Applied Mycology, 1945, 24, 369, 16 Pages.
Leonard, C. A., et al., "Random Mutagenesis of the Aspergillus oryzae Genome Results in Fungal Antibacterial Activity," Int J Microbiol., 2013, vol. 2013, Article ID 901697, 6 Pages.
"Sequence Alignment of JQ047949 with Instant SEQ ID No. 2," Search conducted on Jan. 2, 2019. 2 pages.
Song, M., et al., "Effects of Neotyphodium Endophyte on Germination of Hordeum brevisubulatum under Temperature and Water Stress Conditions," Acta Agrestia Sinica, 2010, pp. 834-837, vol. 18, No. 6. (English Abstract).
Vujanovic, V., et al., "Mycovitality and mycoheterotrophy: where lies dormancy in terrestrial orchid and plants with minute seeds?" Symbiosis, 2007, vol. 44, pp. 93-99.
Waqas, M., et al., "Endophytic Fungi Produce Gibberellins and Indoleacetic Acid and Promotes Host-Plant Growth during Stress," Molecules, 2012, pp. 10754-10773, vol. 17.
Weindling, R., "Relation of dosage to control of cotton seedling diseases by seed treatment," Plant Disease Reporter, 1943, 27, pp. 68-70.
United States Office Action, U.S. Appl. No. 16/455,325, dated Apr. 2, 2020, nine pages.
Dowell, F.E. et al., "Predicting Wheat Quality Characteristics and Functionality Using Near-Infrared Spectroscopy," Cereal Chemistry, vol. 83, Iss. 5, Sep. 2006, pp. 529-536.
Wang, Z.J. et al., "Prediction of grain protein content in winter wheat (*Triticum aestivum* L.) using plant pigment ratio (PPR)," Field Crops Research, vol. 90, Dec. 2004, pp. 311-321.

\* cited by examiner

Geographic Database
135

| Plot Index | County | Avg. Rainfall (in.) | Avg. Temp (°C) |
|---|---|---|---|
| A354 | Alameda | 21 | 11 |
| A355 | Alameda | 25 | 15 |
| C198 | Sonoma | 35 | 15 |
| E859 | Napa | 48 | 13 |
| H008 | San Mateo | 20 | 14 |
| H170 | San Mateo | 18 | 13 |

Agricultural Database
140

| Plot Index | Crop Variant | Plant Date | Field Treatments | Harvest Date |
|---|---|---|---|---|
| A395 | SOY_005 | 04/29/2017 | Pesticide, nitrogen, ... | 08/25/2017 |
| A016 | CORN_105 | 06/05/2017 | Pesticide, fungicide, ... | 09/10/2017 |
| F058 | WHEAT_094 | 09/20/2017 | Pesticide | 05/02/2018 |
| G500 | COTTON_010 | 03/20/2017 | Nitrogen | 11/15/2017 |
| G510 | SOY_405 | 05/01/2017 | Nitrogen | 09/15/2017 |
| K101 | SOY_005 | 04/15/2017 | Nitrogen, fungicide, ... | 09/01/2017 |

MACHINE LEARNING IN AGRICULTURAL PLANTING, GROWING, AND HARVESTING CONTEXTS

CROSS-REFERENCE TO RELATED APPLICATIONS

This application claims the benefit of U.S. Provisional Application No. 62/542,705, filed Aug. 8, 2017, which is incorporated by reference in its entirety.

TECHNICAL FIELD

This specification relates generally to the application of machine learning operations to data from disparate sources to optimize agricultural production.

BACKGROUND

A grower is a farmer or other agricultural producer that plants, grows, and harvests crops, such as grain (e.g., wheat), fibers (e.g., cotton), vegetables, fruits, and so forth. Various geographic, weather-related, agronomic, and environmental factors may affect crop production. Some of these factors are within the control of the grower, whereas others are not. For example, the grower can change planting strategies or affect soil composition, but cannot control the weather. Further, the quantity of information associated with these factors that is readily available to a grower can be so large as to limit the amount of the information a grower can utilize when making planting, growing, and harvesting decisions, even when utilizing existing crop production models. Accordingly, growers are often making decisions that can affect crop production based on an incomplete set of information or an imperfect understanding and analysis of available information.

SUMMARY

In one embodiment, a system optimizes crop productivity by accessing crop growth information describing, for each of a plurality of plots of land, 1) characteristics of the plots of land, 2) a type of crop planted on the plot of land, 3) characteristics of farming operations performed for the planted crop, and 4) a corresponding crop productivity. The system normalizes the crop growth information by formatting similar portions of the crop growth information into a unified format and a unified scale and stores the normalized crop growth information in a columnar database. The system trains a crop prediction engine by applying one or more machine learning operations to the stored normalized crop growth information. The crop prediction engine maps, for a particular type of crop, a combination of one or more characteristics of the plot of land and characteristics of farming operations performed for the planted crop to an expected corresponding crop productivity. In response to receiving a request from a grower to optimize crop productivity for a first type of crop and a first portion of land on which the first crop is to be planted, the request identifying a first set of farming operations to be performed by the grower, the system accesses field information describing characteristics of the first portion of land and applies the crop prediction engine to the accessed field information and the first set of farming operations to produce a first expected crop productivity. The system applies the crop prediction engine to the accessed field information to identify a second set of farming operations that can produce a second expected crop productivity and modifies the first set of farming operations based on the second set of farming operations to produce a modified set of farming operations. Responsive to the second expected productivity being greater than the first expected productivity, the system presents, within an interface of a device associated with the grower, the modified set of farming operations. The grower performs the modified set of farming operations for the first type of crop on the first portion of land.

In another embodiment, a system executes a method for crop productivity optimization by accessing, for a first portion of land associated with a user, field information describing characteristics of the first portion of land related to crop growth from a plurality of data sources. The system applies a prediction model to the accessed field information. The prediction model is trained on crop growth information and maps, for sets of land characteristics, one or more farming operations to crop productivities by performing one or more machine learning operations. Based on an output of the prediction model, the system selects a set of farming operations that maximize crop productivity and modifies a user interface displayed by a client device of the user to display a crop growth program based on the selected set of farming operations.

Normalizing the crop growth information can include one or more of: removing format-specific content from the crop growth information, removing or modifying portions of the crop growth information associated with values that fall outside of one or more predefined ranges, and scaling image information such that each image pixel represents a same distance.

The one or more machine learning operations can include one or more of: a generalized linear model, a generalized additive model, a non-parametric regression operation, a random forest classifier, a spatial regression operation, a Bayesian regression model, a time series analysis, a Bayesian network, a Gaussian network, a decision tree learning operation, an artificial neural network, a recurrent neural network, a reinforcement learning operation, linear/non-linear regression operations, a support vector machine, a clustering operation, and a genetic algorithm operation.

The growth information can include information about one or more of corn, rice, cotton, and soybeans. In an embodiment, the growth information includes information about crop varieties, date ranges for planting crops, crop planting rate ranges, crop planting depth, soil temperatures for planting crops, atmospheric temperatures for planting crops, soil textures for planting crops, soil types for planting crops, weather conditions for planting crops, drainage conditions for planting crops, crop seedbed preparation methods, and crop planting locations. In an embodiment, the growth information includes information about one or more of: row spacing, a number of rows, a type of irrigation, a type of tillage, a type of seed treatment, a type of foliar treatment, a type of floral treatment, a type of soil treatment, a soil type, a soil pH, soil nutrient composition, previously planted crop types and varieties, effects of microbial composition or treatment, microbial composition application rate and date, effects of insecticide and insecticide application rate and date, effects of fungicide and fungicide application rate and date, and effects of fertilizer and fertilizer application rate and date. In an embodiment, the growth information includes information about one or more of: a microbial community composition, a microbial community gene expression, a microbial community protein production, a microbial community volatile organic compound production, a plant gene expression, a plant protein production, a plant volatile organic compound production, a microbial community metabolite production, and a plant metabolite production.

The growth information can be collected from a plurality of fields in a plurality of locations associated with a threshold geographic and/or environmental diversity. In an embodiment, the growth information is collected over a plurality of growing seasons, and over a plurality of times within each season.

The field information can include one or more of: information describing historical characteristics of the first portion of land and information describing current characteristics of the first portion of land. In an embodiment, accessing field information comprises collecting the field information from one or more sensors located at the first portion of land. In an embodiment, accessing field information collected from the sensors includes one or more of: soil temperature, air temperature, soil moisture, leaf temperature, leaf wetness, and spectral data over multiple wave length bands reflected from or absorbed by ground. In an embodiment, field information collected from the sensors is used to compute additional field information, including one or more of: a ratio of soil to air temperature, a ratio of leaf to air temperature, a soil wetness index, a number of cumulative growing degree days, a chlorophyll content, evapotranspiration, a daily light integral, a daily minimum temperature, a daily mean temperature, a daily maximum temperature, and a change in the normalized difference vegetation index. In an embodiment, the one or more sensors include thermometers, barometers, weather detection sensors, soil composition sensors, soil moisture sensors, hygrometers, pyranometers, pyrheliometers, spectrometers, spectrophotometers, spectrographs, spectral analyzers, refractometers, spectroradiometers, radiometers, electrical conductivity sensors, and pH sensors. In an embodiment, accessing the field information comprises collecting images of the first portion of land from one or more a satellite, an aircraft, an unmanned aerial vehicle, a land-based vehicle, and a land-based camera system.

The crop prediction engine can map combinations of field information inputs and farming operation inputs to crop productivity probability distributions based on one or more machine-learned relationships between combinations of portions of the crop growth information and corresponding crop productivities. In this embodiment, applying the crop prediction engine to the accessed field information and the first set of farming operations comprises determining, based on the one or more machine-learned relationships, the first expected crop productivity for the first type of crop planted and grown at the first portion of land using the first set of farming operations. In an embodiment, applying the crop prediction engine to the accessed field information comprises identifying, based on the one or more machine-learned relationships, the second set of farming operations that maximize the crop productivity probability distribution for the first type of crop.

The second set of operation can include one or more of: a seeding rate operation, a seeding date range operation, an operation to not plant a crop, an operation to plant a different type of crop than the first type of crop, and a fertilizer application operation. In an embodiment, the fertilizer application operation specifies an application of one or more macronutrient and/or micronutrient. In an embodiment, the second set of operations includes one or more of: a seeding depth operation, a harvest date range operation, a seed treatment operation, a foliar treatment operation, a floral treatment operation, a soil treatment operation, a reseeding operation, a microbial composition application operation, an insecticide application operation, an herbicide application operation, and a pesticide application operation.

The prediction model can be applied to the accessed field information before planting a crop within the first portion of land. In an embodiment, prediction model is applied to the accessed field information after planting a crop within the first portion of land. In an embodiment, field information is updated and accessed periodically, and wherein the prediction model is re-applied to the periodically accessed field information. In an embodiment, the crop growth program is periodically modified in response to re-applying the prediction model to the periodically accessed field information. In an embodiment, the prediction model is applied to the accessed field information prior to harvesting a crop from the first portion of land. In an embodiment, the prediction model is applied to the accessed field information after an occurrence of a triggering event. For example, the triggering event comprises one of: a weather event, a temperature event, a plant growth stage event, a water event, a pest event, a fertilizing event, and a farming machinery-related event. In an embodiment, prediction model is applied to the accessed field information in response to a request from a grower, a technology provider, a service provider, a commodity trader, a broker, an insurance provider, an agronomist, or other entity associated with the first portion of the land.

The selected set of farming operations can identify one or more of: a type or variety of crop to plant if any, an intercrop to plant, a cover crop to plant, a portion of the first portion of land on which to plant a crop, a date to plant a crop, a planting rate, a planting depth, a microbial composition, a portion of the first portion of land on which to apply a microbial composition, a date to apply a microbial composition, a rate of application for a microbial composition, an agricultural chemical to apply, a portion of the first portion of land on which to apply an agricultural chemical, a date to apply an agricultural chemical, a rate of application for an agricultural chemical, type of irrigation if any, a date to apply irrigation, and a rate of application for irrigation. In an embodiment, the selected set of farming operations identifies one or more of a type, a method of application, an application location, and an application volume of one or more of a plant growth regulator, a defoliant, and a desiccant. In an embodiment, the selected set of farming operations identifies one or more of: whether to replant the crop within the first portion of land, whether to replant a different crop within the first portion of land, and a replant date. In an embodiment, the selected set of farming operations identifies one or more of: a type of nutrient to apply, a quantity of nutrient to apply, a location to apply a nutrient, a date to apply a nutrient, a frequency to apply a nutrient, and a nutrient application method. In an embodiment, an identified nutrient comprises one or more of: N, P, K, Ca, Mg, S, B, Cl, Cu, Fe, Mn, Mo, and Zn. In an embodiment, the selected set of farming operations identifies one or more of: a quantity of water to apply, a location to apply water, a date to apply water, a frequency to apply water, and a water application method. In an embodiment, the selected set of farming operations identifies one or more of: a type of treatment to apply, a quantity of treatment to apply, a location to apply treatment, a date to apply treatment, a frequency to apply treatment, and a treatment application method. In an embodiment, an identified treatment comprises one or more of: an herbicide, a pesticide, and a fungicide. In an embodiment, the selected set of farming operations identifies one or more of: a harvest date, a harvest method, and a harvest order. In an embodiment, the selected set of farming operations identifies one or more of: a piece of equipment to use or purchase, a drainage method to implement, a crop insurance policy to purchase, one or more potential crop brokers, one or more potential crop purchasers, one or more harvested crop qualities, and one or more harvested crop purchase prices.

The accessed field information can describe one or more of: rainfall associated with the first portion of land, canopy temperature associated with the first portion of land, soil temperature of the first portion of land, soil moisture of the first portion of land, soil nutrients within the first portion of land, soil type of the first portion of land, topography within the first portion of land, humidity associated with the first portion of land, growing degree days associated with the first portion of land, microbial community associated with the first portion of land, pathogen presence associated with the first portion of land, prior farming operations performed at the first portion of land, prior crops grown at the first portion of land, and other historical field information associated with the first portion of land. In an embodiment, the accessed field information describes characteristics of a crop planted within the first portion of land, including one or more of: a plant stage of the crop, a color of the crop, a stand count of the crop, a crop height, a root length of the crop, a root architecture of the crop, an immune response of the crop, flowering of the crop, and tasseling of the crop.

The crop growth program can include a set of instructions associated with planting, growing, and harvesting one or more of corn, rice, cotton, and soybeans. In an embodiment, the crop growth program identifies a plurality of sub-portions of the first portion of land, and comprises a set of instructions associated with planting, growing, and harvesting a different crop type or crop variety within each of the plurality of sub-portions.

The accessed field information can be collected from one or more of: sensors located at the first portion of land, satellites, aircraft, unmanned aerial vehicles, land-based vehicles, and land-based camera systems.

The prediction model can map characteristics described by the field information to the selected set of farming operations. A measure of crop productivity associated with the selected set of farming operations is greater than similar measures of crop productivity associated with other sets of farming operations. In an embodiment, the system further accesses growth data associated with crop growth resulting in an implementation of the crop growth program and retrains the prediction model using one or more machine learning operations based additionally on the accessed growth data.

The first portion of land can be associated with multiple sub-portions of land, and the system applies the prediction model by identifying a cluster of the sub-portions with a threshold similarity, applying the prediction model to accessed field data with the cluster of the sub-portions of land, and selects the set of farming operations comprising farming operations that maximize crop productivity for the cluster of the sub-portions of land. In an embodiment, the identified cluster of the sub-portions of land are associated with one or more common field information characteristics.

The selected set of farming operations can be provided directly to a recipient smart equipment or sensor for execution by the recipient smart equipment and sensor. In an embodiment, the recipient smart equipment includes a harvesting system and the selected set of farming operations include a harvest route, path, plan, or order.

BRIEF DESCRIPTION OF THE DRAWINGS

FIG. 2 illustrates an example geographic database for a machine learning crop prediction system.

FIG. 3 illustrates an example agricultural database for a machine learning crop prediction system.

The figures depict various embodiments for purposes of illustration only. One skilled in the art will readily recognize from the following discussion that alternative embodiments of the structures and methods illustrated herein may be employed without departing from the principles described herein.

DETAILED DESCRIPTION

Environment Overview

Figure 1:
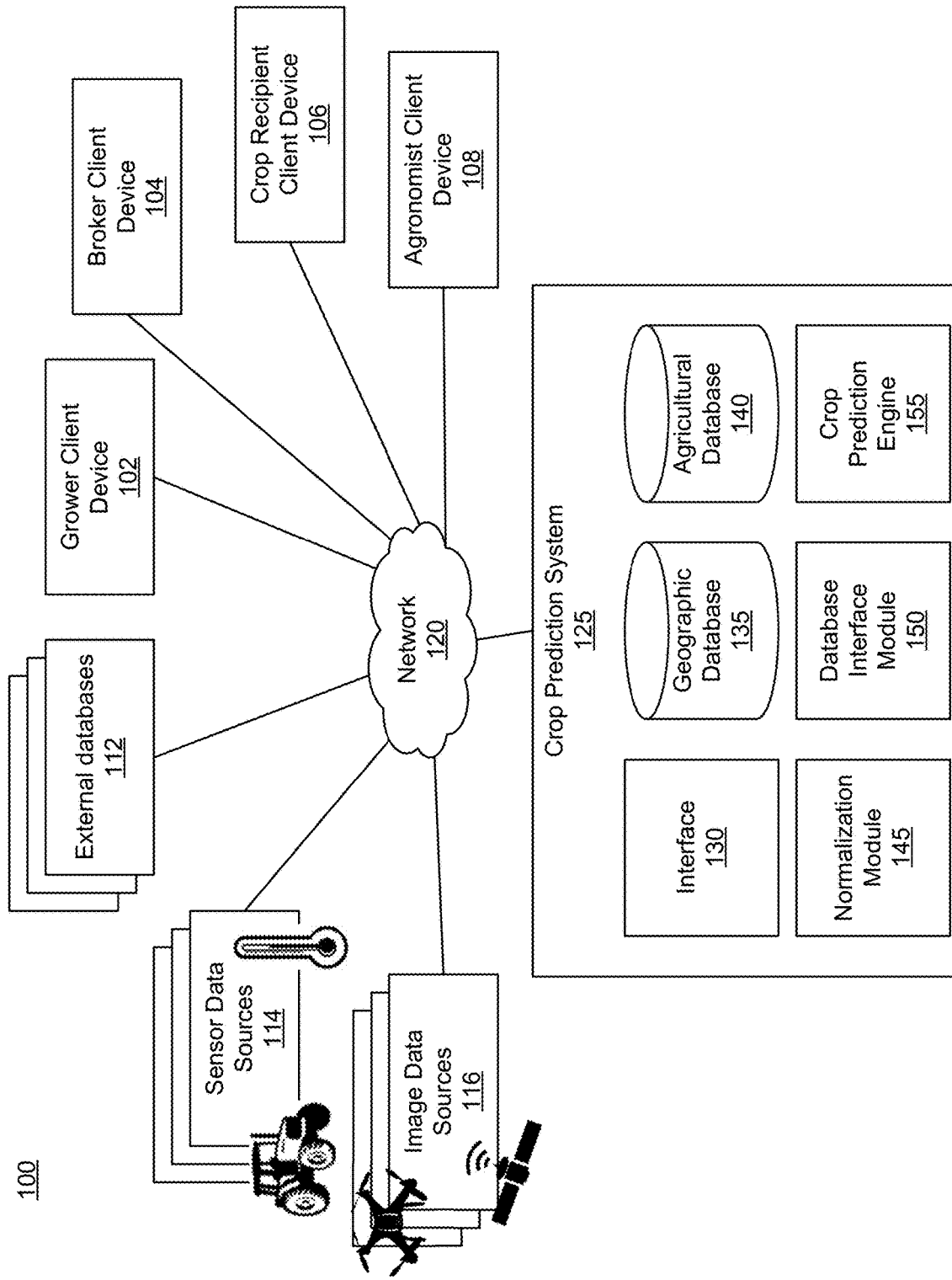
FIG. 1 is a block diagram of a system environment in which a machine learning crop prediction system operates, according to various embodiments.

FIG. 1 is a block diagram of a system environment 100 in which a machine learning crop prediction system operates. The system environment 100 shown in FIG. 1 includes a grower client device 102, a broker client device 104, a crop recipient client device 106, an agronomist client device 108, external databases 112, sensor data sources 114, image data sources 116, and the crop prediction system 125. In alternative configurations, different, additional, and/or fewer components may be included in the system environment 100. For instance, one or more of the components illustrated in FIG. 1 may be implemented within the same computing device.

The grower client devices 102, broker client devices 104, crop recipient client devices 106, and agronomist client devices 108 are computing devices capable of receiving user input, displaying information to a user, and transmitting and/or receiving data via the network 120. Hereafter, a "client device" can refer to any of the grower client device 102, broker client device 104, crop recipient client device 106, and agronomist client device 108. In one embodiment, a client device may be any device having computer functionality, such as a personal digital assistant (PDA), a mobile telephone, a smartphone, a tablet computer, a desktop or laptop computer, a server, a workstation, smart farming equipment (such as a smart tractor, sprinkler system, and the like), unmanned aerial and ground based vehicles both remotely controlled and autonomous, or another suitable device. A client device is configured to communicate with the crop prediction system 125 via the network 120, for example using a native application executed by the client device, a web browser running on the client device, or through an application programming interface (API) accessed by a native operating system of the client device, such as IOS® or ANDROID™.

The grower client device 102 communicates with the crop prediction system 125 via the network 120 to request and receive crop prediction information, such as predictions of crop production, selections of crops to plant, and farming operations that, when performed, optimize crop productivity. In one embodiment, the grower client device 102 accesses the crop prediction system 125 via an interface 130 generated by the crop prediction system 125. In some embodiments, the grower client device 102 receives user input from a grower describing geographic and agricultural data associated with one or more portions of land farmed by a user of the grower client device, for instance in conjunction with a request for crop prediction information. The geographic and agricultural data from the grower client device 102 can be used by the crop prediction system 125, for instance to train one or more crop prediction models and/or as an input to previously trained crop prediction models in order to predict crop production and identify a set of farming operations that can optimize crop production.

As used herein, a "crop prediction model" (or "machine learning prediction model", or simply "prediction model" hereinafter) refers to any model that uses one or more machine learning operations to predict a measure of crop production based on information comprising field information, or that is trained on information comprising field information using one or more machine learning operations. In application, crop prediction models produce crop prediction information, including a predicted measure of crop production and a set of farming operations that, when performed, is expected to produce the predicted measure of crop production. In practice, a crop prediction model can use or be trained by any machine learning operation, such as those described herein, or any combination of machine learning operations for predictions of crop production. As used herein, "crop prediction information" (or "crop production prediction information", "prediction crop production", or simply "prediction information" hereinafter) can refer to any measure of an expected crop production, such as crop yield, crop quality, crop value, or any other suitable measure of crop production (including those described herein), and can refer to a set of farming operations expected to result in the measure of expected crop production when performed in a specified manner, at a specified time/location, and the like. Likewise, as used herein, "field information" can include one or more of past and present crop production information, past and present geographic information, past and present agricultural information, past and present agronomic information, past and present sensor data associated with crop production, any other information related to the planting, growing, and harvesting of a crop, and any other field parameters as described herein.

As used herein, "crop quality" can refer to any aspect of a crop that adds value to a grower, broker, or crop recipient. In some embodiments, crop quality refers to a physical or chemical attribute of a crop, for instance one or more of: a genetic trait, modification, or edit (or lack thereof); an epigenetic signature or lack thereof; a crop content (e.g., moisture, protein, carbohydrate, ash, fiber, fat, oil); a crop color, whiteness, weight, transparency, hardness, percent chalky grains, proportion of corneous endosperm, presence of foreign matter, absorption of water, milling degree, kernel size distribution or volume, average grain length or breadth, density, or length/breadth ratio; a number or percentage of broken kernels or kernels with stress cracks; a falling number; a farinograph; a number or percentage of immature grains; a measure of wet gluten; a sodium dodecyl sulfate sedimentation; toxin levels (for example, mycotoxin levels, including vomitoxin, fumonisin, ochratoxin, or aflatoxin levels); damage levels (for example, mold, insect, heat, cold, frost or other material damage); and the like. In some embodiments, crop quality refers to an attribute of a production method or environment, for instance one or more of: a soil type, chemistry, or structure; a climate type, weather type, or magnitude or frequency of weather events; a soil or air temperature or moisture; a number of degree days; a rain quantity; an irrigation type or lack thereof; a tillage frequency; a cover crop (past and present); a crop rotation; whether the crop is organic, shade grown, greenhouse grown, fair-wage grown, no-till, pollution-free, or carbon neutral; levels and types of fertilizer, chemical, herbicide, or pesticide use or lack thereof; a geography of production (for example, country of origin, American Viticultural Area, mountain grown); and the like.

In some embodiments, crop quality is affected by, or may be inferred from, the timing of one or more production practice. For example, the food grade quality may be inferred from the variety of plant, damage levels, and one or more production practices used to grow the plant. In another example, one or more qualities may be inferred from the maturity or growth stage of a crop. In some embodiments, quality is an attribute of a method of storing a harvested crop (e.g., the type of storage: bin, bag, pile, in-field, box, tank, other containerization), the environmental conditions (e.g. temperature, light, moisture/relative humidity, presence of pests, CO2 levels) to which the good encountered during storage, method of preserving the good (e.g. freezing, drying, chemically treating), or a function of the length of time of storage. In some embodiments, quality is a calculated, derived, inferred, or subjective classification based on one or more measured or observed physical or chemical attributes of a crop, or a farming operation used in its production. In some embodiments, a quality metric is a grading or certification by an organization or agency, for example grading by the USDA, organic certification, or non-GMO certification. In some embodiments, a quality metric is inferred from one or more measurements made of crops during the growing season, for example wheat grain protein content may be inferred from measurement of crop canopies using hyperspectral sensors and or NIR or visible spectroscopy of whole wheat grains. In some embodiments, one or more quality metric is collected, measured or observed during harvest, for example dry matter content of corn may be measured using near-infrared spectroscopy on a combine.

The broker client device 104 communicates with the crop prediction system 125 via the network 120 to receive information about crop production for one or more portions of land, and to send requests for harvested crops (for instance, to the grower client device 102). In this example, the user of the broker client device 104 is in communication with a grower and enters into an agreement to obtain from the grower some or all of a harvested crop. Thus, the user of the broker client device may be a crop recipient. In one embodiment, the broker client device 104 accesses the crop prediction system 125 via an interface 130 generated by the crop prediction system 125 that allows the user of the broker client device 104 to identify predicted crop production information from one or more growers, to identify sets of farming operations to suggest or provide to the one or more growers in order to optimize crop production, to identify one or more prospective crop recipients in addition to the crop broker, and to automate the generation of crop acquisition agreements with the one or more prospective crop recipients. A crop recipient may receive a harvested crop from a grower or from a crop broker.

The crop recipient client device 106 communicates with the crop prediction system 125 via the network 120 to receive information about predicted crop production of one or more growers. For instance, a user of the crop recipient client device 106 can identify expected crop productions of one or more growers, including a type of crop produced by a grower, an expected quantity of the crop produced by a grower, and a comparison of alternative crop types and total crop quantities across a set of growers (such as all growers in a geographic region). A user of the crop recipient client device 106 can use this information to enter into crop acquisition agreements with one or more growers or one or more brokers (via one or more broker client devices 104).

The agronomist client device 108 communicates with the crop prediction system 125 via the network 120 to access crop prediction information generated by the crop prediction system. In one embodiment, a user of the agronomist client device 108 (such as an agricultural specialist, an individual scouting or observing a planted crop, etc.) can review the crop prediction information, including a set of farming operations identified by the crop prediction system 125 to optimize a predicted crop production, and can modify the identified set of farming operations. For example, a user of the agronomist client device 108 may access prediction information and a corresponding set of farming operations identified by the crop prediction system 125 that includes the application of a particular type of fertilizer and a harvest date. The user of the agronomist client device 108 can change the type of fertilizer to be applied, for instance based on the type of fertilizer being unavailable to a particular grower, and can change the harvest date, for instance by moving the harvest date up based on expected inclement weather. In other words, a user of the agronomist client device 108 can modify farming operations identified by the crop prediction system 125 as optimal based on information available to the user but not available to the crop prediction system 125 at the time the predictions were made. Likewise, an agronomist can modify field information on which the crop prediction system 125 is applied (such as a field location, a crop type, an expected rainfall, and the like), and can request that the crop prediction information generated by the crop prediction system be re-generated in order to observe the effect of the modified field information on the crop prediction information. It should be noted that in some embodiments, the agronomist client device 108 and the broker client device 104 can be the same device, and the broker and agronomist can be the same entity.

The external databases 112 are one or more sources of data describing past or present actions, events, and characteristics associated with crop production that can be used by machine learning processes of the crop prediction system 125 to train crop prediction models, to apply crop prediction models to predict future crop production, and to identify farming operations that optimize future crop production. Each external database 112 may be connected to, or accessible over, one or more wireless computer networks, such as a WiFi, an LTE network, an ad hoc network (e.g., a mesh network), personal area networks (e.g., Bluetooth, near field communication, etc.), and the like. External databases 112 may include one or more Web-based servers which may provide access to stored and/or real time information. In some embodiments, the crop prediction system 125 accesses information from the external databases 112 directly, while in other embodiments, the information is manually entered (for instance, by a grower, an agronomist, or an entity associated with the crop prediction system (for instance, via a GUI generated by the interface module 130 and displayed via the grower client device 102, the agronomist client device 108, or the like). Examples of external databases 112 can include:

Databases including inputs from growers or grower client devices 102 describing crops planted (including crop variety, hybrid crop types, and chemical/microbial coatings of crop seed), actions taken during past years or seasons, planting dates, planting depths, row spacing, planting speed, seed application rate (including minimum, average, and maximum rates), locations and identification of portions of land on which the crops were planted (e.g., management zones), and actions taken before, during, and after planting;

Publications or publication databases describing farming operations, applications, and corresponding effects on crop production;

Inputs from growers describing treatments and applications to land, including fertilizers, herbicides, pesticides, fungicides, nematicides, lime, and watering types and quantities;

Inputs from growers describing actions taken with regards to land, including tilling, irrigation, and topological modifications;

Crop production databases describing historic crop planting, growth, and harvesting;

Weather databases describing historic weather patterns, including rainfall, temperature, sunlight, humidity, flooding, and/or other weather information;

Geographic database describing characteristics and boundaries of portions of land, including one or more of: soil type, soil composition, soil nutrients, microbial community sampling, water availability, geographic features (including elevations, slopes, and aspects), landmarks, geographic property boundaries, field boundaries, and/or land ownership;

Geographic database describing outbreaks of crop diseases, pests, weeds, fungi, and nematodes;

Seed databases describing seed availability, seed variant (for example, seed variety), seed requirements, genetic information, and/or corresponding crop production information;

Cost databases describing seed prices, commodity prices, prices of products or treatments, machinery and repair costs, labor costs, fuel and electricity costs, land costs, insurance costs, storage costs, and transportation costs;

Agricultural databases maintained by local, state, or national governments, academic institutions, non-profit organizations, and/or farming collectives; and Interpolations for locations or regions in which historic data is not available based on nearby locations, county level data, and similar plots of land.

The sensor data sources 114 are one or more sources of data taken from sensors describing past or current measurements associated with crop production that can be used by machine learning processes of the crop prediction system 125 to train crop prediction models, to apply crop prediction models to predict future crop production, and to identify farming operations that optimize future crop production. In some embodiments, sensor data sources are one or more sources of data taken from sensors describing past or current measurements associated with crop growth, the environment and/or portions of land. In one embodiment, each sensor data source 114 may be connected to, or accessible over, one or more wireless computer networks, such as a WiFi, an LTE network, an ad hoc network (e.g., a mesh network), personal area networks (e.g., Bluetooth, near field communication, etc.), and the like. In such embodiments, the crop prediction system 125 may directly couple with one or more sensor data sources 114 and can receive sensor data without human intervention. For instance, a smart tractor can collect information such as temperature and sunlight information while operating within a field, and can communicatively couple with the crop prediction system 125 (for instance, via an LTE network) to provide the collected temperature and sunlight information in association with information identifying the field. In other embodiments, data from sensor data sources 114 may be manually entered (e.g., by growers or agronomists) within a data entry GUI generated by the interface module 130 and presented by a client device.

Sensor data from sensor data sources 114 may be taken at one or more times during a growing season or across multiple growing seasons, at manual or automated triggers (e.g., a threshold time since a previous measurement; a request by a grower to receive a measurement). Sensor data sources 114 may be deployed across diverse locations (e.g., spatially along the surface of a field, at different depths or elevations relative to the ground) and at different times during the growing season. Sensor data sources 114 may additionally be located at fixed points (e.g., a sensor placed at a designated point on a field) or may be coupled to moving objects (e.g., an autonomous, manned, or remotely controlled land or aerial vehicle). In addition to sensor measurements, sensor health data (such as available power, component malfunction or degradation, diminished communication strength, etc.) and other sensor metadata (such as GPS location data) can be collected for use in verifying the quality of measurement data collected by the sensors and determining the health of the sensors themselves. Examples of sensor data sources 114 can include:

- Thermometers for measuring soil temperature data, atmospheric temperature data, and/or leaf temperature data;
- Barometers for measuring atmospheric pressure;
- Weather sensors for detecting one or more of: precipitation, wind direction, wind speed, and the like;
- Soil composition sensors for measuring components of soil including: soil minerals, soil texture (as determined by the percentages of sand—particles between 0.05-2.00 mm in diameter, silt—particles between 0.002-0.05 mm in diameter, and clay—particles less than 0.002 mm in diameter, in the soil), soil particle size, organic matter, water, and gases (including oxygen, carbon dioxide, nitrogen);
- Moisture sensors, for measuring soil moisture data and leaf wetness data;
- Hygrometers for measuring for measuring the humidity or the amount of water vapor in the atmosphere, the soil or other medium;
- Pyranometers, net radiometers, quantum sensors, and pyrheliometers for measuring solar radiation;
- Cameras for measuring incoming light and recording reflectance as an electric signals which may be stored as a digital file;
- Spectrometers, spectrophotometers, spectrographs, and spectral analyzers for measuring properties of light, including reflectance or transmission, over one or more portions of the electromagnetic spectrum;
- Refractometers for measuring refractive light passing through a sample, for example to measure total dissolved solids in a sample (e.g. sugar content of an aqueous solution) such as a plant sap;
- Spectroradiometers and radiometers for measuring spectral radiance or irradiance across various spectral ranges;
- Electrical conductivity sensors for measuring the ability of a material (for example soil) to conduct electricity, from which one or more properties can be inferred or computed, including a water holding capacity, a cation exchange capacity, a depth to claypan or rock outcropping (depth of topsoil), a salinity, and a temperature;
- Penetrometers for measuring soil compaction; and
- pH sensors for measuring acidity or alkalinity of an aqueous solution, from which, one or more properties can be inferred or computed, including a soil nutrient availability and a leaching.

The image data sources 116 are one or more sources of image data that can be used by machine learning operation of the crop prediction system 125 to train crop prediction models, to apply crop prediction models to predict future crop production, and to identify farming operations that optimize future crop production. In one embodiment, each image data source 116 may be connected to, or accessible over, one or more wireless computer networks, such as a WiFi, an LTE network, an ad hoc network (e.g., a mesh network), personal area networks (e.g., Bluetooth, near field communication, etc.), and the like. In such embodiments, the crop prediction system 125 may directly couple with one or more image data sources 116 and can receive image data without human intervention. For instance, a drone can collect images during operation and can communicatively couple with the crop prediction system 125 (for instance, via an LTE network) to provide the collected images in association with information identifying the field. As used herein, "image data source" can refer individually to the instrument capturing the image (such as the camera, radiometer, and the like) and collectively to the instrument capturing the image and any infrastructure (such as a vehicle, stand, machinery, and the like) to which the instrument is coupled. As used herein, "image data" can refer to viewable image files (for instance, in the .JPG or .PNG format), to reflectance and absorbance data at one or more spectral bands including a continuous range of spectra (e.g. hyperspectral images), to light data in both the visible (e.g. light between about 375 nm and 725 nm in wavelength) and non-visible spectrum (e.g. light within the infrared "IR" or ultraviolet "UV" spectrums) and combinations of visible and non-visible spectrum, or to any representation of light signals. In various embodiments, image data sources 116 can include:

- Satellites;
- Aircraft;
- Unmanned aerial vehicles including drones;
- Manned land-based vehicles, having various means of locomotion including wheels, tracks, legs, and the like;
- Unmanned land-based vehicles, automated or remote controlled, having various means of locomotion including wheels, tracks, legs, and the like; and Land-based camera system, handheld or stationary, manned or automated, including a camera, radiometer, spectrophotometer, and the like.

The crop prediction system 125 receives data from the external databases 112, sensor data sources 114, and image data sources 116, and performs machine learning operations on the received data to produce one or more crop prediction models. The data from these data sources can be combined, and a standard feature set can be extracted from the combined data, enabling crop prediction models to be generated across different temporal systems, different spatial coordinate systems, and measurement systems. For example, sensor data streams can be a time series of scalar values linked to a specific latitude/longitude coordinate. Likewise, LiDAR data can be an array of scalar elevation values on a 10 m rectangular coordinate system, and satellite imagery can be spatial aggregates of bands of wavelengths within specific geographic boundaries. After aggregating and standardizing data from these data streams (for instance to a universal coordinate system, such as a Military Grid Reference System), feature sets can be extracted and combined (such as a soil wetness index from raw elevation data, or cumulative growing degree days from crop types and planting dates).

One or more machine learning operations can be performed on the calculated feature sets to produce the one or more crop prediction models. The crop prediction models can then be applied to data describing a portion of land in order to predict a crop production for the portion of land. The crop prediction system 125 is configured to communicate with the network 120 and may be accessed by client devices via the network such as grower client devices 102, broker devices 104, crop recipient client devices 106, and agronomist devices 108. The crop prediction system shown in FIG. 1 includes an interface 130, a geographic database 135, an agricultural database 140, a normalization module 145, a database interface module 150, and the crop prediction engine 155. In other embodiments, the crop prediction system 125 may contain additional, fewer, or different components for various applications. Conventional components such as network interfaces, security components, load balancers, failover servers, management and network operations consoles, and the like are not shown so as to not obscure the details of the system architecture.

The interface 130 coordinates communications for the crop prediction system 125 within the environment 100, communicatively coupling to, transmitting data to, and receiving data from the other components of FIG. 1 as needed. In some embodiments, the interface 130 generates a user interface for display by one or more of the grower client device 102, the broker client device 104, the crop recipient client device 106, and the agronomist client device 108, or by a display or monitor associated with the crop prediction system 125 or another entity within the environment 100. The user interface allows users to interact with the crop prediction system 125 in a variety of ways. In one embodiment, the communicative capabilities of the interface 130 are customized based on permissions associated with different kinds of users. For example, the interface 130 can allow a grower client device 102 to request crop production prediction information and a set of farming operations that optimize crop production for a plot of land owned by a user of the grower client device 102, while prohibiting users that don't own the plot of land from accessing such information via other grower client devices 102. In another example, the interface 130 can allow an agronomist client device 108 to access sets of farming operations being performed by various growers and sets of data from the geographic database 135 and the agricultural database 140 while preventing a crop recipient client device 106 from accessing such data. In other embodiments, the interface 130 can generate a map interface of a portion of land, and can display icons or other information identifying a location of sensors, farming equipment, and/or laborers within the map interface (for instance based on location information received from each entity).

The geographic database 135 stores and maintains data describing geographic characteristics of portions of land (such as fields, plots, sub-portions of the same, and the like) that may impact crop production. As used herein, a "portion of land" refers to any amount of land in any shape or size. For instance, a "portion of land" can refer to a grower's entire property, a field, a plot of land, a planting region, a zone or management zone, and the like. Likewise, a portion of land can include one or more "sub-portions" of land, which refers to a subset of the portion of land of any shape or size. Various types and formats of data may be stored in the geographic database 135 for access by the other components of the crop prediction system 125, on which to perform one or more machine learning operations in order to train a crop prediction model, to predict a crop production for a portion of land, and to identify a set of farming operations that optimize crop production. The geographic database 135 can be organized in any suitable format. For example, data, including geo-referenced data, may be stored as flat files, columnar storage, binary format, etc. which may be accessed via relational databases, columnar databases, NoSQL stores, horizontally scaled databases, etc. The geographic database 135 is further discussed in conjunction with FIG. 2.

FIG. 2 illustrates an example geographic database 135 for a machine learning crop prediction system. In the example database of FIG. 2, information describing geographic characteristics that may impact crop production are associated with a plot index that uniquely identifies a particular field or plot of land associated with the characteristics. As shown in FIG. 2, the geographic database 135 associates each uniquely identified plot with one or more sets of associated data ("County," "Avg. Rainfall," and "Avg. Temp"). Although the example database of FIG. 2 organizes geographic information by plot of land, in other embodiments, the geographic database 135 can be organized in other ways, for instance by land category (field, mountain, city, etc.), by land owner, or by any other suitable characteristic. Further, although the example database of FIG. 2 only includes three characteristics mapped to each land plot, in practice, the geographic database 135 can include any number of characteristics, for instance 50 or more. Examples of geographic information stored by the geographic database 135 can include:

Past, present, and predicted future weather events, patterns, or phenomena, including precipitation and rainfall, temperature, sunlight, humidity, growing days, and the like;

Past, present, and predicted future soil composition or characteristics for a field or fields, including soil pH, soil sulfur level, or other abiotic or biotic features of the soil;

Past, present, and predicted future microbial community composition in or on the soil from a field or fields, wherein the microbial community composition of the soil includes one or more bacteria or fungi (living or dead) or a product of one or more bacteria or fungi (such as a metabolite, a protein, RNA or DNA, and the like);

Past and present boundaries (manmade or natural) associated with a field or fields;

Past, present, and predicted future phenomena associated with a field or fields, including flooding, landslides, and the like;

Past and present reflectance and absorption data from satellites, including normalized difference vegetation index (NDVI) and other wavelength bands and ratios thereof;

Past, present, and predicted future macroeconomic factors, including the presence of droughts or famines affecting a field or fields; and Past, present, and predicted future factors used to determine geographic and/or environmental diversity between one or more fields, including topology, soil type, soil nutritional composition, soil pH, soil and atmospheric temperature, number of growing days, precipitation, direct and indirect sunlight, and the like.

The agricultural database 140 stores and maintains data describing agricultural characteristics associated with the planting, growing, and harvesting of a crop that may impact crop production. Various types and formats of data may be stored in the agricultural database 140 for access by the other components of the crop prediction system 125, on which to perform one or more machine learning operations in order to train a crop prediction model, to predict a crop production for a portion of land, and to identify a set of farming operations that optimize crop production. The agricultural database 140 can be organized in any suitable format, such as a columnar relational database. In one embodiment, the agricultural database 140 includes metadata that describes, for example, a product associated with a farming operation (e.g., a brand of fertilizer; a crop variant). In cases where metadata is unavailable, the crop prediction system 125 can infer the missing metadata based on other available metadata, including time, location, events that occurred prior to/with/after an operation, input or measured value having missing metadata, an identity of a corresponding grower, an identity of a corresponding farm, row spacing, a type of machine, and the like. In one example, a crop prediction model is trained on other samples for which the metadata is available and applied to samples with missing metadata, for instance using a random forest classifier, a k-nearest neighbor classifier, an AdaBoost classifier, or a Naïve Bayes classifier. The agricultural database 140 is further discussed in conjunction with FIG. 3.

FIG. 3 illustrates an example agricultural database 140 for a machine learning crop prediction system. In the example database of FIG. 3, information describing agricultural factors that may impact crop production are associated with a plot index that uniquely identifies a particular field or plot of land and a crop variety. As shown in FIG. 3, the agricultural database 140 identifies one or more sets of data ("Plant Date," "Field Treatments," and "Harvest Date") associated with a plot index and crop variant. For example, a plot index "A395" associated with a field and a crop variant "SOY_005" is associated with a planting date "Apr. 29, 2017," field treatments including "pesticide, [and] nitrogen," and a harvest date "Aug. 25, 2017." Although the example database of FIG. 3 organizes geographic information by plot of land, in other embodiments, the agricultural database 140 can be organized in other ways, for instance by land category (field, mountain, city, elevation, slope, soil texture or composition, etc.), by crop variant or category, by land owner, or by any other suitable characteristic. Further, although the example database of FIG. 3 only includes four characteristics mapped to each land plot, in practice, the agricultural database 140 can include any number of characteristics, for instance 50 or more. Likewise, it should be appreciated that reference is made in FIG. 3 to generic field treatments (e.g., "pesticide", "nitrogen", etc.) for the purposes of simplifying the illustrated of an example agricultural database, and that in practice, an agricultural database can include specific details of applied crop treatments (such as the specific treatment applied, the method of application, the application rate, date and location, etc.) Examples of agricultural information stored by the agricultural database 140 can include:

Past, present, and predicted future crop type or plant variant planted and data describing its growth and development, including color of leaves, stand count, plant height, stalk diameter, root length, root architecture (such as a number of secondary roots, root branching, and a number of root hairs), root mass, immune response, tasseling, plant stage, insect damage, weed pressure, fungal infection damage, nematode damage, sap sucrose, and the like;

Past, present, and predicted future microbial community composition and/or microbial treatment in or on one or more tissues of an identified crop variant;

Past, present, and predicted future plant gene expression in or on one or more tissues of an identified crop variant;

Past, present, and predicted future microbial or plant hormone or metabolite production in or on one or more tissues of an identified crop variant;

One or more planting or harvest dates for an identified crop variant;

Interactions with or requirements of field treatments or field characteristics and other farming operations for an identified crop variant, the field treatments including irrigation, tillage, seed treatment, foliar treatment, floral treatment, soil treatment, soil type, soil pH, soil nutrient composition, previously planted crop types and varieties, microbial composition, microbial composition application rate, insecticide application, fungicide application, pesticide application, herbicide application, fertilizer application, and the like;

The dates and methods of application of the field treatments, including insecticide type, application method, application date, and application rate; fungicide type, application method, application date, and application rate; pesticide type, application method, application date, and application rate; herbicide type, application method, application date, and application rate; fertilizer type, application method, application date, and application rate; and the like;

Seeding operations for an identified crop variant, including a date range for planting, a soil type for planting, a soil temperature for planting, a soil texture for planting, row spacing for planting, a number of rows for planting, a location for planting, a planting depth and rate, atmospheric conditions for planting, weather conditions for planting, drainage conditions for planting, seedbed preparation operations, and the like.

Information associated with or specific to corn, soybean, rice, and cotton crops;

Rice ratooning information;

Data calculated based on other agricultural information, including the ratio of soil to air temperature, the ratio of leaf to air temperature, a soil wetness index, cumulative growing degree days, chilling hours, a chlorophyll content, evapotranspiration, a daily light integral, photosynthetically active radiation, a daily minimum temperature, a daily mean temperature, a daily maximum temperature, a normalized difference vegetation index, modified soil-adjusted vegetation index, data calculated using other information in the database, and the like.

The normalization module 145 receives data in a variety of formats from the external databases 112, sensor data sources 114, image data sources 116, or other data sources and normalizes the data for storage in the geographic database 135 and the agricultural database 140 and use by the crop prediction engine 155. Due to the large number and disparate nature of prospective external data sources, data received by the normalization module 150 may be represented in a variety of different formats. For example, images received from a satellite and from a drone may be in different image file formats, at different resolutions, and at different scales (e.g., a pixel in each image may represent a different geographic distance). Likewise, rainfall measurement data received from a rain sensor at a field may include a first unit (such as inches) while rainfall estimate data from a weather monitoring entity may include a second unit (such as centimeters).

For a particular type of data, the normalization module 145 selects a common format, normalizes received data of the particular type into the common format, and stores the normalized data within the geographic database 135 and the agricultural database 140. In addition, the normalization module 145 can "clean" various types of data, for instance by upscaling/downscaling image data, by removing outliers from quantitative or measurement data, and interpolating sparsely populated portions of datasets. Based on the data format and corresponding method of normalization, the normalization module 145 can apply one or more normalization operations including but not limited to: standardizing the crop growth information to a common spatial grid and common units of measure; interpolating data using operations that include Thiessen polygons, kriging, isohyetal, and inverse distance weighting; detecting and correcting inconsistent data such as erroneously abrupt changes in a time-series of measurements that are physically implausible; associating geographic locations with pixels in an image; identifying missing values that are encoded in different ways by different data sources; imputing missing values by estimating them using values of nearest neighbors and/or using multiple imputation; and the like.

In one embodiment, the normalization module 145 generates, maintains, and/or normalizes metadata corresponding to data received from external data sources. Such metadata can include the source of the corresponding data, the date the corresponding data was received, the original format of the corresponding data, whether the corresponding data has been modified by a user of the crop prediction system 125, whether the corresponding data is considered reliable, the type of processing or normalization performed on the corresponding data, and other characteristics associated with the normalized data.

The database interface module 150 provides an interface between the components of the crop prediction system 125 and the geographic database 135 and agricultural database 140. For instance, the database interface module 150 receives normalized data from the normalization module 145 and stores the normalized data in the geographic database 135 and the agricultural database 140. The database interface module 150 may additionally modify, delete, sort, or perform other operations to maintain the geographic database 135 and the agricultural database 140. For instance, the normalization module 145 can receive and normalize an updated set of historic temperature data, and the database interface module 150 can replace the previous historic temperature data stored within the geographic database 135 with the updated normalized temperature data. Likewise, the database interface module 150 can generate a view table of data, such as historic corn harvesting data within the state of Illinois between 1988 and 1996 in response to a request received from a user of a client device 108 via the interface 130. The database interface module 150 additionally accesses the geographic database 135 and the agricultural database 140 to retrieve data for use by the crop prediction engine 155.

For example, when training a crop prediction model, the crop prediction engine 155 can request cotton fertilization information for plots of land with a low soil acidity via the database interface module 150. The database interface module 150 can query the "soil acidity" column within the geographic database 135 to identify plots of land associated with a below threshold soil acidity, and can query the agricultural database 140 to obtain fertilization information (such as type of fertilizers applied, quantity of fertilization applied, data of application, and resulting crop production) associated with the identified plots of land. The crop prediction engine can then provide the retrieved fertilization information to the crop prediction engine 155, which in turn can apply, for instance, a neural network to the fertilization information to generate a crop prediction model mapping low soil acidity and fertilization operations to crop production.

Likewise, if the crop prediction system 125 receives a request for a crop production prediction from a grower client device 102 for a particular field, the crop prediction engine 155 can request information associated with the particular field via the database interface module 150, which in turn can retrieve it from the geographic database 135 (e.g., geographic information associated with the particular field, geographic information associated with other fields within a threshold similarity to the requested field, etc.) and from the agricultural database 140 (e.g., agricultural information describing crop variants previously grown in the particular field and similar fields, farming operations performed on the previously grown crop variants, and corresponding crop production information). The database interface module 150 can then provide the requested and retrieved data to the crop prediction engine 155 for use in applying the crop prediction models to generate crop production predictions.

The crop prediction engine 155 trains and applies crop prediction models by performing one or more machine learning operations to determine predictions for crop production and corresponding sets of farming operations that result in the predicted crop production. The crop prediction engine 155 can request data from the various external data sources described herein for storage within the geographic database 135 and the agricultural database 140, and can perform the machine learning operations on the stored data. For example, the crop prediction engine 155 can apply a Bayesian network to information describing plots of land within 500 meters of a body of water and corresponding rice production in order to train a crop prediction model that maps proximity to water to rice production. The crop prediction engine 155 can also receive requests, for instance from a grower client device 102 or a broker device 104, to predict a crop production for a particular plot of land, a particular crop, and a particular set of farming operations. In addition to predicting the requested crop production, the crop prediction engine 155 can also identify a modified set of farming operations or an alternative crop that will optimize crop production. Likewise, a grower can simply identify a portion of land and request a set of farming operations to perform (including an identification of a type or variety of crop to plant) to optimize crop production, and the crop prediction engine 155 can apply one or more trained crop prediction models to information associated with the identified portion of land to identify the set of farming operations that optimizes crop production. The crop prediction engine 155 is described further in conjunction with FIG. 5.

The crop prediction system 125 and other devices shown in FIG. 1 are configured to communicate via the network 120, which may include any combination of local area and/or wide area networks, using both wired and/or wireless communication systems. In one embodiment, the network 120 uses standard communications technologies and/or protocols. For example, the network 120 includes communication links using technologies such as Ethernet, 802.11, worldwide interoperability for microwave access (WiMAX), 3G, 4G, code division multiple access (CDMA), digital subscriber line (DSL), etc. Examples of networking protocols used for communicating via the network 120 include multiprotocol label switching (MPLS), transmission control protocol/Internet protocol (TCP/IP), hypertext transport protocol (HTTP), simple mail transfer protocol (SMTP), and file transfer protocol (FTP). Data exchanged over the network 120 may be represented using any suitable format, such as hypertext markup language (HTML) or extensible markup language (XML). In some embodiments, all or some of the communication links of the network 120 may be encrypted using any suitable technique or techniques.

By generating crop production predictions and identifying farming operations to perform for particular portions of land, the crop prediction system 125 allows growers to quickly access information to optimize crop production. Crop production may be optimized for a current season or over a time period of multiple seasons. As used here, "crop production" can refer to any measure associated with the planting, growing, and/or harvesting of crops, including but not limited to crop yield for a current year or for multiple seasons, current or future profit, expected planting/growing/harvesting costs, soil health over one or more season, carbon sequestration, production at a particular date or within a range of dates (e.g., early or late maturing), composition profiles of crops (e.g., percent moisture, oil, protein, carbohydrate, or with a particular fatty acid profile, amino acid profile, or sugar content), and the like.

Up to hundreds or more agronomic, environmental, economic, and geographic factors may affect crop production, and the quantity and impact of information associated with these factors may be difficult or impossible for a grower to accurately and efficiently internalize and apply. The crop prediction system 125 can comprehensively account for this large quantity of crop production information, and can perform one or more machine learning operations identify a set farming operations and decisions for growers without requiring growers to spend the time manually accounting for this crop production information. The result is that the grower is able to efficiently harness the power of complex machine learning processes to identify farming operations that, when performed, can increase or optimize the grower's crop yield, overhead, and profitability. Further, as described below, the crop prediction system 125 can enable a grower to receive updated farming operations throughout the course of a planting season as crop conditions (e.g., weather, price of fertilizer, etc.) change, thereby allowing the grower to harness machine learning processes to account for unpredictable phenomena and conditions, and to further optimize crop production as a season progresses.

Machine Learning in Crop Prediction

Figure 4:
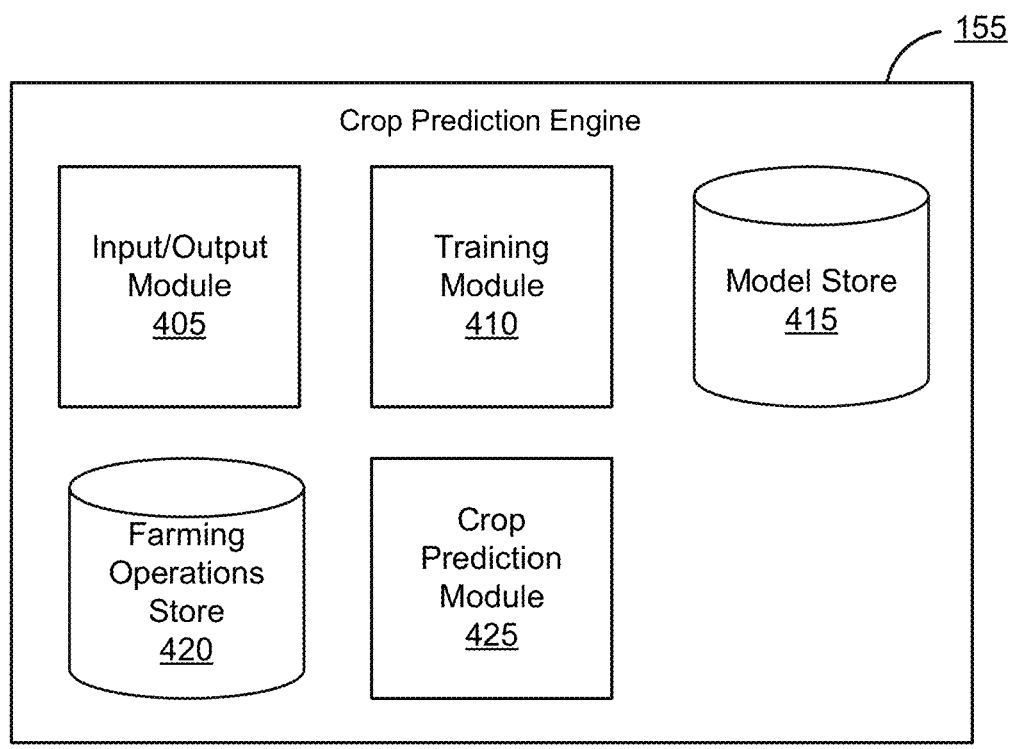
FIG. 4 is a block diagram of a machine learning crop prediction engine, according to various embodiments.

FIG. 4 is a block diagram of a machine learning crop prediction engine 155. The crop prediction engine 155 performs one or more machine learning operations to data from the data sources 112, 114, and 116 of FIG. 1 to train prediction models associated with crop production. The crop prediction models, which when applied can perform one or more machine learning operations, can generate prediction information for crop production, and can identify a set of farming operations that, if performed, optimize crop production. The crop prediction engine 155 includes an input/output module 405, a training module 410, a model store 415, a farming operations store 420, and a crop prediction module 425. In other embodiments, the crop prediction engine 155 may contain more, fewer, or different components than those shown in FIG. 4.

The input/output module 405 accesses information for use in training and applying crop prediction models. For instance, the input/output module 405 receives a request from a grower client device 102 requesting crop production prediction information and including information describing a field. In another instance, the input/output module 405 accesses the geographic database 135 and the agricultural database 140 to retrieve data for use by the training module 410 to train prediction models. The input/output module 405 can coordinate the transfer of information between modules of the crop prediction engine 155, and can output information generated by the crop prediction engine, for instance, crop production prediction information and/or a set of farming operations that optimize crop production.

The training module 410 trains crop prediction models by performing machine learning operations on training data accessed by the crop prediction system 125, for instance from the geographic database 135 and the agricultural database 140. For instance, the crop prediction models are generated based on geographic information describing various plots of land, agricultural data describing types and varieties of crops planted on the plots of land and farming operations performed on the planted crops, and harvest information describing the resulting harvest for the planted crops. As described above in conjunction with FIGS. 2 and 3, the geographic database 135 and the agricultural database 140 include information describing past, present, and predicted future conditions that impact crop production on various fields. The training module 410 generates a training set of data corresponding to a given crop variant or a given set of field parameters. The training module 410 can then perform one or more machine learning operations to identify patterns or relationships within the training set of data based on feature values within the training set of data deemed potentially relevant to crop production associated with the field parameters or crop variant.

The training module 410 can perform various types of machine learning operations to train crop prediction models using all or part of accessed training data or feature values of the training data as inputs to the machine learning operations. Various machine learning operations may be performed in different contexts to train the crop prediction models, and the crop prediction models can perform various machine learning operations when applied, including but not limited to: a generalized linear model, a generalized additive model, non-parametric regression, random forest, spatial regression, a Bayesian regression model, a time series analysis, a Bayesian network, a Gaussian network, decision tree learning, artificial neural networks, recurrent neural network, reinforcement learning, linear/non-linear regression, support vector machines, clustering operations, genetic algorithm operations, and any combination or order thereof. In one example, time series analysis operations performed by the training module 410 can include vector autoregression, ARIMA, and time-series decomposition.

The machine learning operations, when performed on input parameters describing a field or a crop variant, generate a crop prediction model for the field or crop variant associated with the input parameters. Crop prediction models can be generated upon receiving a request from a grower client device 102 for a crop production prediction, or can be generated in advance of receiving such a request. The training module 410 stores generated crop prediction models in the model store 415 for subsequent access and application, for instance by the crop prediction module 425.

The training module 410 may periodically update crop prediction models in response to a triggering condition. For example, the training module 410 can update a crop prediction model after a set amount of time has passed since the model was last updated, after a threshold amount of additional training data is received corresponding to the field and crop variant associated with the model (e.g., new data is received for fields with a threshold similarity to the field; new data is received for the crop variant; new data is received from the corresponding grower client device 102 about applied farming operations), or after a threshold amount of field information is obtained for an already-planted crop (e.g., a current crop growth rate, a pest infestation rate, etc.). In another example, the training module 410 can update a crop prediction model responsive to a market event (e.g., a midseason weather event that affects the availability of a crop supply, a greater-than-threshold increase or decrease in crop price, etc.).

In some embodiments, the training module 410 can update a crop prediction model responsive to an agricultural event (e.g., a planted crop achieves a plant growth stage, such as germination, flowering, and the like). Likewise, the training module 410 can update a crop prediction model responsive to a request received by the crop prediction engine 155 (e.g., by a grower or an agronomist). In some embodiments, the training module 410 updates the crop prediction models iteratively, such that a crop prediction output from a crop prediction model is incorporated into a training set of data used to train crop prediction models. For example, if a prediction model generates a set of farming operations identifying a crop variant to plant and a planting date range to optimize crop production, the training module 410 can incorporate the set of farming operations into a training set for use in training or retraining crop prediction models.

The model store 415 stores and maintains the crop prediction models generated by the training module 410. In one embodiment, the model store 415 stores the crop prediction models in association with a corresponding plot index uniquely representing the field or fields of the data used to train the model. The model store 415 can also receive and store updates to the models from the training module 410, and can provide stored prediction models, for instance in response to a request from the crop prediction module 425.

The farming operations store 420 stores data describing various farming operations that can be performed by a grower on a field. Farming operations can be associated with sets of information including an expected impact on a crop or a field, timing data describing when the farming operation should be performed, and a method of performing the farming operation (e.g., for farming operations requiring products such as pesticides and fertilizers, a method may identify one or more versions of available product). The farming operations store 420 can provide information describing farming operations for use as inputs to crop prediction models, for instance by the crop prediction module 425 when attempting to identify a set of farming operations that optimize crop production. Examples of farming operations stored by the farming operations store 420 can include:

Operations describing planting, including one or more of: a planting rate operation, a planting depth operation, a planting date range operation, an operation to plant an identified crop variant, an operation to not plant a crop, an operation to plant a different type of crop than an identified type of crop (e.g., an operation to plant an intercrop, an operation to plant a cover crop), and the like;

Operations describing replanting, including one or more of: an operation to replant a crop; an operation to plant a different crop; an region of the field for replanting; a date range for replanting, and the like;

Operations describing fertilizer applications to a field, including an application of one or more macronutrients or micronutrients, compost, manure, lime, or nitrogen (anhydrous ammonia, urea, and urea-ammonium nitrogen);

Operations describing the application of nutrients, the nutrients including one or more of: nitrogen, phosphorous, potassium, calcium, magnesium, sulfur, boron, chlorine, copper, iron, manganese, molybdenum, zinc, and the like.

Operations describing the application of nutrients, including: a type of nutrient to apply, a quantity of nutrient to apply, a location to apply a nutrient, a date range to apply a nutrient, a frequency to apply a nutrient, a nutrient application method, and the like;

Operations describing specific methods of fertilizer application, including a knifing application, a y-drop application, spraying from a machine (e.g., a plane or tractor), or the distribution of pellets;

Operations describing field or crop treatments, including one or more of: a seed treatment operation, a foliar treatment operation, a floral treatment operation, an irrigation operation, a soil treatment operation, a reseeding operation, a microbial composition application operation, an insecticide application operation, a herbicide application operation, a pesticide application operation, a fungicide application operation, an antibacterial operation, a plant hormone operation, a protein application, and the like;

Operations including, for each of the field treatments, one or more of: a type of treatment to apply; a quantity of treatment; a location to apply treatment; a date to apply treatment; a frequency to apply treatment; a rate of treatment application; a method of treatment application; an application volume of one or more of a plant growth regulator, a defoliant, and a desiccant; and the like.

Operations describing harvesting, including a harvest date range operation, a harvest method operation, a harvest order operation, and the like;

Operations for collecting additional data describing the field, including one or more of: additional sampling from existing sensors, placement of additional sensors, additional drone flights to capture additional images, sequencing one or more microbial communities (e.g., of the plant, of the soil, of the air, of the irrigation water), and the like;

Operations describing portions or management zones of a field for one or more of: planting, applying fertilizers, applying nutrients, applying water, applying agricultural chemicals, applying irrigation or drainage operations, applying a microbial composition, applying a crop treatment, and the like;

Operations describing watering methods, including one or more of: a quantity of water to apply, a location to apply water, a date or date range to apply water, time of day to apply water, a frequency to apply water, and a water application method; and Operations describing market information, including one or more of: a piece of equipment to purchase, a crop insurance policy to purchase, a time to sell a crop (e.g. a present or future sale), a price at which to sell a crop, a quantity of a crop to sell, a period to store a crop, one or more potential crop brokers, one or more potential crop recipients, one or more agronomists, and one or more harvested crop purchase prices or qualities.

The crop prediction module 425 receives a request to generate an optimized crop production prediction for a field (which can include multiple fields or plots of land, adjacent or otherwise) and applies one or more crop prediction models data associated with the field to determine a set of farming operations to optimize a crop production for the field. In one embodiment, the request is received from a grower via client device 102. In other embodiments, the request is received via a GUI generated by the interface module 130 and displayed on a client device of third party, such as a technology or service provider, a commodity trader, or a manufacturer of a good utilizing one or more agricultural inputs. For example, a technology provider can include a manufacturer of a technology such as an agricultural chemical, microbial composition, sensor, satellite, aircraft, unmanned aerial vehicle, land-based vehicle, land-based camera system, and the like. In such cases, "optimizing crop production" can refer to optimizing the use of a technology or service provided by such a third party (for instance, optimizing the cost of or resulting crop yield from using a technology or service), including the date and location of the use of a technology or service and any targeted field parameters associated with such use. In another example, a service provider can include a data provider (e.g., data describing weather, crop production, crop input use, imagery (drone, satellite, or land-based), data from a sensor, and/or commodity prices); an agronomist or other advisor; a service provider (e.g. grain marketing services), a broker or exporter, a procurement services provider, a delivery or transportation service provider, and the like.

In some embodiments, the request to generate an optimized crop production prediction is generated in response to conditions associated with a triggering event being satisfied. Examples of such triggering events include but are not limited to: a market event (such as an above- or below-threshold quantity of harvested crop being available for purchase), a contracting event (such as the grower and crop broker entering into an agreement wherein the crop broker obtains from the grower some or all of a crop to be harvested), a product supply event (such as the price of a particular fertilizer exceeding a threshold), a crop growth event (such as a growth rate of a planted crop exceeding a threshold), a weather event (such as a below-threshold amount of rain over a pre-determined time period), and the like. In some embodiments, the request to generate an optimized crop production can come from a grower or broker immediately before planting, shortly after planting, or mid-season, for instance in response to a grower manually adjusting one or more field parameters or farming operations previously provided by the crop prediction module 425. By applying a crop prediction model at various points throughout a growing season, the set of farming operations performed by a grower can be iteratively optimized, accounting for mid-season changes or events related to growing, land, or market characteristics.

Responsive to receiving the request, the crop prediction module 425 accesses geographic information associated with the field. The crop prediction module 425 accesses the model store 415 to retrieve one or more crop prediction models associated with the request, and applies the retrieved prediction models to the accessed geographic information. The crop prediction models can iterate through various combinations of farming operations to identify a set of farming operations that optimizes for crop production. In some embodiments, the type of crop production (e.g., crop yield, cost reduction, etc.) that the crop prediction models optimize for can be included within the request received by the crop prediction module 425, can be specified by a user associated with the crop prediction engine 155, can be a default crop production type, or can be selected based on any suitable criteria.

In some embodiments, a crop prediction model P used by the crop prediction module 425 can be represented as:

$$\text{crop prediction}=P(\text{field}_1,\text{field}_2,\ldots\text{field}_x;\text{farmop}_1,\text{farmop}_2,\ldots\text{farmop}_y) \quad \text{Equation 1}$$

In Equation 1, field parameters are represented by variables $\text{field}_1$, $\text{field}_2$, ..., $\text{field}_x$, and farming operations $\text{farmop}_1$, $\text{farmop}_1$, ..., $\text{farmop}_y$. As used herein, a "field parameter" is any type of field information that describes a geographic or agricultural characteristic associated with the land, the environment, or the planting, growing, and harvesting of a crop. In some embodiments, the field parameters used as inputs to the crop prediction model are included within a request for prediction information. For example, a farmer can use a grower client device 102 to request prediction information for a crop planted at a particular portion of the farmer's field, and the farmer can specify the soil type of the field portion, historic crops planted at the field portion, and an available irrigation system for the field portion. In some embodiments, the field parameters are retrieved from the geographic database 135, the agricultural database 140, or an external source (such as an entity of FIG. 1). Continuing with the previous example, after the farmer requests prediction information, the crop prediction engine 155 can access historic sunlight information for the field portion from the geographic database 135, crop yield information for similar fields from the agricultural database 140, and an expected future rainfall for the field portion from a weather database. As also used herein, a "farming operation" refers to the performance of an action by a grower or other entity with regards to the planting, growing, harvesting, and/or storage of a crop. In various embodiments, the entity requesting the prediction information can provide one or more farming operations that they intend to perform, and/or the crop prediction module 425 can access farming operations from the farming operations store 420.

The crop prediction module 425 applies the prediction model P to the field parameters and a set of farming operations to generate a prediction of crop production for the field parameters and the set of farming operations. Continuing with the previous examples, for a specified field portion, soil type, historic planted crops, available irrigation, historic sunlight information, crop yield for similar fields, and expected future rainfall, the crop prediction module 425 can apply a corresponding crop prediction model that, when applied, performs one or more machine learning operations on these farming parameters to identify a set of farming operations and a predicted crop production for the field portion if the selected set of farming operations are performed. The machine learning operations performed by the crop prediction module 425 can iterate through multiple combinations of farming operations in order to identify a set of operations that optimizes predicted crop production. In some instances, the set of available farming operations are constrained by the resources available to the grower (e.g. farm equipment such as tractors or drones, labor, capital, field size, input availability or prices in the region comprising the land, etc.). For instance, the crop prediction module 425 can perform a random forest classifier or a gradient boosting operation to identify the set of farming operations that produces the optimized crop prediction without having to exhaustively iterate through every combination of possible farming operations.

In some embodiments, crop prediction models are applied to a particular crop type or variant, such as a crop variety specified by a grower. A "variant" of a crop or plant (or element thereof, e.g. a seed) represents a particular instance of natural or artificially introduced genetic or epigenetic diversity of a crop or plant. For example, a genetic variant may be a crop variety, a genetically modified trait (such as represented by transgenic events MON87460 (Genuity® DroughtGard™), DP73496 (Optimum® Gly), SYN-000H2-5, or genome engineering including genetic variants introduced by targeted nucleases such as a targeted nuclease transcription activator-like effector nuclease (TALEN), zinc finger nuclease (ZNF), clustered regulatory interspaced short palindromic repeats (CRISPR), CRISPR/Cas9, CRISPR/CPF1, and combinations thereof), or an epigenetic trait such as introduced by treatment with a DNA methyltransferase inhibitor such as 5-azacytidine, or a histone deacetylase inhibitor such as 2-amino-7-methoxy-3H-phenoxazin-3-one or genomic perturbation such as via tissue culture. In other embodiments, the crop prediction module 425 additionally modifies the crop type or variant when applying a crop prediction model to determine a crop type or variant that optimizes the crop production. In these embodiments, the crop prediction module 425 identifies a crop variant and a set of farming operations corresponding to the identified crop variant, for instance for display on the grower client device 102.

In some embodiments, a crop prediction model can be a neural network trained on geographic and agricultural data, including for instance, land characteristics, crop types planted, farming operations performed, and resulting crop productions. The resulting neural network can map combinations of geographic and agricultural inputs to resulting crop productions, including geographic, agricultural inputs, and crop productions (and combinations thereof) that weren't included in the training data. When the crop prediction module 425 applies the neural network to a set of field parameters (for instance, included within a request received from a grower or broker), the neural network can vary possible combinations of farming operations to identify a set of farming operations mapped to an optimized crop production. It should be noted that for the machine learning operations and crop prediction models described herein, an "optimized crop production" may refer to a maximum crop production over a threshold number of iterations or time. In other words, a predicted optimized crop production may refer to a local maximum crop production discovered over the course of applying a machine learning operation or a crop prediction model to a set of inputs, but not necessarily a global maximum over all possible combinations of farming operations.

In some embodiments, a crop prediction model can be a Bayesian classifier trained on geographic and agricultural data, including for instance, land characteristics, crop types planted, farming operations performed, and resulting crop productions. The resulting Bayesian classifier can identify a set of farming operations that optimizes a prediction crop production by 1) enumerating all possible combinations of farming operations and all possible outcomes, 2) determining the probability distribution of each outcome for each combination of farming operations (using a Bayesian model), 3) computing the expected utility for each outcome (e.g., a tradeoff of profit, risk, costs, and environmental impact), and 4) choosing the combination of farming operations with the highest expected utility. Accordingly, the Bayesian classifier can select a set of farming operations associated with a predicted crop production probability distribution that stochastically dominates the predicted crop production probability distributions associated with other possible sets of farming operations.

In some embodiments, a crop prediction model can be an ensemble machine learning model including one or more of a convolutional neural network, a spatial regression operation, a random forest classifier, and a partial least square regression operation trained on one or more of crop reflectance data, crop tissue samples, rainfall information, irrigation information, soil moisture information, solar radiation information, temperature information, and nitrogen application information. The resulting ensemble model can identify a set of operations that is likely to result in a particular protein content for wheat crops by 1) processing images (including image stitching and cloud cover correction) to obtain current season reflectance data, 2) joining the reflectance data with current season tissue sample data and rainfall/solar radiation time series data, and 3) selecting farming operations (including nitrogen application and irrigation operations) that are expected to result in the particular protein content. Accordingly, the ensemble model can identify a set of farming operations that, if performed, are expected to result in a particular wheat protein content based on current season conditions. It should be noted that in some embodiments, the ensemble model can also select an optimized wheat protein content, for instance based on current market prices, costs of requisite treatments, and the like, and can identify a set of farming operations expected to produce the optimized wheat protein content.

In some embodiments, a crop prediction model can be a multivariable regression model trained on one or more of historic planting dates, planting rates, harvest dates, weather conditions, and solar radiation. The resulting multivariable regression model can predict whether a crop replant will result in an optimized crop production, and can identify a type of crop (either the same crop or a different crop) to replant that will result in the optimized crop production. The multivariable regression model can predict a probable range of yields for a planted crop based on various conditions and characteristics of the crop (such as current crop growth rate, current and expected weather conditions, and planting date), and can likewise predict a set of probable yield ranges for replanting under various conditions (varying planting date, crop type, treatments applied, etc.) If a predicted probable yield range of the set of probable yield ranges stochastically dominates the predicted probable range for the planted crop, the multivariable regression model can then recommend a replant, and can identify a set of farming operations (including the type of crop to plant, planting date, and the like) that will optimize crop production for the replant.

In some embodiments, a crop prediction model can be a Bayesian model that includes Gaussian processes or splines, trained on historic soil samples, information describing trends in soil nutrient contents and composition, and information describing soil variation over geographic regions. The resulting Bayesian model can interpolate soil sample information over a portion of land, such as a grower's field, for instance using Markov Chain Monte Carlo sampling or variational inference estimations. After samples and corresponding locations are accessed for a particular portion of land, the Bayesian model can be queried for a soil characteristic or measurement (such as pH) at a particular location within the portion of land, and the Bayesian model can provide an inferred soil characteristic or measurement (or a probable range) in response.

Examples of other crop prediction models that perform one or more machine learning operations include but are not limited to:

- Models that map sunlight exposure information, soil texture, and precipitation and various planting dates to expected crop yield and quality;
- Models that map historic pest and insect populations within a location and the application of various quantities and types of pesticides to expected crop yield or expected crop loss from pest and insect damage (for instance, relative to expected crop yields when pest and insect damage does not occur);
- Models that map a decision to opt against planting a crop or to plant a cover crop to long-term profitability;
- Models that map crops planted in one or more previous years to current season yields in order to estimate the effects of crop rotation while controlling for location and weather;
- Models that map soil composition information, crop rotation, and various combinations of nutrient application types, quantities, and methods to long-term soil health;
- Models that map expected rainfall and various combinations of row spacing and seed rates to crop yield;
- Models that map expected temperature and various combinations of row spacing and seeding rates to crop yield;
- Models that map macroeconomic factors domestic and foreign supply and demand of agricultural crops or inputs to agricultural production, domestic or foreign policy, export or import regulation, exchange rates or natural phenomena such as regional flooding or droughts to expected crop yield or expected crop loss;
- Models that map geographic or topographic factors of or near a field such as mountains, hills, valleys, or bodies of water and various combinations of watering frequency, watering intensity, and watering method to crop yield;
- Models that map crop production to crop planting conditions, including which crop to plant (or whether to plant a crop at all), which varieties of seeds to plant, which seed chemistry package to apply, which microbial seed coating to apply, when to plant, at what rate to plant, what in-furrow to use, whether to replant, and which cover crop to plant, determined based on one or more of: 1) historical data on crops planted, weather that occurred, and resulting yield, 2) historical crop health, 3) elevation (including derived slope, aspect, and soil wetness index), 4) historical soil texture and soil nutrients, 5) historical and forecasted weather (including solar radiation), and 6) historical and current prices of crops (including futures contracts);
- Models that map crop production to treatment application (such as Nitrogen, Phosphorus, Calcium, Magnesium, Sulfur, Boron, Chlorine, Copper, Iron, Manganese, Molybdenum, Zinc, fertilizer, plant growth regulator, desiccant, or defoliant), for instance based on a method, time, location, and quantity of application, determined based on one or more of 1) historical crop health, 2) reports of pest and weed stress by human "scouts" who visit the field, 3) elevation (including derived slope, aspect, and soil wetness index), 4) historical soil texture and soil nutrients, 5) historical and forecasted weather (including solar radiation), and 6) historical and current prices of inputs and crops (including futures contracts);
- Models that map fungicide, herbicide, and nematicide application (including which product to apply, when to apply, where to apply, quantity to apply, and method of application) determined based on one or more of: 1) information about incidence of pests and weeds and disease in nearby geographic regions, 2) historical crop health, 3) reports of pest and weed stress by human "scouts" who visit the field, 4) elevation (including derived slope, aspect, and soil wetness index), 5) historical soil texture and soil nutrients, and 6) historical and forecasted weather (including solar radiation);
- Models that map the expected value (and/or confidence interval) of crop insurance payments to an amount of crop insurance purchased for one or more portions of land, determined based on one or more of: 1) historical insurance claim data, 2) historical and current crop prices (including futures contracts), 3) historical and forecasted yield, 4) historical soil texture and soil nutrients, and 5) historical and forecasted weather.
- Models that map crop yield and quality at harvest to harvest date and order, determined based on one or more of: 1) historical crop health, 2) reports from human "scouts" or from imagery on how many crops have fallen over, 3) historical treatment application data (including the current season), 4) elevation (including derived slope, aspect, and soil wetness index), 5) historical soil texture and soil nutrients, 6) historical and forecasted weather (including solar radiation), 7) available harvest machinery, and 8) size of harvested land;

As noted above, the crop prediction module 425 determines an optimized crop production by comparing multiple predictions from multiple sets of farming operations and/or field parameters. In one embodiment, the crop prediction module 425 identifies a crop production prediction and corresponding set of farming operations with a greatest expected utility. The expected utility may be determined by a number of factors, for instance prioritized based on user input from a grower client device 102 including yield, profitability, long-term impact to the field or environment (e.g., addition or reduction of nutrients to the soil), composition of the crop or of the field, and the like.

The output of the crop prediction models applied by the crop prediction module 425 may be formatted in a variety of ways. In some embodiments, the crop prediction module 425 outputs a measure of crop productivity for a particular set of farming operations. For example, the crop prediction module 425 can output a numerical value representing a predicted crop yield; a probability distribution (e.g., a 20% chance of a decrease in crop production and an 80% chance of an increase in productivity); a map overlay representing an area of land including a planting region corresponding to a request showing management zones of application of one or more farming operations and a predicted productivity corresponding to the management zones; a predicted cost/ profit ratio per acre; a yield or profitability delta relative to similar or nearby groups of fields; a yield or profitability delta relative to historical practices or productivity of the same planting region; and the like.

In some embodiments, the crop prediction module 425 outputs a set of farming operations identified to result in an optimized crop production. For example, the crop prediction module 425 can output a crop type to plant, a planting date range, dates and quantities of nitrogen application, watering timing instructions, and the like. The crop prediction module 425 can modify a crop growth program or a set of farming operations identified by a grower, and can output the modified crop growth program or modified set of farming operations, for instance by highlighting the modifications made. For any type crop prediction model output, the interface 130 can cause a grower client device 102, an agronomist client device 108, or any other entity of FIG. 1 or otherwise to display the crop prediction model output. In various embodiments, the crop prediction module 425 outputs one or more farming operations in the set of farming operations directly to farming equipment (e.g., a smart tractor or sprinkler system) for implementation, such as a route to traverse, a crop treatment to apply, or an instruction to capture images of an identified portion of a field. In some embodiments, the interface 130 can modify a user interface displayed by an external device (such as the grower client device 102) to display (for instance) a set of farming operations to perform and an expected crop yield that will result from performing the displayed set of farming operations.

Figure 5:
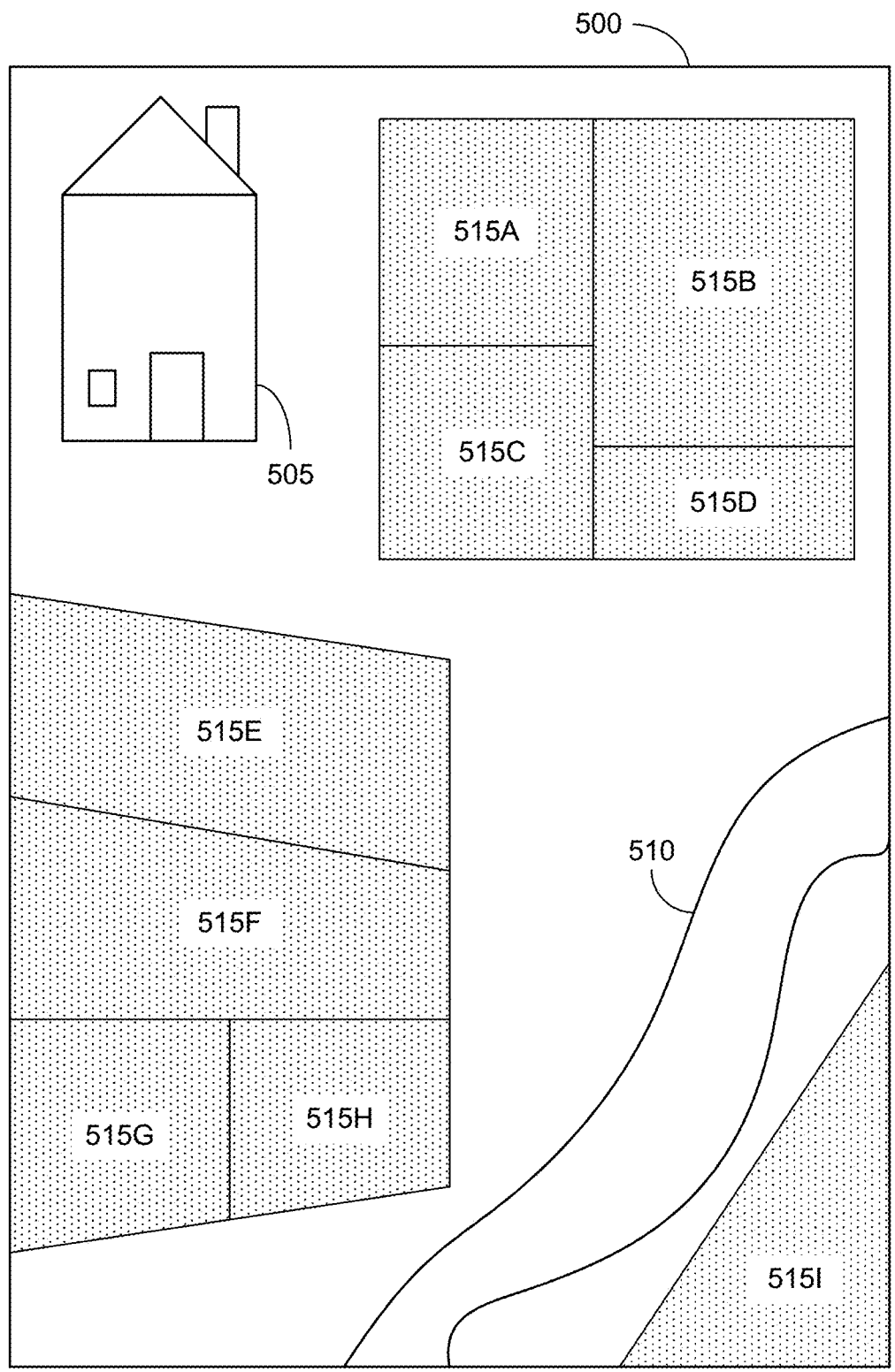
FIG. 5 illustrates an example land plot partitioned into one or more planting regions.

FIG. 5 illustrates an example land plot 500 partitioned into one or more planting regions 515. The land plot 500 includes features such as a house 505 and a river 510 that may impact the crop production of neighboring planting regions. As shown in FIG. 5, one or more planting regions may be part of a single field (e.g., one field is split into four planting regions: a first planting region 515A, a second planting region 515B, a third planting region 515C, and a fourth planting region 515D). The one or more planting regions are associated with one or more sets of data describing the conditions, composition, and other characteristics that may impact crop production and that may vary from planting to region to planting region (even among planting regions within a same field). In embodiments where one or more of the planting regions of a field satisfy a threshold similarity, the crop prediction system 125 can apply a prediction model to the cluster of the one or more planting regions. In other embodiments where various planting regions do not satisfy a threshold similarity, the crop prediction system 125 can apply the prediction model to each planting region individually. Although the example of FIG. 5 describes the portions of land as "planting regions", it should be noted that in other embodiments, the planting regions of FIG. 5 can be referred to as "sub-portions" of a field, "zones", or any other suitable terminology.

For example, a planting region 515I located near a river 510 may have a higher soil moisture content than a second region 515A located farther from the river, and may be better suited to a different crop variant and set of farming operations than to the second region (e.g., the first planting region 515I might require less frequent or intensive watering than the second planting region 515A; the second planting region 515A might be better suited to a hardier crop variant). In another example, a first region 515E may be located on a slope and experience a greater volume of runoff during rainfall than a second region 515F located at the peak of a hill. Accordingly, a crop prediction system 125 may prescribe a different crop variant and set of farming operations to the first region 515E than to the second region 515F despite the two regions being geographically close to each other. For instance, the first region 515E may require a more frequent application of pesticides to prevent pesticide dilution from the runoff during rainfall than the second region 515F.

Figure 6:
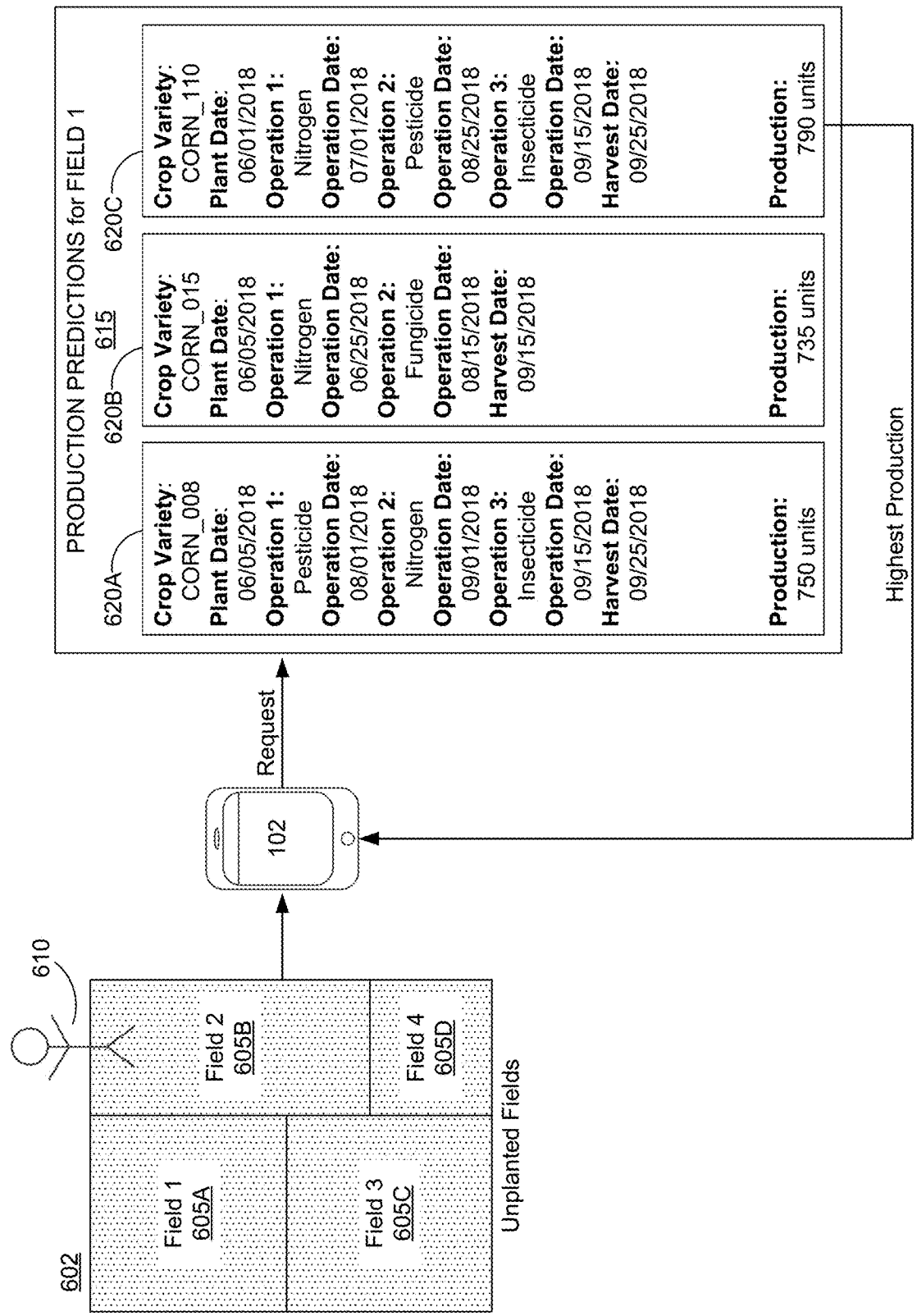
FIG. 6 illustrates an example process for using machine learning to predict crop production information and to identify a set of farming operations that optimize crop production for a portion of land before planting a crop within the portion of land, according to various embodiments.

FIG. 6 illustrates an example process for using machine learning to optimize crop production information and identify a set of farming operations that optimize crop production for a portion of land before planting a crop within the portion of land. One or more unplanted fields 605 are associated with a grower 610. In the example shown in FIG. 6, the unplanted fields are sub-portions of a portion of land 602 and are represented by unique plot indices, such that a field 605A, a field 605B, a field 605C, and a field 605D are each associated with one or more sets of field parameters. The grower 610 accesses the crop prediction system 125 via a grower client device 102 and transmits a request to the crop prediction system including a set of field parameters associated with the field 605A. Responsive to receiving the request, the crop prediction system 125 applies the crop prediction engine 155 to the set of field parameters to optimize the predicted crop production for the field 605A. The crop prediction engine 155 can, for instance, perform various machine learning operations to predict crop productions 615 for the field 605A.

The crop prediction system 125 iterates through multiple sets of farming operations 620 and identifies the set of farming operations associated with an optimized predicted crop production. In the example of FIG. 6, a first set of farming operations 620A specifies that the crop variety is the corn variant "CORN_008", the plant date is Jun. 5, 2018, a pesticide application date is Aug. 1, 2018, and so forth. Likewise, a second set of farming operations 620B specifies that the crop variety is the corn variant "CORN_015", the plant date is Jun. 5, 2018, a nitrogen application date is Jun. 25, 2018, and so forth. Finally, a third set of farming operations 620C specifies that the crop variety is the corn variant "CORN_110", the planting date is Jun. 1, 2018, and so forth. In other words, each of the sets of farming operations 620 for which the crop prediction system 125 makes a prediction for crop production is different. Likewise, each set of farming operations 620 is associated with a different predicted crop production. For instance, the first set of farming operations 620A is associated with a predicted production of 750 units, the second set of farming operations 620B is associated with a predicted production of 735 units, and the third set of farming operations 620C is associated with a predicted production of 790 units. It should be noted that in practice, the crop prediction system 125 will iterate through hundreds, thousands, or more sets of farming operations, and that the three sets of farming operations displayed within FIG. 6 is done so for the purposes of simplicity.

In the embodiment of FIG. 6, the optimized predicted crop production may be a highest predicted crop yield for a growing season, in which case the third set of farming operations 620C is selected and provided to the grower client device 102. In other examples, the optimized predicted crop production may be identified based on other factors for a current season or over a time period of multiple seasons, and may additionally prioritize crop yield, profit, soil health, carbon sequestration, production at a particular date, composition profile of crops, and the like. The crop prediction system 125 transmits the identified set of farming operations corresponding to the optimized predicted crop production to the grower client device 102 to modify a user interface of the grower client device to display the identified set of farming operations. The grower 610 in turn can perform the identified set of farming operations on the field 605A.

Figure 7:
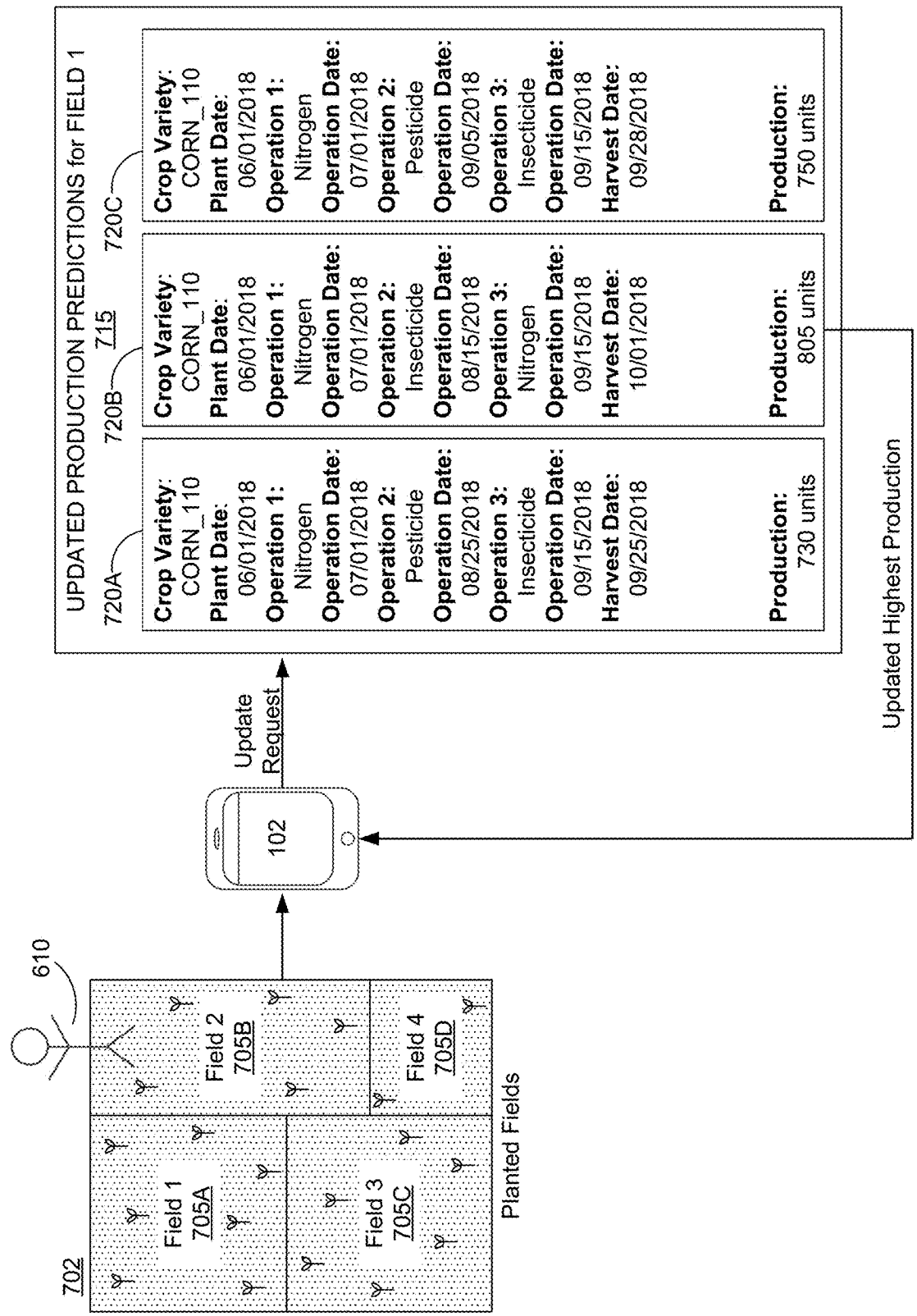
FIG. 7 illustrates an example process for using machine learning to predict updated crop production information and to identify an updated set of farming operations that further optimize crop production for a portion of land after planting a crop within the portion of land, according to various embodiments.

FIG. 7 illustrates an example process for using machine learning to predict updated crop production information and identify an updated set of farming operations that further optimize crop production for a portion of land after planting a crop within the portion of land. One or more planted fields 705 (corresponding to fields 605 of FIG. 6) are associated with a grower 610, a crop variant planted on the field or fields, and a set of factors describing the field or fields. In the example shown in FIG. 7, the planted fields 705 are sub-portions of a portion of land 702, and are represented by unique plot indices 705A, 705B, 705C, and 705D. In one instance, each planted field (planted field 705A, planted field 705B, planted field 705C, and planted field 705D) is associated with a unique set of parameters and conditions that may impact the crop production of the field. For example, the planted field 705A may be planted with a first crop variant that is different from a second crop variant planted in the planted field 705B. In the embodiment of FIG. 7, the grower 610 selected the set of operations 620C from the example of FIG. 6, and began implementing the set of operations 620C in the planted field 705A.

In the example of FIG. 7, the grower 610 accesses the crop prediction system 125 via a grower client device 102 on Jul. 5, 2018, and transmits a request to the crop prediction system for an updated crop production prediction and an updated set of farming operations to perform to optimize the crop production of the planted field 705A. The request includes information describing a current state of the planted field 705A, including a crop variant planted in the field and any farming operations that have been performed on the field. The crop prediction engine 155 performs machine learning operations to generate an updated/mid-season production prediction 715 for the field 705A.

The crop prediction system 125 iterates through multiple sets of updated farming operations 720 and identifies the set of farming operations associated with an optimized predicted crop production. In the example of FIG. 7, a set of updated farming operations 720 identifies previous farming operations that have been performed in addition to a set of future farming operations to perform. For instance, the first set of updated farming operations 720A is the set of farming operations 620C selected at the time of planting the crop within the planted field 705A. The second set of updated farming operations 720B includes different future operations to perform, such as an insecticide application on Aug. 15, 2018, a nitrogen application on Sep. 15, 2018, and a harvest date of Oct. 1, 2018. A third set of updated farming operations 720C includes a pesticide application on Sep. 15, 2018, an insecticide application on Sep. 15, 2018, and a harvest date of Sep. 28, 2018. In other words, the sets of updated farming operations 720B and 720C represent a set of future operations to perform than the originally selected set of farming operations 720A.

Each set of updated farming operations 720 is associated with a different predicted crop production. For instance, the first set of updated farming operations 720A is associated with an updated predicted production of 730 units, the second set of updated farming operations 720B is associated with an updated predicted production of 805 units, and the third set of updated farming operations 720C is associated with an updated predicted production of 790 units. In other words, while the set of farming operations 620C was determined before planting to represent an optimized set of farming operations and to result in a predicted production of 790 units, the same set of farming operations 720A is determined to result in a prediction production of only 730 units after the crop prediction model is re-applied mid-season. This discrepancy can be the result of a change in expected weather conditions, a market event, or an unexpected infestation of insects.

In the embodiment of FIG. 7, the optimized predicted crop production may be a highest predicted crop yield for a growing season, in which case the second set of updated farming operations 720B is selected and provided to the grower client device 102. In other examples as discussed in conjunction with FIG. 6, the optimized predicted crop production may be identified based on other factors for a current season or over a time period of multiple seasons, and may additionally prioritize crop yield, profit, soil health, carbon sequestration, production at a particular date, composition profile of crops, and the like. The crop prediction system 125 transmits the set of updated farming operations 720B to the grower client device 102 and modifies a user interface of the grower client device to display the set of updated farming operations. The grower 610 in turn can perform the identified set of farming operations on the planted field 705A. As noted above, the crop prediction system 125 can iterate through hundreds, thousands, or more sets of farming operations, and that the three sets of updated farming operations displayed within FIG. 7 is done so for the purposes of simplicity.

It should be noted that although reference is made in FIGS. 6 and 7 to generic crop treatment farming operations (e.g., "nitrogen", "fungicide", etc.), this is done for the purposes of simplicity and in practice, the farming operations identified by the crop prediction system 125 can include specific details of crop treatment operations (such as the type of crop treatment applied, the method of application, the area and date of application, etc.) It should also be noted that although the crop prediction example of FIGS. 6 and 7 is limited to field 1, in practice, a separate set of farming operations can be identified for each of fields 1-4, for sub-portions of one or more of fields 1-4, or for the entirety of the land portions 602/702. It should also be noted that in some embodiments, a set of farming operations can identify many possible dates for planting (e.g., September 1, September 2, . . . , November 29). In such embodiments, a Bayesian regression model can be trained to map (for instance) crop productivity to each possible planting date, and the possible planting date associated with the greatest expected crop productivity can be included within the set of farming operations. In other embodiments, a set of farming operations can include a planting date range, for instance where each date within the planting date range is associated with an above-threshold expected crop productivity.

Figure 8:
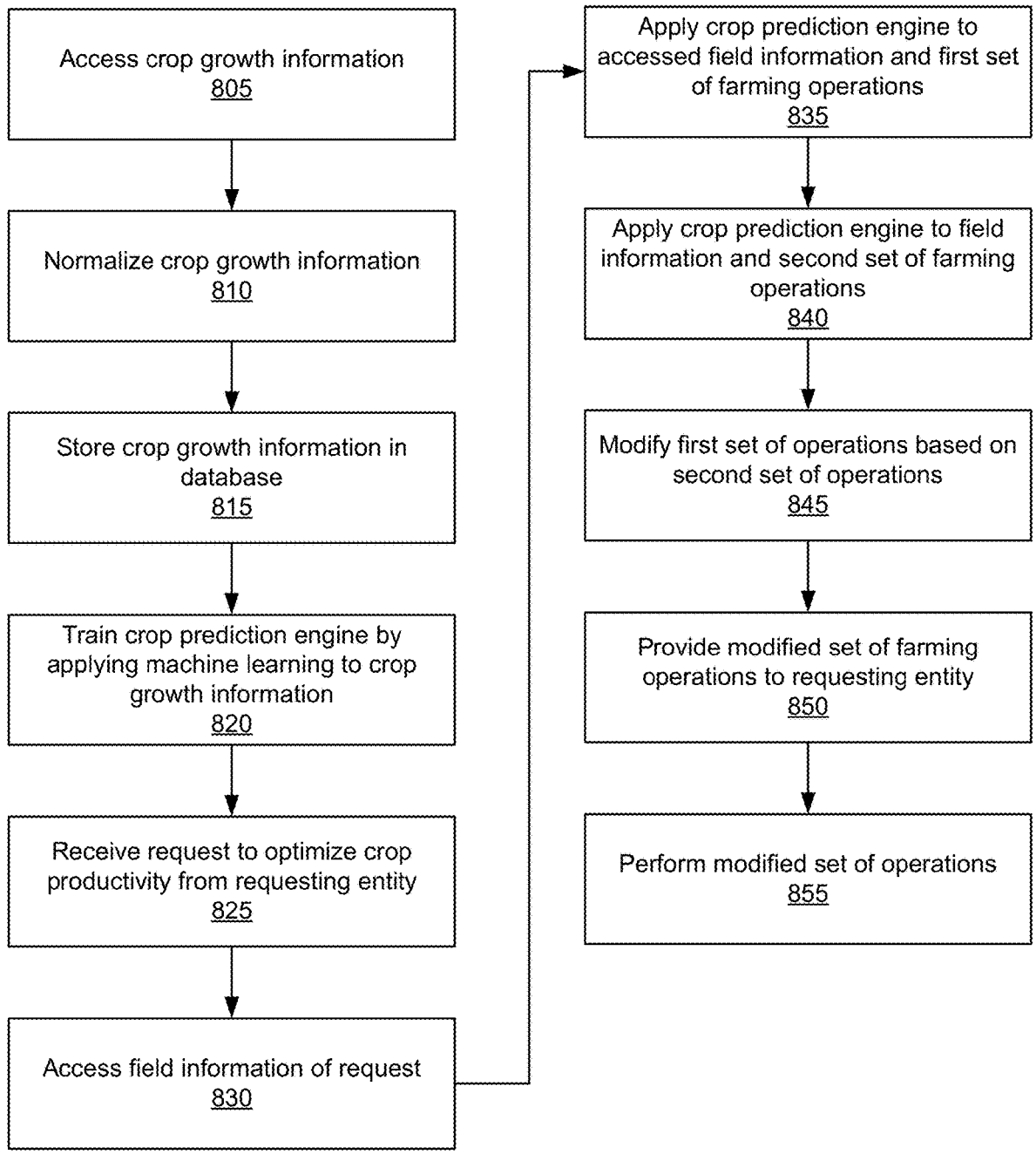
FIG. 8 is a flowchart illustrating a process for applying a machine learning engine to historic and current field information to generate predictions of crop production and to identify a set of farming operations that optimize crop production, according to various embodiments.

FIG. 8 is a flowchart illustrating a process for applying a machine learning engine to historic and current field information to generate predictions of crop production and to identify a set of farming operations that optimize crop production. In various embodiments, the method may include different and/or additional steps than those described in conjunction with FIG. 8.

A crop prediction system 125 accesses crop growth information 805 from one or more sources. The crop growth information can include geographic information, agricultural information, and crop production information. The crop prediction system 125 normalizes 810 the crop growth information and stores 815 the normalized crop growth information in one or more databases, such as the geographic database 135 and the agricultural database 140. The crop prediction system 125 trains 820 a crop prediction engine 155 by applying machine learning operations to the normalized crop growth information in the one or more databases to produce machine-learned crop prediction models. In some embodiments, the crop prediction models can be learned with or without human guidance, and can be learned using supervised machine learning, unsupervised machine learning, and/or reinforcement machine learning.

Responsive to receiving 825 a request to optimize crop productivity from a requesting entity, the crop prediction system 125 accesses 830 field information corresponding to the request. For example, field information corresponding to the request can include a plot index or other field location data, and information describing the conditions of the field, such as soil composition and moisture levels. The crop prediction system 125 applies 835 the crop prediction engine 155 to the accessed field information and a first set of farming operations (such as a set of farming operations selected by the requesting entity, or by the crop prediction engine itself) to produce a first predicted crop production.

The crop prediction system 125 then applies 840 the crop prediction engine 155 to the accessed field information and a second set of farming operations (such as a set of farming operations selected by the crop prediction engine) to produce a second predicted crop production. In one example, the second set of farming operations includes one or more farming operations that differ from the farming operations in the first set of farming operations (e.g., in identity, in application or lack thereof, in application method, in timing of application, in rate of application, or the like). If the second predicted crop production is greater than the first predicted crop production, the crop prediction system 125 modifies 845 the first set of operations based on the second set of operations. The crop prediction system 125 then provides 850 the modified set of farming operations to the requesting entity such that the modified set of farming operations may be performed 855 by the requesting entity or another entity.

Figure 9:
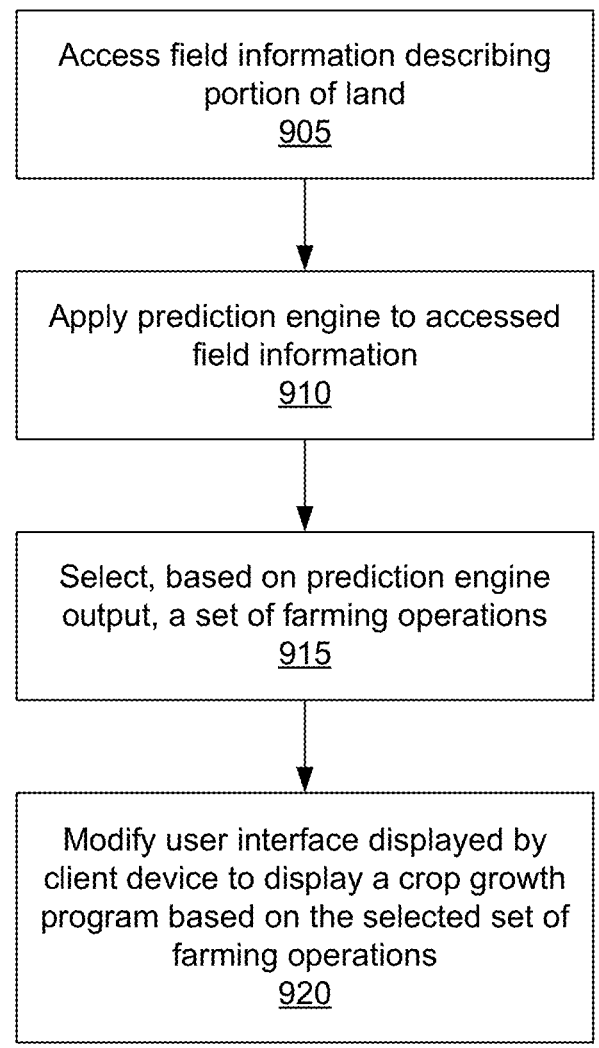
FIG. 9 is a flowchart illustrating a process for applying a machine learning engine to historic and current field information to identify a set of farming operations that optimize crop production, according to various embodiments.

FIG. 9 is a flowchart illustrating a process for applying a machine learning engine to historic and current field information to identify a set of farming operations that optimize crop production. In various embodiments, the method may include different and/or additional steps than those described in conjunction with FIG. 9.

In response to request for predicted crop production information, a crop prediction system 125 accesses 905 field information describing a portion of land and applies 910 a crop prediction engine 155 to the accessed field information. For example, the crop prediction engine 155 applies a Gaussian network machine learning model to the accessed field information in order to iterate through various combinations of farming operations to predict corresponding crop productions. Based on an output from the crop prediction engine 155, the crop prediction system 125 selects 915 a set of farming operations to optimize crop productivity for the portion of land and modifies 920 a user interface displayed by a client device associated with the request for predicted crop production information to displayed a crop growth program for the portion of land based on the selected set of farming operations.

Figure 10:
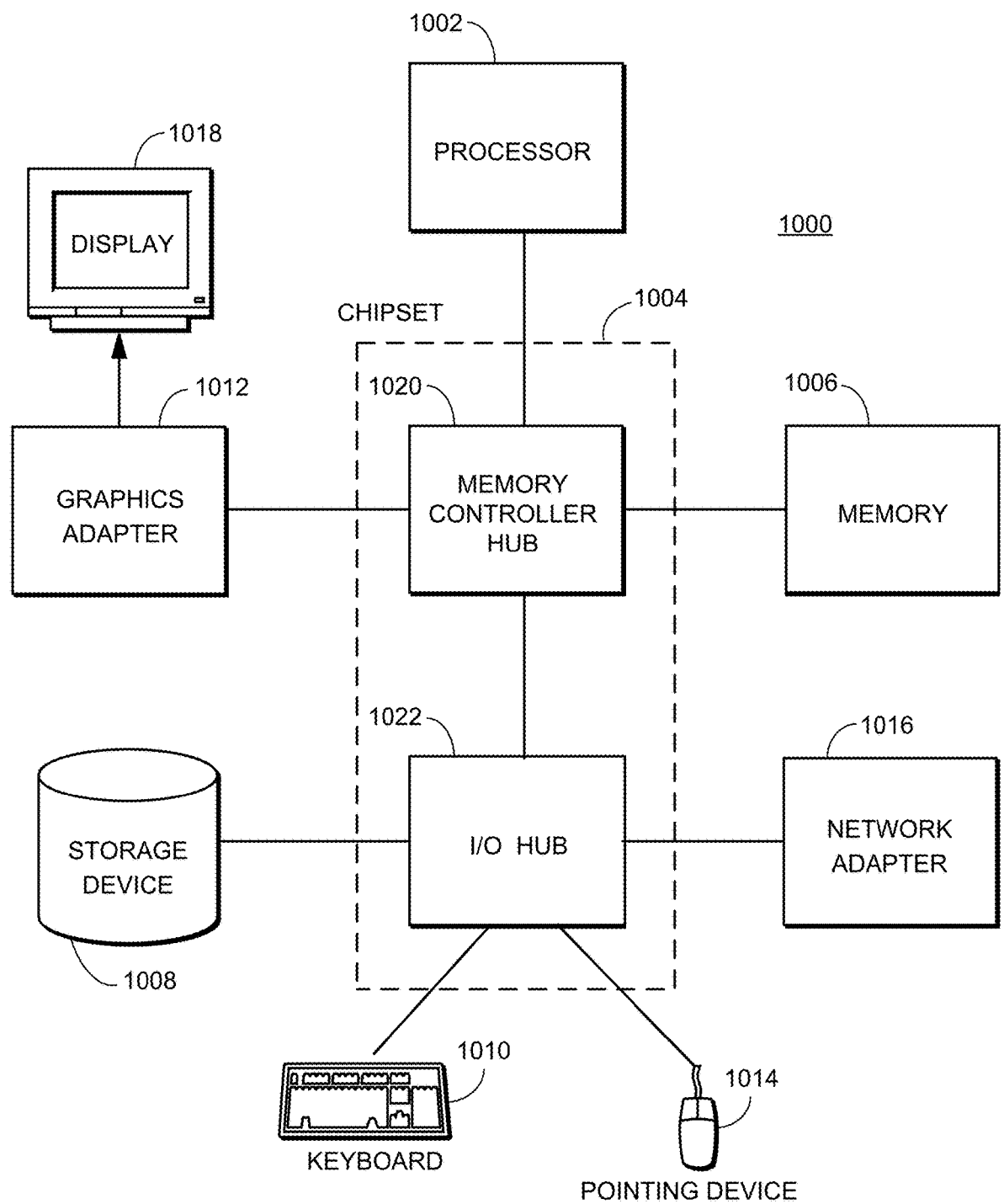
FIG. 10 is a high-level block diagram illustrating physical components of a computer used as part or all of one or more of the entities described herein, according to various embodiments.

FIG. 10 is a high-level block diagram illustrating physical components of a computer used as part or all of one or more of the components, systems, vehicles, or entities described herein. For example, instances of the illustrated computer 1000 may be used as a server implementing the crop prediction system 125, as a client device (such as the grower client device 102) of FIG. 1, as a piece of smart farming equipment, as a field-based sensor, as a drone, and the like. Illustrated are at least one processor 1002 coupled to a chipset 1004. Also coupled to the chipset 1004 are a memory 1006, a storage device 1008, a keyboard 1010, a graphics adapter 1012, a pointing device 1014, and a network adapter 1016. A display 1018 is coupled to the graphics adapter 1012. In one embodiment, the functionality of the chipset 1004 is provided by a memory controller hub 1020 and an I/O hub 1022. In another embodiment, the memory 1006 is coupled directly to the processor 1002 instead of the chipset 1004. In one embodiment, one or more sound devices (e.g., a loudspeaker, audio driver, etc.) are coupled to the chipset 1004.

The storage device 1008 is any non-transitory computer-readable storage medium, such as a hard drive, compact disk read-only memory (CD-ROM), DVD, or a solid-state memory device. The memory 1006 holds instructions and data used by the processor 1002. The pointing device 1014 may be a mouse, track ball, or other type of pointing device, and is used in combination with the keyboard 1010 to input data into the computer 1000. The graphics adapter 1012 displays images and other information on the display 1018. The network adapter 1016 couples the computer system 1000 to a local or wide area network.

As is known in the art, a computer 1000 can have different and/or additional components than those shown in FIG. 10. In addition, the computer 1000 can lack certain illustrated components. In one embodiment, a computer 1000 acting as a server may lack a keyboard 1010, pointing device 1014, graphics adapter 1012, and/or display 1018. Moreover, the storage device 1008 can be local and/or remote from the computer 1000 (such as embodied within a storage area network (SAN)). Likewise, a smart tractor may not include a pointing device 1014, and a field sensor may include one or more I/O mechanisms (not illustrated in FIG. 10) configured to capture external data (such as soil pH and altitude).

As is known in the art, the computer 1000 is adapted to execute computer program modules for providing functionality described herein. As used herein, the term "module" refers to computer program logic utilized to provide the specified functionality. Thus, a module can be implemented in hardware, firmware, and/or software. In one embodiment, program modules are stored on the storage device 1008, loaded into the memory 1006, and executed by the processor 1002.

Crop Prediction in an Economic Context

As described above, the crop prediction system 125 can access information describing geographic and agricultural characteristics of a portion of land, and can perform one or more machine learning operations to identify a set of farming operations that, if performed, is expected to optimize crop production. By providing insight into a predicted crop production, various entities (such as a grower, a crop broker, a crop recipient, technology manufacturer, services provider, and an agronomist) are better able to evaluate risks and benefits in view of an expected crop productivity, and can perform various actions in view of those risks and benefits.

For a grower, accessing predicted crop production information can better inform the grower about which crop types and variants to plant in order to maximize end-of-season or future season profits, about which crop types and varieties to plant in order to minimize crop treatment and watering costs, about the effects of reducing crop treatment and watering costs on the expected crop yield, about the effects of storing a crop after harvest, about the long-term benefits of planting a cover crop, and the like. Having access to such information can beneficially enable growers to efficiently and profitably allocate resources, improve crop yield stability, reduce or account for short- and long-term risks, and evaluate expected market conditions months or years in advance.

Without access to such crop prediction information, growers may wait until late in a growing season to enter into a contract with a crop recipient in order to ensure they will avoid penalties for being unable to satisfy the conditions of the contract due to a lower-than-expected crop yield, or to seek a higher price for a harvested crop. In instances where many growers saturate the market late-season, crop recipients may be able to extract more favorable contract terms, to the detriment of the growers. Further, crop recipients may have access to a broader view of market conditions and may thus have a better understanding of the direction of market-wide yields, creating an information asymmetry that benefits crop recipients. In contrast, having access to such crop prediction information can enable a grower to close the information deficient with crop recipients and to enter contracts with crop recipients or crop brokers early in the growing season, at a time when fewer growers are willing to enter into contracts, enabling the grower to potentially 1) extract more favorable contract terms, 2) to optimize profit or another measure of crop production per unit of land, and/or 3) to provide the grower with access to resources (such as working capital or a contract down payment) resulting from an early-season agreement with a crop broker or recipient.

For a crop recipient, such as a food distributor, grocery store chain, or restaurant, accessing predicted crop production information can better inform the crop recipient about expected availabilities of particular crop types and variants. In turn, this can enable a crop recipient to evaluate abundance or scarcity of a desired harvested crop within the market, to evaluate an expected price for the desired harvested crop, and to reduce risk when entering into contractual agreements with growers or brokers based on the expected price. Likewise, predicted crop production information can enable a crop recipient to evaluate alternative crop types and varieties in the event that a desired harvested crop is too scarce or expensive. For example, a vegan energy bar maker can adjust a recipe for the bar prior to manufacture if a necessary ingredient is unlikely to be available or is likely to be prohibitively expensive at the end of a growing season.

A crop broker can leverage predicted crop production information to better evaluate expected harvested crop availability and costs in order to establish contracts with growers and or crop recipients. For example, a crop broker can enter into a contract with a grower at the beginning or just before a growing season with terms determined using one or more crop prediction models or machine learning operations as described herein. For instance, the contract can require:

the grower to provide, to the crop broker, a minimum amount of crop, such as a percentage (e.g., 75%) of the grower's historical crop yield, determined by applying a crop prediction model that predicts expected crop yields to historical information associated with the grower's field or similar fields under similar conditions;
the grower to provide, to the crop broker, all or a threshold amount of crop yield from a portion of land, for instance at a price determined by applying a crop prediction model that predicts expected crop prices based on current market conditions;
the grower to purchase crop insurance to cover any shortfall in order to reduce the crop broker's risk, where the amount of coverage and/or cost of the insurance policy is determined by applying a crop prediction model that predicts expected crop risks and associated costs;
the grower to purchase or use particular products (such as particular crop treatments, farming equipment, and field sensors) over the course of a growing season, selected by applying a crop prediction model that selects a set of farming operations (some of which are associated with these products) to optimize crop yield, optimize profitability, or lower growing costs;
the grower may have the option to delay payment for such products until after the crop is harvested and sold, for instance if the increase in harvested crop value resulting from the application of such products is expected to offset the costs of such products (determined by applying the crop prediction model);
the crop broker to provide an advisor, such as an agronomist, to advise the grower in short-term and long-term land management practices, crop growth, crop marketing, and technology products and services based on predictions made by crop predictions models or machine learning operations;
the crop broker to purchase the entirety of the grower's crop, including any amount that exceeds the percentage that the grower is obligated to provide, determined by applying a crop prediction model that predicts expected crop yields;
the crop broker to provide the grower with some amount of working capital, for instance a percentage of the expected value of the grower's crop, determined by applying a crop prediction model that predicts expected crop yields and associated market values;
in instances where working capital is provided by the broker to the grower in installments:
the grower may, prior to the payment of the last installment, select the present futures price of the harvested crop due to the crop broker after harvest, determined by re-applying the crop prediction model in view of present/mid-season crop conditions;
the broker may have the option to adjust the amount of a next or future installment, or to cancel future installments by re-applying the crop prediction model in view of present/mid-season crop conditions;

For example, a broker can enter into a contract with a grower for a soybean crop harvest. The grower can be required to sell 80% of her crop to the broker at a rate of $9.50/bushel, determined by applying a crop prediction model that predicts end-of-season soybean market costs. The broker can be obligated to provide products and working capital to the grower over a series of months corresponding to key phases of the lifecycle of the soybean crop. For example, payments of working capital for the soybean crop may be made in three installments: 1) 15% of the expected value of the crop paid two weeks before planting, 2) 15% of the expected value of the crop after the emergence of 8+ leaves on a majority of the plants, and 3) 20% of the value of the crop after flowering has begun on a majority of the plants. Alternatively, 70% of the expected value of the crop can be paid at the time of crop storage, with the balance due upon delivery of the crop. The total expected value of the crop, and thus the value of each working capital installment, can determined by applying the crop prediction model at the time of each installment condition. For instance, the crop prediction model can be applied two weeks before planting to determine the first installment paid to the grower, can be applied again after a majority of the plants have 8+ leaves to determine the second installment paid to the grower, and can be applied again after a majority of the plants have flowered to determine the third installment paid to the grower.

Other entities can leverage the crop prediction models described herein within a market context. For instance, an agronomist can use crop prediction models that identify mid-season crop treatments that increase an end-of-season crop value more than the cost of the crop treatments. The agronomist can then market such advice to growers, beneficially increasing the grower's profitability and enabling the agronomist to charge for such advice. Likewise, an insurer can use crop prediction models to calculate crop risks, and can in turn calculate the costs and coverage of insurance policies for growers with greater accuracy than without access to the crop prediction models. In an additional example, a technology manufacturer or service provider may partner with a grower, agronomist, and/or crop broker to test their products on one or more growers' farms or with a dataset comprising data from one or more growers' farms. The crop prediction models may be utilized to identify and validate a set of farming operations and field parameters with which their services or technologies are most efficaciously deployed. It should be noted that any other suitable entity can apply the crop prediction models described herein, and that the examples given herein are intended to be illustrative and not limiting in any way.

Other Considerations

The foregoing description of the embodiments has been presented for the purpose of illustration; it is not intended to be exhaustive or to limit the patent rights to the precise forms disclosed. Persons skilled in the relevant art can appreciate that many modifications and variations are possible in light of the above disclosure.

Some portions of this description describe the embodiments in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, as noted above, the described operations and their associated modules may be embodied in software, firmware, hardware, or any combinations thereof.

Any of the steps, operations, or processes described herein may be performed or implemented with one or more hardware or software modules, alone or in combination with other devices. In one embodiment, a software module is implemented with a computer program product comprising a computer-readable medium containing computer program code, which can be executed by a computer processor for performing any or all of the steps, operations, or processes described.

Embodiments may also relate to an apparatus or system for performing the operations herein. Such an apparatus or system may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments may also relate to a product that is produced by a computing process described herein. Such a product may include information resulting from a computing process, where the information is stored on a non-transitory, computer readable storage medium and may include any embodiment of a computer program product or other data described herein.

Finally, the language used in the specification has been principally selected for readability and instructional purposes, and it may not have been selected to delineate or circumscribe the patent rights. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A method comprising:
    accessing, for each of a plurality of portions of land, crop growth information describing 1) characteristics of the portion of land, 2) a first set of farming operations yet to be performed, and 3) a first expected crop productivity corresponding to the first set of farming operations;
    identifying a cluster of portions of land associated with a threshold similarity;
    applying a prediction model trained on crop growth information from a plurality of geographically diverse locations to the accessed crop growth information associated with the cluster of portions of land, the prediction model configured to output an optimized prediction, for a selected portion of land within the identified cluster of the portions of land, comprising:
        1) a selected variety or type of crop to plant,
        2) a second set of farming operations that can produce a second expected crop productivity, and
        3) the second expected crop productivity;
    wherein the prediction is based on inputs to the prediction model comprising:
        1) the characteristics of the selected portion of land,
        2) the first set of farming operations yet to be performed on the selected portion of land, and
        3) the first expected crop productivity corresponding to the first set of farming operations yet to be performed on the selected portion of land; and
    for the selected portion of land within the identified cluster of the portions of land, 1) modifying the first set of farming operations yet to be performed on the selected portion of land based on the selected variety or type of crop to plant and the second set of farming operations, and 2) modifying a user interface displayed by a client device of the user to display a crop growth program based on the modified first set of farming operations.

2. The method of claim 1, wherein a first set of farming operations identifies one or more of: a type or variant of crop to plant, an intercrop to plant, a cover crop to plant, a date to plant a crop, a planting rate, a planting depth, a microbial composition, a date to apply a microbial composition, a rate of application for a microbial composition, an agricultural chemical to apply, a date to apply an agricultural chemical, a rate of application for an agricultural chemical, type of irrigation, a date to apply irrigation, a rate of application for irrigation, whether to replant the crop, whether to replant a different crop within the portion of land, a replant date, a type of nutrient to apply, a quantity of nutrient to apply, a location to apply a nutrient, a date to apply a nutrient, a frequency to apply a nutrient, a nutrient application method, a quantity of water to apply, a type of treatment to apply, a quantity of treatment to apply, a location to apply treatment, a date to apply treatment, a frequency to apply treatment, a treatment application method, a harvest date, a harvest method, a harvest order, a piece of equipment to use or purchase, a drainage method to implement, a crop insurance policy to purchase, a period to store a crop, one or more potential crop brokers, one or more potential crop purchasers, one or more harvested crop purchase prices, and one or more harvested crop qualities, wherein the harvested crop qualities includes at least one of: a crop moisture content, a crop protein content, a crop carbohydrate content, a crop oil content, a crop fat content, a crop color, a crop hardness, a measure of wet gluten, a number or percentage of broken grains, a toxin level, a damage level, whether the crop is organic, whether the crop is shade grown, whether the crop is greenhouse grown, whether the crop is fair-wage grown, whether the crop is no-till grown, when the crop is pollution-free grown, when the crop is carbon neutral, and a grading or certification by an organization or agency.

3. The method of claim 1, wherein the threshold similarity identifies one or more of: geography, climate, soil type, soil composition, soil and atmospheric temperature, number of growing degree days, and precipitation.

4. The method of claim 1, wherein the crop growth program is periodically modified in response to re-applying the prediction model to periodically accessed crop growth information.

5. The method of claim 1, wherein the portions of land are fields, plots of land, planting regions, zones, management zones, or sub-portions thereof.

6. The method of claim 1, wherein the prediction model is applied to the accessed crop growth information in response to a triggering event, wherein the triggering event comprises one of: a weather event, a temperature event, a plant growth stage event, a water event, a pest event, a fertilizing event, a farming machinery-related event, a market event, a contract event, and a product supply event.

7. The method of claim 1, wherein the plurality of portions of land are selected from locations associated with one or more of: a threshold geographic diversity, a threshold environmental diversity, a threshold geographic similarity, and a threshold environmental similarity.

8. The method of claim 1, wherein the prediction model is applied to the accessed crop growth information in response to a request from a grower, a technology provider, a service provider, a commodity trader, a broker, an insurance provider, an agronomist, or other entity associated with one or more portions of land in the plurality of portions of land.

9. The method of claim 1, wherein crop productivity is one or more of crop yield, profit, soil health, carbon sequestration, production at a particular date, and composition profile of crops.

10. The method of claim 1, wherein the accessed crop growth information further describes one or more of: rainfall associated with the portion of land, canopy temperature associated with the portion of land, soil temperature of the portion of land, soil moisture of the portion of land, soil nutrients within the portion of land, soil type of the portion of land, topography within the portion of land, humidity associated with the portion of land, growing degree days associated with the portion of land, microbial community associated with the portion of land, pathogen presence associated with the portion of land, prior farming operations performed at the portion of land, prior crops grown at the portion of land, other historical field information associated with the portion of land, a crop plant stage, a crop color, a crop stand count, a crop height, a crop root length, a crop root architecture, a crop immune response, a crop flowering, and a crop tasseling.

11. The method of claim 1, wherein the prediction model comprises one or more of: a generalized linear model, a generalized additive model, a non-parametric regression operation, a random forest classifier, a spatial regression operation, a Bayesian regression model, a time series analysis, a Bayesian network, a Gaussian network, a decision tree learning operation, an artificial neural network, a recurrent neural network, a reinforcement learning operation, linear/non-linear regression operations, a support vector machine, a clustering operation, and a genetic algorithm operation.

12. The method of claim 1, wherein the accessed crop growth information is collected from one or more of: sensors located at a portion of land, satellites, aircraft, unmanned aerial vehicles, land-based vehicles, and land-based camera systems.

13. The method of claim 1, wherein the accessed crop growth is normalized, and wherein normalizing the crop growth information comprises one or more of: removing format-specific content from the crop growth information, removing or modifying portions of the crop growth information associated with values that fall outside of one or more predefined ranges, and scaling image information such that each image pixel represents a same distance.

14. The method of claim 1, wherein the plurality of geographically diverse locations are different from locations of the identified cluster of portions of land.

15. The method of claim 1, wherein the crop growth information further describes 4) a target crop to plant, and wherein the prediction model is configured to output the selected variety or type of crop to plant based additionally on the target crop to plant as an input to the prediction model, wherein the selected variety or type of crop to plant is different from the target crop to plant.

16. The method of claim 15, wherein the target crop to plant comprises a crop to harvest, and wherein the selected variety or type of crop to plant comprises a cover crop.

17. The method of claim 1, wherein the modified first set of farming operations direct the user to plant the selected variety or type of crop instead of the target crop.

18. The method of claim 1, wherein the modified first set of farming operations direct the user to plant the selected variety or type of crop in addition to the target crop.

19. A system comprising:
a processor; and
a non-transitory computer-readable storage medium storing executable instructions that, when executed by the processor, cause the processor to perform steps comprising:
accessing, for each of a plurality of portions of land, crop growth information describing 1) characteristics of the portion of land, 2) a first set of farming operations yet to be performed, and 3) a first expected crop productivity corresponding to the first set of farming operations;
identifying a cluster of portions of land associated with a threshold similarity;

applying a prediction model trained on crop growth information from a plurality of geographically diverse locations to the accessed crop growth information associated with the cluster of portions of land, the prediction model configured to output an optimized prediction for a selected portion of land within the identified cluster of the portions of land, comprising:
 1) a selected variety or type of crop to plant,
 2) a second set of farming operations that can produce a second expected crop productivity, and
 3) the second expected crop productivity;
wherein the prediction is based on inputs to the prediction model comprising:
 1) the characteristics of the selected portion of land,
 2) the first set of farming operations yet to be performed on the selected portion of land, and
 3) the first expected crop productivity corresponding to the first set of farming operations yet to be performed on the selected portion of land; and
for the selected portion of land within the identified cluster of the portions of land, 1) modifying the first set of farming operations yet to be performed on the selected portion of land based on the selected variety or type of crop to plant and the second set of farming operations, and 2) modifying a user interface displayed by a client device of the user to display a crop growth program based on the modified first set of farming operations.

20. The system of claim 19, wherein a first set of farming operations identifies one or more of: a type or variant of crop to plant, an intercrop to plant, a cover crop to plant, a date to plant a crop, a planting rate, a planting depth, a microbial composition, a date to apply a microbial composition, a rate of application for a microbial composition, an agricultural chemical to apply, a date to apply an agricultural chemical, a rate of application for an agricultural chemical, type of irrigation, a date to apply irrigation, a rate of application for irrigation, whether to replant the crop, whether to replant a different crop within the portion of land, a replant date, a type of nutrient to apply, a quantity of nutrient to apply, a location to apply a nutrient, a date to apply a nutrient, a frequency to apply a nutrient, a nutrient application method, a quantity of water to apply, a type of treatment to apply, a quantity of treatment to apply, a location to apply treatment, a date to apply treatment, a frequency to apply treatment, a treatment application method, a harvest date, a harvest method, a harvest order, a piece of equipment to use or purchase, a drainage method to implement, a crop insurance policy to purchase, a period to store a crop, one or more potential crop brokers, one or more potential crop purchasers, one or more harvested crop purchase prices, and one or more harvested crop qualities, wherein the harvested crop qualities includes at least one of: a crop moisture content, a crop protein content, a crop carbohydrate content, a crop oil content, a crop fat content, a crop color, a crop hardness, a measure of wet gluten, a number or percentage of broken grains, a toxin level, a damage level, whether the crop is organic, whether the crop is shade grown, whether the crop is greenhouse grown, whether the crop is fair-wage grown, whether the crop is no-till grown, when the crop is pollution-free grown, when the crop is carbon neutral, and a grading or certification by an organization or agency.

21. The system of claim 19, wherein the threshold similarity identifies one or more of: geography, climate, soil type, soil composition, soil and atmospheric temperature, number of growing degree days, and precipitation.

22. The system of claim 19, wherein the crop growth program is periodically modified in response to re-applying the prediction model to periodically accessed crop growth information.

23. The system of claim 19, wherein the portions of land are fields, plots of land, planting regions, zones, management zones, or sub-portions thereof.

24. The system of claim 19, wherein the prediction model is applied to the accessed crop growth information in response to a triggering event, wherein the triggering event comprises one of: a weather event, a temperature event, a plant growth stage event, a water event, a pest event, a fertilizing event, a farming machinery-related event, a market event, a contract event, and a product supply event.

25. The system of claim 19, wherein the plurality of portions of land are selected from locations associated with one or more of: a threshold geographic diversity, a threshold environmental diversity, a threshold geographic similarity, and a threshold environmental similarity.

26. The system of claim 19, wherein the prediction model is applied to the accessed crop growth information in response to a request from a grower, a technology provider, a service provider, a commodity trader, a broker, an insurance provider, an agronomist, or other entity associated with one or more portions of land in the plurality of portions of land.

27. The system of claim 19, wherein crop productivity is one or more of crop yield, profit, soil health, carbon sequestration, production at a particular date, and composition profile of crops.

28. The system of claim 19, wherein the accessed crop growth information further describes one or more of: rainfall associated with the portion of land, canopy temperature associated with the portion of land, soil temperature of the portion of land, soil moisture of the portion of land, soil nutrients within the portion of land, soil type of the portion of land, topography within the portion of land, humidity associated with the portion of land, growing degree days associated with the portion of land, microbial community associated with the portion of land, pathogen presence associated with the portion of land, prior farming operations performed at the portion of land, prior crops grown at the portion of land, other historical field information associated with the portion of land, a crop plant stage, a crop color, a crop stand count, a crop height, a crop root length, a crop root architecture, a crop immune response, a crop flowering, and a crop tasseling.

29. The system of claim 19, wherein the prediction model comprises one or more of: a generalized linear model, a generalized additive model, a non-parametric regression operation, a random forest classifier, a spatial regression operation, a Bayesian regression model, a time series analysis, a Bayesian network, a Gaussian network, a decision tree learning operation, an artificial neural network, a recurrent neural network, a reinforcement learning operation, linear/non-linear regression operations, a support vector machine, a clustering operation, and a genetic algorithm operation.

30. The system of claim 19, wherein the accessed crop growth information is collected from one or more of: sensors located at a portion of land, satellites, aircraft, unmanned aerial vehicles, land-based vehicles, and land-based camera systems.

31. The system of claim 19, wherein the accessed crop growth information is normalized, and where normalizing the crop growth information comprises one or more of: removing format-specific content from the crop growth information, removing or modifying portions of the crop growth information associated with values that fall outside of one or more predefined ranges, and scaling image information such that each image pixel represents a same distance.

32. A non-transitory computer-readable storage medium storing executable instructions that, when executed by a processor, cause the processor to perform steps comprising:
accessing, for each of a plurality of portions of land, crop growth information describing 1) characteristics of the portion of land, 2) a first set of farming operations yet to be performed, and 3) a first expected crop productivity corresponding to the first set of farming operations;
identifying a cluster of portions of land associated with a threshold similarity;
applying a prediction model trained on crop growth information from a plurality of geographically diverse locations to the accessed crop growth information associated with the cluster of portions of land, the prediction model configured to output an optimized prediction for a selected portion of land within the identified cluster of the portions of land, comprising:
1) a selected variety or type of crop to plant,
2) a second set of farming operations that can produce a second expected crop productivity, and
3) the second expected crop productivity;
wherein the prediction is based on inputs to the prediction model comprising:
1) the characteristics of the selected portion of land,
2) the first set of farming operations yet to be performed on the selected portion of land, and
3) the first expected crop productivity corresponding to the first set of farming operations yet to be performed on the selected portion of land; and
for the selected portion of land within the identified cluster of the portions of land, 1) modifying the first set of farming operations yet to be performed on the selected portion of land based on the selected variety or type of crop to plant and the second set of farming operations, and 2) modifying a user interface displayed by a client device of the user to display a crop growth program based on the modified first set of farming operations.

33. The computer-readable storage medium of claim 32, wherein a first set of farming operations identifies one or more of: a type or variant of crop to plant, an intercrop to plant, a cover crop to plant, a date to plant a crop, a planting rate, a planting depth, a microbial composition, a date to apply a microbial composition, a rate of application for a microbial composition, an agricultural chemical to apply, a date to apply an agricultural chemical, a rate of application for an agricultural chemical, type of irrigation, a date to apply irrigation, a rate of application for irrigation, whether to replant the crop, whether to replant a different crop within the portion of land, a replant date, a type of nutrient to apply, a quantity of nutrient to apply, a location to apply a nutrient, a date to apply a nutrient, a frequency to apply a nutrient, a nutrient application method, a quantity of water to apply, a type of treatment to apply, a quantity of treatment to apply, a location to apply treatment, a date to apply treatment, a frequency to apply treatment, a treatment application method, a harvest date, a harvest method, a harvest order, a piece of equipment to use or purchase, a drainage method to implement, a crop insurance policy to purchase, a period to store a crop, one or more potential crop brokers, one or more potential crop purchasers, one or more harvested crop purchase prices, and one or more harvested crop qualities, wherein the harvested crop qualities includes at least one of: a crop moisture content, a crop protein content, a crop carbohydrate content, a crop oil content, a crop fat content, a crop color, a crop hardness, a measure of wet gluten, a number or percentage of broken grains, a toxin level, a damage level, whether the crop is organic, whether the crop is shade grown, whether the crop is greenhouse grown, whether the crop is fair-wage grown, whether the crop is no-till grown, when the crop is pollution-free grown, when the crop is carbon neutral, and a grading or certification by an organization or agency.

34. The computer-readable storage medium of claim 32, wherein the threshold similarity identifies one or more of: geography, climate, soil type, soil composition, soil and atmospheric temperature, number of growing degree days, and precipitation.

35. The computer-readable storage medium of claim 32, wherein the crop growth program is periodically modified in response to re-applying the prediction model to periodically accessed crop growth information.

36. The computer-readable storage medium of claim 32, wherein the portions of land are fields, plots of land, planting regions, zones, management zones, or sub-portions thereof.

37. The computer-readable storage medium of claim 32, wherein the prediction model is applied to the accessed crop growth information in response to a triggering event, wherein the triggering event comprises one of: a weather event, a temperature event, a plant growth stage event, a water event, a pest event, a fertilizing event, a farming machinery-related event, a market event, a contract event, and a product supply event.

38. The computer-readable storage medium of claim 32, wherein the plurality of portions of land are selected from locations associated with one or more of: a threshold geographic diversity, a threshold environmental diversity, a threshold geographic similarity, and a threshold environmental similarity.

39. The computer-readable storage medium of claim 32, wherein the prediction model is applied to the accessed crop growth information in response to a request from a grower, a technology provider, a service provider, a commodity trader, a broker, an insurance provider, an agronomist, or other entity associated with one or more portions of land in the plurality of portions of land.

40. The computer-readable storage medium of claim 32, wherein crop productivity is one or more of crop yield, profit, soil health, carbon sequestration, production at a particular date, and composition profile of crops.

41. The computer-readable storage medium of claim 32, wherein the accessed crop growth information further describes one or more of: rainfall associated with the portion of land, canopy temperature associated with the portion of land, soil temperature of the portion of land, soil moisture of the portion of land, soil nutrients within the portion of land, soil type of the portion of land, topography within the portion of land, humidity associated with the portion of land, growing degree days associated with the portion of land, microbial community associated with the portion of land, pathogen presence associated with the portion of land, prior farming operations performed at the portion of land, prior crops grown at the portion of land, other historical field information associated with the portion of land, a crop plant stage, a crop color, a crop stand count, a crop height, a crop root length, a crop root architecture, a crop immune response, a crop flowering, and a crop tasseling.

42. The computer-readable storage medium of claim 32, wherein the prediction model comprises one or more of: a generalized linear model, a generalized additive model, a non-parametric regression operation, a random forest classifier, a spatial regression operation, a Bayesian regression model, a time series analysis, a Bayesian network, a Gaussian network, a decision tree learning operation, an artificial neural network, a recurrent neural network, a reinforcement learning operation, linear/non-linear regression operations, a support vector machine, a clustering operation, and a genetic algorithm operation.

43. The computer-readable storage medium of claim 32, wherein the accessed crop growth information is collected from one or more of: sensors located at a portion of land, satellites, aircraft, unmanned aerial vehicles, land-based vehicles, and land-based camera systems.

44. The computer-readable storage medium of claim 32, wherein the accessed crop growth information is normalized, and wherein normalizing the crop growth information comprises one or more of: removing format-specific content from the crop growth information, removing or modifying portions of the crop growth information associated with values that fall outside of one or more predefined ranges, and scaling image information such that each image pixel represents a same distance.

* * * * *

UNITED STATES PATENT AND TRADEMARK OFFICE
CERTIFICATE OF CORRECTION

| | |
|---|---|
| PATENT NO. | : 11,263,707 B2 |
| APPLICATION NO. | : 16/057387 |
| DATED | : March 1, 2022 |
| INVENTOR(S) | : David Patrick Perry et al. |

It is certified that error appears in the above-identified patent and that said Letters Patent is hereby corrected as shown below:

In the Claims

Column 38, Claim 1, Line 38, delete "prediction," and insert --prediction--
Column 42, Claim 31, Line 64, delete "where" and insert --wherein--

Signed and Sealed this
Second Day of August, 2022

Katherine Kelly Vidal
Director of the United States Patent and Trademark Office